(12) United States Patent
Suzuki

(10) Patent No.: US 8,847,468 B2
(45) Date of Patent: Sep. 30, 2014

(54) PIEZOELECTRIC GENERATOR

(75) Inventor: Takashi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 196 days.

(21) Appl. No.: 13/562,549

(22) Filed: Jul. 31, 2012

(65) Prior Publication Data

US 2012/0293042 A1    Nov. 22, 2012

Related U.S. Application Data

(63) Continuation of application No. PCT/JP2010/051884, filed on Feb. 9, 2010.

(51) Int. Cl.
*H02N 2/18* (2006.01)
*H01L 41/113* (2006.01)

(52) U.S. Cl.
CPC ............ *H01L 41/1136* (2013.01); *H02N 2/188* (2013.01); *H02N 2/181* (2013.01)
USPC ............ 310/339; 310/321; 310/330; 310/331

(58) Field of Classification Search
CPC ...... H02N 2/08; F23Q 3/002; H01L 41/0926; H03H 9/0207; H03H 9/17
USPC .................................. 310/321, 339, 330, 331
See application file for complete search history.

(56) References Cited

U.S. PATENT DOCUMENTS

| | | | |
|---|---|---|---|
| 7,019,423 B1 | 3/2006 | Horng | |
| 7,414,351 B2* | 8/2008 | Ulm et al. | 310/330 |
| 7,687,977 B2* | 3/2010 | Xu | 310/339 |
| 7,812,466 B2* | 10/2010 | Lu et al. | 290/1 R |
| 8,143,765 B1* | 3/2012 | Yegingil et al. | 310/339 |
| 2004/0007942 A1 | 1/2004 | Nishida | |
| 2007/0114890 A1* | 5/2007 | Churchill et al. | 310/339 |

FOREIGN PATENT DOCUMENTS

| | | |
|---|---|---|
| JP | 7-170705 | 7/1995 |
| JP | 11-325841 | 11/1999 |
| JP | 2005-186930 A1 | 7/2005 |
| JP | 2006-246628 A1 | 9/2006 |
| JP | 2008-116668 A1 | 5/2008 |
| JP | 2008-197140 A1 | 8/2008 |

OTHER PUBLICATIONS

Extended European Search Report mailed Feb. 1, 2013 in counterpart application No. 10845721.9.
Xiaoming Wu et al.: "A Frequency Adjustable Vibration Energy Harvester", PowerMEMS + microEMS, Nov. 9-12, 2008, pp. 245-248.
Shad Roundy et al.: "Toward self-tuning adaptive vibration based micro-generators", Smart Structures, Devices, and Systems II, Dec. 13, 2004, vol. 5649, 2005, pp. 373-384.
M. Renaud, et al.; "Piezoelectric Harvesters and MEMS Technology: Fabrication, Modeling and Measurements;" Proceedings of the 14th International Conference on Solid-State Sensors, Actuators and Microsystems; Jun. 10-14, 2007; pp. 891-894/p. 2 of specification.
R. Elfrink, et al.; "Vibration energy harvesting with aluminum nitride-based piezoelectric devices;" Journal of Micromechanics and Microengineering; vol. 19; 2009; pp. 1-8 and end sheet (9 Sheets total)/p. 2 of specification.
B. Comiskey, et al.; "An electrophoretic ink for all-printed reflective electronic displays;" Nature; vol. 394; Jul. 16, 1998; pp. 253-255/p. 2 of specification.
International Search Report for International Application No. PCT/JP2010/051884 dated Apr. 13, 2010.

* cited by examiner

*Primary Examiner* — Derek Rosenau
*Assistant Examiner* — Bryan Gordon
(74) *Attorney, Agent, or Firm* — Kratz, Quintos & Hanson, LLP

(57) ABSTRACT

A piezoelectric generator includes a fixing part; a cantilever formed at a front edge of the fixing part; a weight part formed at a front end of the cantilever; a centroid adjustment part by which a position of a centroid of the weight part is adjusted; and a piezoelectric generating cell formed on top of the cantilever.

19 Claims, 36 Drawing Sheets

PIEZOELECTRIC GENERATOR

CROSS-REFERENCE TO RELATED APPLICATION

This patent application is based upon and claims the benefit of priority under 35 USC 120 and 365(c) of PCT application JP2010/051884 filed in Japan on Feb. 9, 2010, the entire contents of which are incorporated herein by reference.

FIELD

The present invention is related to a piezoelectric generator.

BACKGROUND

In recent years, active research has been conducted for the energy harvesting technology. The energy harvesting technology is for converting various types of energy widely present in the environment into electric power, and maintenance free is realized in supplying power.

As an example of the energy harvesting technology, there is known a vibration piezo generator for converting vibrations present in the living environment into electric power. There are vibration piezo generators of various structures, and a piezoelectric generator is known as one example. There are piezoelectric generators of various structures.

As one example of a piezoelectric generator, there is known a vibration piezo generator including a weight attached to the front end of a cantilever and a piezoelectric element provided on the cantilever formed by sequentially laminating a lower electrode, a piezoelectric film, and an upper electrode. Power generation of a vibration piezo generator is performed by deforming the piezoelectric film via the cantilever to which vibration is applied, so that a piezoelectric effect is generated in the piezoelectric film. PZT and AlN are known as examples of piezoelectric materials.

As an application target of such a vibration piezo generator, there is known a power supply source for a device in which vibration is generated, such as a power supply source for an acceleration sensor attached inside a tire of a vehicle. In this case, the vibration piezo generator is attached to the device in which vibration is generated, such as a device in a tire.

This kind of vibration piezo generator typically has an element size of approximately several hundreds of μm through several mm, and is generally fabricated by microscopic processing used for manufacturing MEMS (Micro Electro Mechanical System).

Patent Document 1: Japanese Laid-Open Patent Publication No. 2008-116668
Patent Document 2: Japanese Laid-Open Patent Publication No. 2008-197140
Patent Document 3: Japanese Laid-Open Patent Publication No. 2005-186930
Non-Patent Document 1: Proceedings of the 14th International Conference on Solid-State Sensors, Actuators and Microsystems, Lyon, France, Jun. 10-14, 2007, p. 891-894
Non-Patent Document 2: IMEC Newsletter 54, October 2008, p. 1, 10
Non-Patent Document 3: T. Nishida, Univ. Florida et al. US Patent Application Publication, No. US 2004/0007942 (Jan. 15, 2004)

In a vibration piezo generator having a cantilever and a weight as described above, the resonance frequency is determined by the shape and the material of the cantilever and weight. Furthermore, in the vibration piezo generator, when the vibration frequency from outside and the resonance frequency match, a large amount of electric energy is generated. However, as the difference in these frequencies increases, the generated electric energy decreases.

SUMMARY

According to one aspect of an embodiment, a piezoelectric generator is provided, including a fixing part; a cantilever formed at a front edge of the fixing part; a weight part formed at a front end of the cantilever; a centroid adjustment part by which a position of a centroid of the weight part is adjusted; and a piezoelectric generating cell formed on top of the cantilever.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1A:
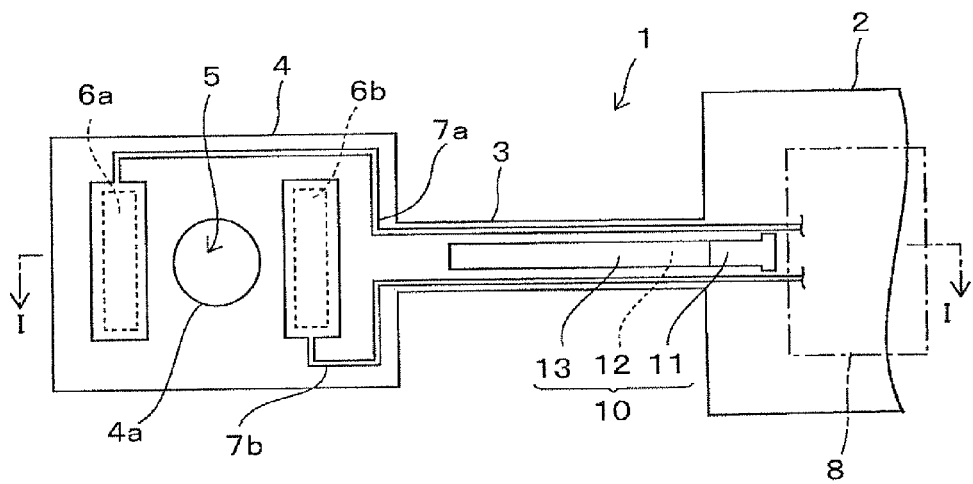
FIG. 1A is a plan view of a piezoelectric generator according to a first embodiment.

Embodiments are described with reference to drawings. In the drawings, similar elements are denoted by the same reference numerals.

First Embodiment

Figure 1B:
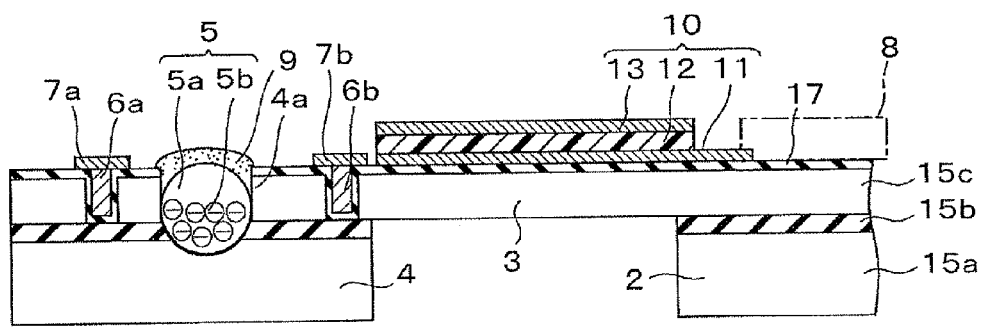
FIG. 1B is a cross-sectional view cut along a line I-I of FIG. 1A.

FIG. 1A is a plan view of a piezoelectric generator, and FIG. 1B is a cross-sectional view of the piezoelectric generator illustrated in FIG. 1A.

As illustrated in FIGS. 1A and 1B, a piezoelectric generator 1 includes a cantilever 3 protruding from the center of the edge of a fixing part 2, and a weight part 4 formed on the front end of the cantilever 3. The fixing part 2 may be used as an area for providing a centroid control circuit.

The fixing part 2, the cantilever 3, and the weight part 4 are formed by patterning any one of a silicon substrate, a semiconductor substrate such as a SOI substrate, a semiconductor insulating substrate such as SiC, an insulating substrate such as alumina and glass epoxy, and a metal substrate. FIG. 1B illustrates an example where a SOI substrate is used, including a silicon substrate 15a, a silicon oxide layer 15b, and a silicon layer 15c. A silicon nitride film 17 is formed on the silicon layer 15c.

A recessed part 4a is formed in the center of the weight part 4. In the recessed part 4a, a centroid adjustment part is formed, which is filled with a particulate-containing liquid 5. Furthermore, at the front and the back of the recessed part 4a of the weight part 4, a first electrode 6a and a second electrode 6b are respectively embedded. The front of the recessed part 4a is in the direction from the recessed part 4a to the front edge of the weight part 4, and the back of the recessed part 4a is in the direction from the recessed part 4a to the cantilever 3.

To the top edge of the first electrode 6a, a first lead wiring 7a is connected, which passes through the top surfaces of the weight part 4, the cantilever 3, and the fixing part 2. Furthermore, to the top edge of the second electrode 6b, a second lead wiring 7b is connected, which passes through the top surfaces of the weight part 4, the cantilever 3, and the fixing part 2.

Figure 2A:
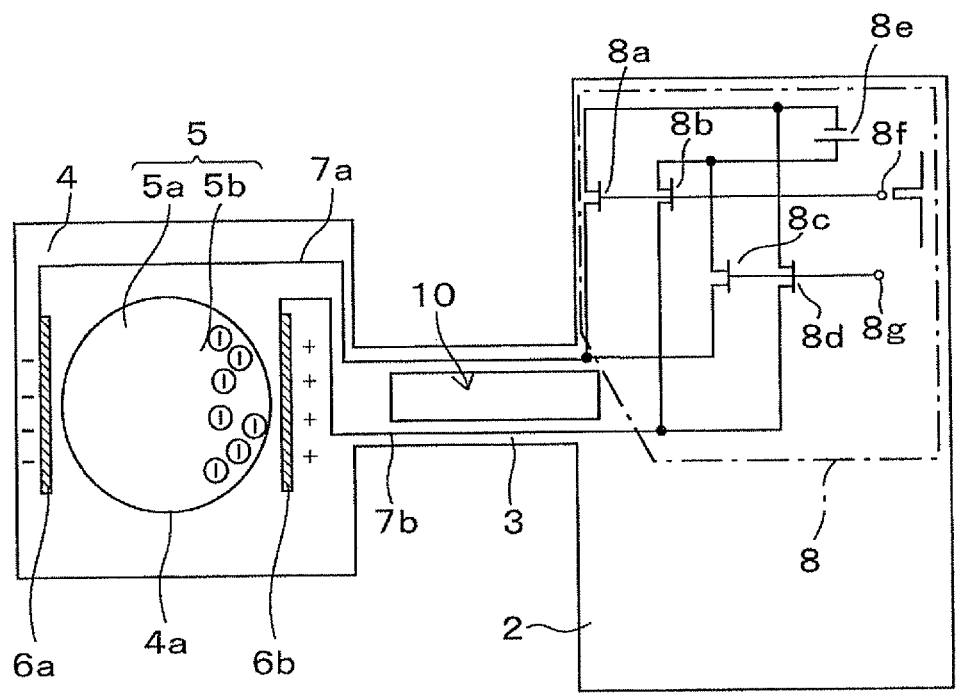
FIG. 2A is a circuit diagram indicating a state where the centroid of a weight part of the piezoelectric generator according to the first embodiment is set at a first position.
Figure 2B:
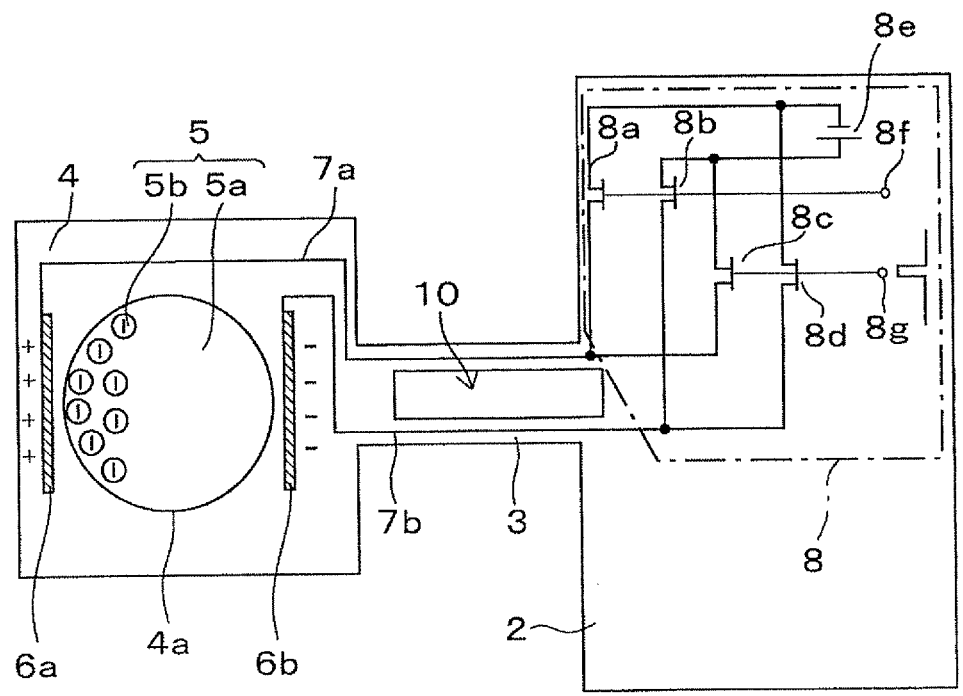
FIG. 2B is a circuit diagram indicating a state where the centroid of a weight part of the piezoelectric generator according to the first embodiment is set at a second position.

On the fixing part 2, a centroid control circuit 8 is formed as an electronic circuit. The centroid control circuit 8 is connected to the first electrode 6a via the first lead wiring 7a, and is connected to the second electrode 6b via the second lead wiring 7b. For example, as illustrated in FIGS. 2A and 2B, the centroid control circuit 8 includes first, second, third, and fourth field-effect transistors 8a through 8d, and a DC power source 8e.

The source/drain combination at one end of each of the first and fourth field-effect transistors 8a and 8d is connected to the negative electrode of the DC power source 8e. The source/drain combination at one end of each of the second and third field-effect transistors 8b and 8c is connected to the positive electrode of the DC power source 8e.

The source/drain combination at the other end of each of the first and third field-effect transistors 8a and 8c is connected to the first electrode 6a in the weight part 4 via the first lead wiring 7a. The source/drain combination at the other end of each of the second and fourth field-effect transistors 8b and 8d is connected to the second electrode 6b in the weight part 4 via the second lead wiring 7b.

The gates of the first and second field-effect transistors 8a and 8b are electrically connected to a first gate terminal 8f. The gates of the third and fourth field-effect transistors 8c and 8d are electrically connected to a second gate terminal 8g.

On the top surface of the weight part 4, a sealing film 9 is formed, which covers the recessed part 4a and the particulate-containing liquid 5.

The particulate-containing liquid 5 includes, for example, a liquid 5a and multiple particles 5b that are positively or negatively charged. The particles 5b are dipped in the liquid 5a by an amount occupying approximately half the volume of the particulate-containing liquid 5.

As the liquid 5a, for example, oil, toluene, and paraffinic hydrocarbon are used. For example, silicone is used as oil.

The particles 5b are formed with a material having high specific gravity, and are sized so that many particles may be included per unit volume, for example, several μm through several tens of μm. As the particles 5b, for example, particles made of a material that maintains a charged state in the liquid 5a are used, such as particles of iron, copper, lead, carbon black, titanium oxide ($TiO_2$), and oxidized aluminum, or microcapsules described below. Generally, titanium oxide particles are positively charged, and carbon black particles are negatively charged.

The particulate-containing liquid 5 may be supplied in the recessed part 5a, in a state where the particulate-containing liquid 5 is encapsulated in microcapsules formed with resin such as acrylic and polyethylene terephthalate (PET) or a substance such as gelatine.

The particles 5b in the particulate-containing liquid 5 are moved by electrophoresis. Thus, it is possible to change the position of the centroid of the weight part 4 by moving the particles 5b with an electric field generated between the first electrode 6a and the second electrode 6b.

A piezoelectric cell 10 is formed on the cantilever 3. As illustrated in FIG. 1B, the piezoelectric cell 10 includes a lower electrode 11, a piezoelectric film 12, and an upper electrode 13. The lower electrode 11 has a shape that extends from the area where the piezoelectric film 12 and the upper electrode 13 are formed to the fixing part 2.

For example, the piezoelectric film 12 is formed with a lead zirconate titanate (PZT; $Pb(Zr,Ti)_3$) film. Furthermore, the lower electrode 11 and the upper electrode 13 are formed with a metal such as aluminum (Al), platinum (Pt), ruthenium (Ru), and iridium (Ir).

For example, the fixing part 2 of the above piezoelectric generator 1 is attached to a device in which vibration is generated, and the fixing part 2 transfers the vibration from the device to the cantilever 3 and the weight part 4.

The resonance frequency of the cantilever 3 varies according to the centroid position of the weight part 4. When the particles 5a in the particulate-containing liquid 5 are negatively charged, the centroid position of the weight part 4 is adjusted by the following method.

First, as illustrated in FIG. 2A, when a pulse voltage is applied to the first gate terminal 8f in the centroid control circuit 8, and a voltage is applied to the gates of the first and second field-effect transistors 8a and 8b, the first and second field-effect transistors 8a and 8b are turned on.

Accordingly, the first electrode 6a is negatively charged, the second electrode 6b is positively charged, and an electric field is generated between the first electrode 6a and the second electrode 6b. Furthermore, in the particulate-containing liquid 5 in the recessed part 4a, the negatively charged particles 5 move toward the second electrode 6b by the electric field. According to this movement of the particles 5b, the centroid of the weight part 4 moves toward the cantilever 3.

Meanwhile, as illustrated in FIG. 2B, when a pulse voltage is applied to the second gate terminal 8g in the centroid control circuit 8, and a voltage is applied to the gates of the third and fourth field-effect transistors 8c and 8d, the third and fourth field-effect transistors 8c and 8d are turned on.

Accordingly, the first electrode 6a is positively charged, the second electrode 6b is negatively charged, and an electric field is generated between the first electrode 6a and the second electrode 6b. Furthermore, in the particulate-containing liquid 5 in the recessed part 4a, the negatively charged particles 5 move toward the first electrode 6a by the electric field. According to this movement of the particles 5b, the centroid of the weight part 4 moves toward the front edge of the weight part 4.

Figure 3A:
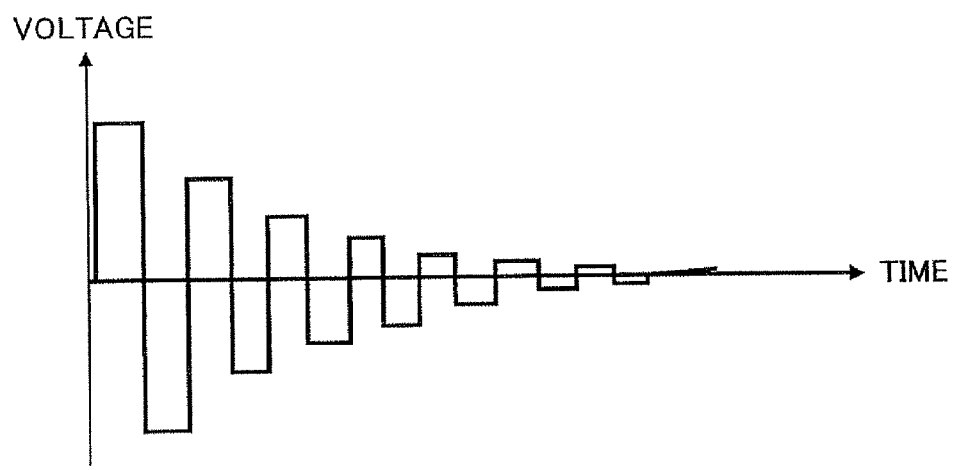
FIG. 3A is a waveform diagram of a voltage applied to electrodes for changing the centroid of the weight part of the piezoelectric generator according to the first embodiment.

An example of a method of moving the centroid of the particulate-containing liquid 5 to substantially the center of the recessed part 4a is described as follows. A voltage having a waveform as illustrated in FIG. 3A is applied to the first electrode 6a and the second electrode 6b from the centroid control circuit 8. The voltage having a waveform as illustrated in FIG. 3A has a pulse-form AC waveform for continuously applying a positive voltage and a negative voltage to the first electrode 6a with respect to the second electrode 6b. The amplitude of the voltage gradually attenuates with the passage of time.

According to the above-described AC voltage, in the recessed part 4a, the particles 5b move back and forth between the front and the back of the recessed part 4a and gradually gather at the central base part, and stop moving. Accordingly, the centroid of the particulate-containing liquid 5 is positioned at substantially the center of the recessed part 4a.

Figure 3B:
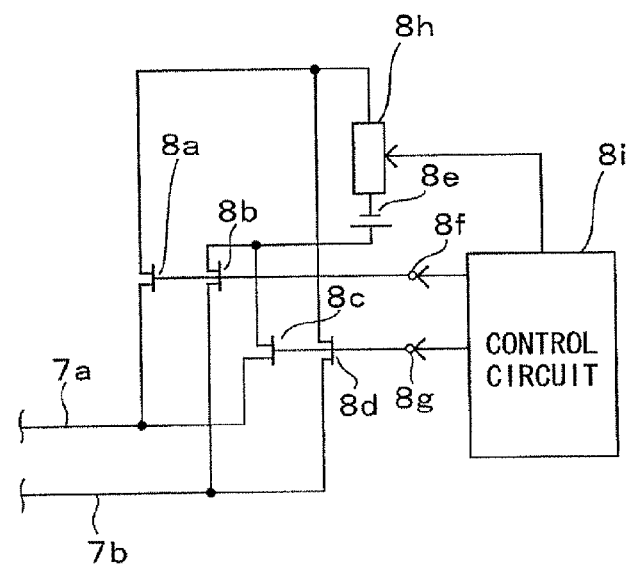
FIG. 3B is a circuit diagram illustrating an example of a centroid control circuit for supplying the voltage illustrated in FIG. 3A.

FIG. 3B illustrates an example of the centroid control circuit 8 that supplies the pulse signals illustrated in FIG. 3A. As illustrated in FIG. 3B, a voltage adjustment circuit 8h is serially connected to a DC power supply 8e. Furthermore, a pulse control circuit 8i is connected to the first gate terminal 8f, the second gate terminal 8g, and the voltage adjustment circuit 8h.

When outputting the signals illustrated in FIG. 3A, the pulse control circuit 8i alternately applies pulse signals to the first gate terminal 8f and the second gate terminal 8g, gradually increases the resistance of the voltage adjustment circuit 8h, and gradually decreases the voltage supplied from the DC power supply 8e to the first electrode 6a and the second electrode 6b. Furthermore, when outputting the signals illustrated in FIGS. 2A and 2B, the pulse control circuit 8i fixes the resistance of the voltage adjustment circuit 8h, and selects either one of the first gate terminal 8f or the second gate terminal 8g and outputs pulse signals.

The pulse control circuit 8i includes, for example, a toggle flip-flop (T-FF) circuit for alternately and continuously applying a pulse voltage to the first gate terminal 8f and the second gate terminal 8g. Furthermore, the voltage adjustment circuit 8h includes, for example, a circuit in which the source/drain combinations of plural field-effect transistors are connected in parallel.

As described above, when the voltage application on the first electrode 6a and the second electrode 6b is stopped after adjusting the centroid position in the recessed part 4a by the centroid control circuit 8, the first electrode 6a and the second electrode 6b maintain the charged state before the voltage is stopped. Therefore, the adjusted position of the centroid in the recessed part 4a is maintained.

According to the piezoelectric generator 1 described above, it is possible to control the centroid position in the weight part 4 and change the resonance frequency of the weight part 4 and the cantilever 3. Accordingly, it is possible to change the resonance frequency of the cantilever 3 in accordance with the vibration status of the vibrating device to which the piezoelectric generator 1 is attached, and increase the vertical amplitude of the cantilever 3 so that the power is efficiently generated from the piezoelectric cell 10.

Next, an example of changes in the resonance frequency of the cantilever 3 and the weight part 4 caused by different centroid positions of the weight part 4 is indicated by calculation. The cross-section of a model of the cantilever 3 and the weight part 4 in this case is indicated by X-Y coordinates in FIG. 4. In this case, the cantilever 3 and the weight part 4 are formed with silicon.

Figure 4:
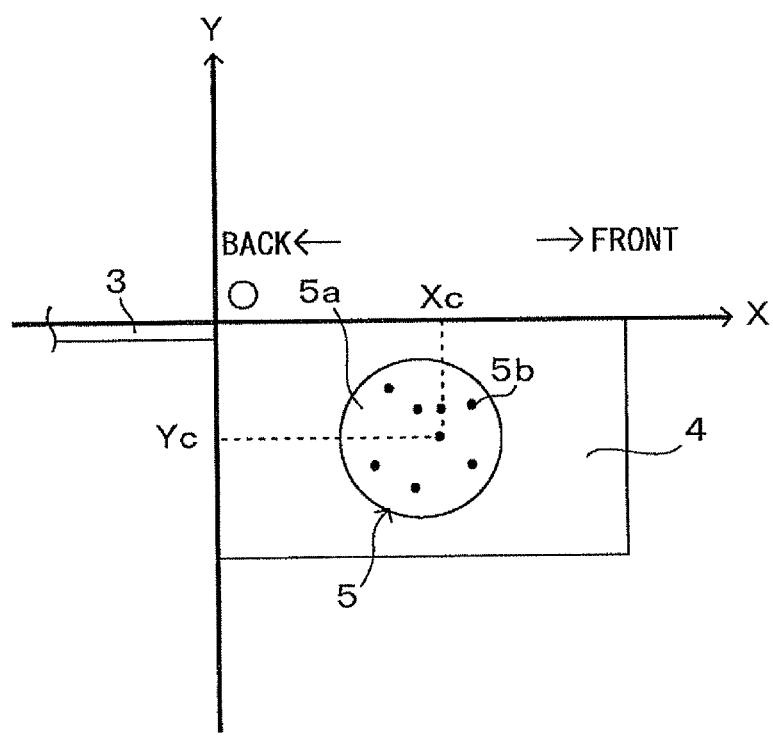
FIG. 4 is a coordinate diagram in which an area of a cantilever and a weight part of the piezoelectric generator according to the first embodiment is indicated by coordinates.

It is assumed that the cantilever 3 of the piezoelectric generator 1 that is the target of calculation has a length from the fixing part 2 to the weight part 4 of 1.5 mm, a width of 1 mm, and a thickness of 20 µm. In FIG. 4, the length is the X direction, the thickness is the Y direction, and the width is the direction perpendicular to the sheet on which FIG. 4 is depicted.

The external shape of the encapsulated particulate-containing liquid 5 in the weight part 4 is a sphere having a diameter of 900 µm. Furthermore, the center of the spherical particulate-containing liquid 5 matches the centroid of the weight part 4 without the particulate-containing liquid 5. Furthermore, lead particles are used as the multiple particles 5b in the particulate-containing liquid 5. The total volume of the particles 5b occupies approximately half the inside of the particulate-containing liquid 5 by converting the volume. In order to allow the particles 5b to freely move in the particulate-containing liquid 5, the particles 5b are dipped in the liquid 5a having fluidity.

Assuming that the electric field in the width direction of the cantilever 3 is zero, the centroid of the particles 5b is at the center of the width of the weight part 4, i.e., at a position that is 0.5 mm from the side surface of the weight part 4. Accordingly, the centroid moves in the horizontal direction (X direction) and the vertical direction (Y direction) of the cantilever 3, in a state where the cantilever 3 is maintained in a horizontal manner as illustrated in FIG. 4.

The volumes of the first electrode 6a, the second electrode 6b, the first lead wiring 7a, and the second lead wiring 7b occupying the cantilever 3 and the weight part 4 are small. Therefore, the weight of the first electrode 6a, the second electrode 6b, the first lead wiring 7a, and the second lead wiring 7b is omitted in the simulation.

Figure 5A:
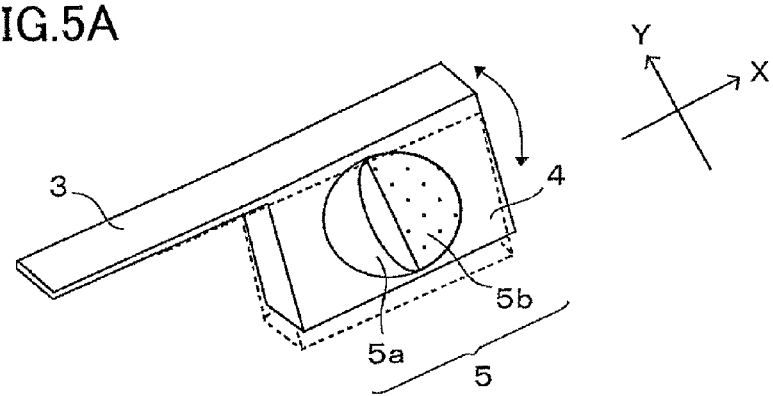
FIGS. 5A, 5B, and 5C are perspective cross-sectional views indicating vibration states of the cantilever and the weight part according to differences in the centroid of the weight part of the piezoelectric generator according to the first embodiment.
Figure 5B:
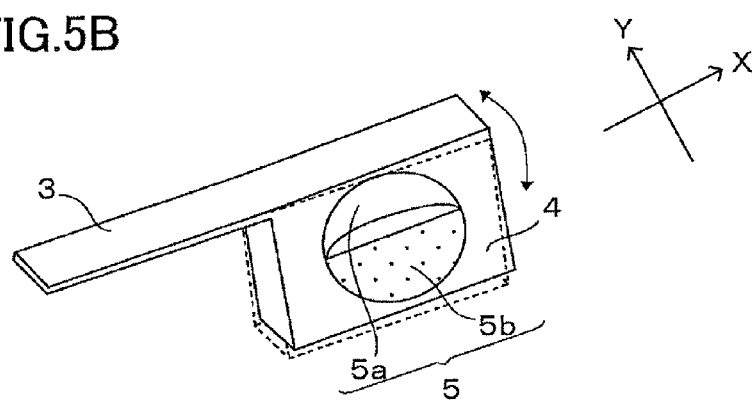
Figure 5C:
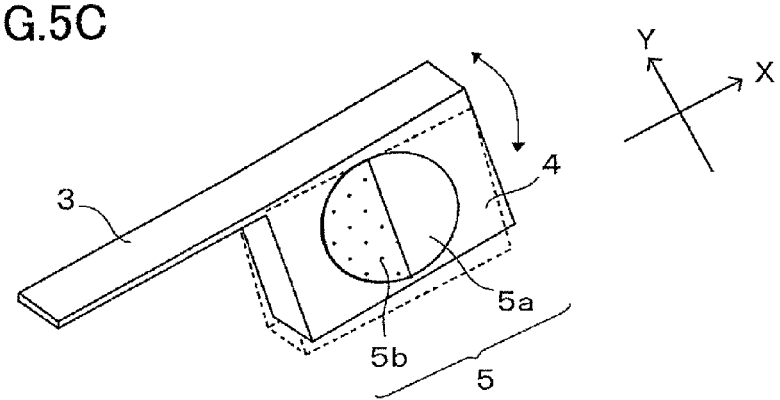

The centroid of the particles 5b moves as illustrated in FIGS. 5A through 5C according to voltage control of the first electrode 6a and the second electrode 6b by the centroid control circuit 8.

FIG. 5A illustrates a state where the centroid of the particles 5b is positioned near the front edge of the weight part 4. FIG. 5B illustrates a state where the centroid of the particles 5b is positioned substantially at the center of the weight part 4. Furthermore, FIG. 5C illustrates a state where the centroid of the particles 5b is positioned near the cantilever 3.

In FIG. 5A, the positions Xc, Yc of the centroid of the weight part 4 in XY coordinates are 0.826 mm and 0.500 mm. In FIG. 5B, the positions Xc, Yc of the centroid of the weight part 4 in XY coordinates are 0.750 mm and 0.576 mm. In FIG. 5C, the positions Xc, Yc of the centroid of the weight part 4 in XY coordinates are 0.653 mm and 0.493 mm.

Comparing the centroid in FIG. 5A and FIG. 5C, the maximum movement distance of the centroid of the weight part 4 in the X direction is approximately 173 µm. Furthermore, comparing the centroid in FIGS. 5A, 5B, and 5C, the maximum movement distance of the centroid of the weight part 4 in the Y direction is approximately 80 µm.

Figure 6:
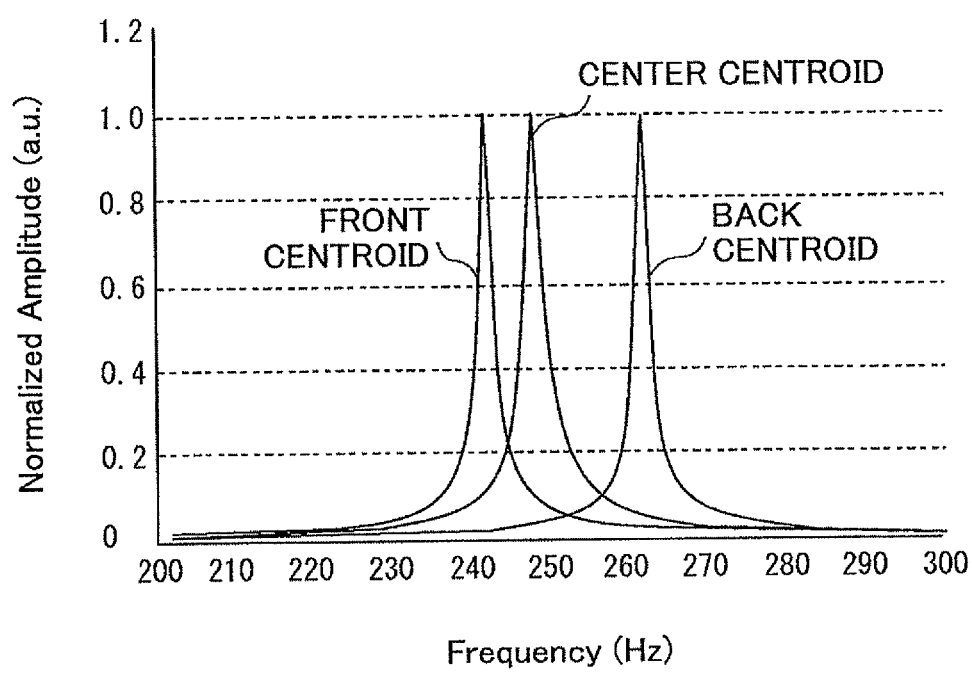
FIG. 6 is a diagram indicating relationships between the resonance frequency of the cantilever and the generated power of a piezoelectric cell in the piezoelectric generators illustrated in FIGS. 5A, 5B, and 5C.

Assuming that the critical damping ratio used for the calculation of the natural vibration of the cantilever 3 and the weight part 4 is 0.2%, according to the difference in the centroid positions illustrated in FIGS. 5A, 5B, and 5C, the resonance frequency of the cantilever 3 changes as illustrated in FIG. 6. That is to say, the resonance frequency is 242 Hz in the front centroid state as illustrated in FIG. 5A, the resonance frequency is 248 Hz in the center centroid state as illustrated in FIG. 5B, the resonance frequency is 261 Hz in the back centroid state as illustrated in FIG. 5C.

Accordingly, by moving the centroid of the weight part 4 according to the vibration frequency of the device to which the piezoelectric generator 1 is attached, it is possible to set the resonance frequency of the cantilever 3 at an optimum value so that the power generation efficiency of the piezoelectric cell 10 is maximized.

The shape of the recessed part 4a for putting in the particulate-containing liquid 5 that is a centroid adjustment unit is not limited to a circular cylinder having a hemispherical base. The shape may be a square pillar or an elliptic cylinder.

Figure 7A:
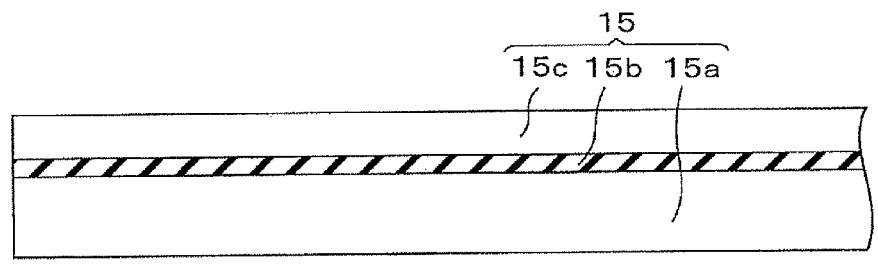
FIGS. 7A, 7B, and 7C are cross-sectional views for illustrating an example of a manufacturing method of the piezoelectric generator according to the first embodiment (parts 1 through 3)
Figure 7B:
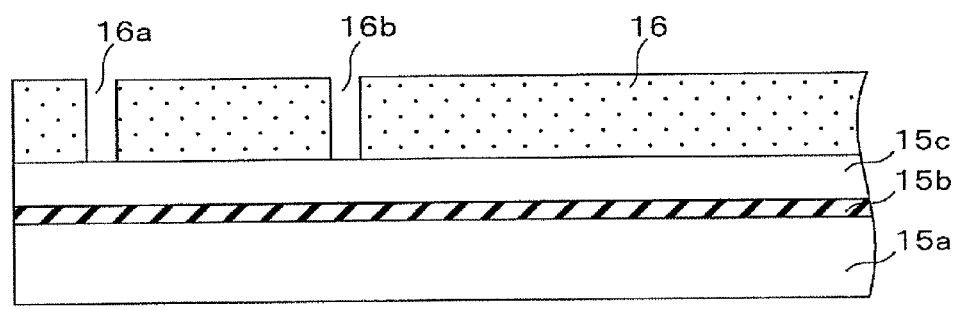
Figure 7C:
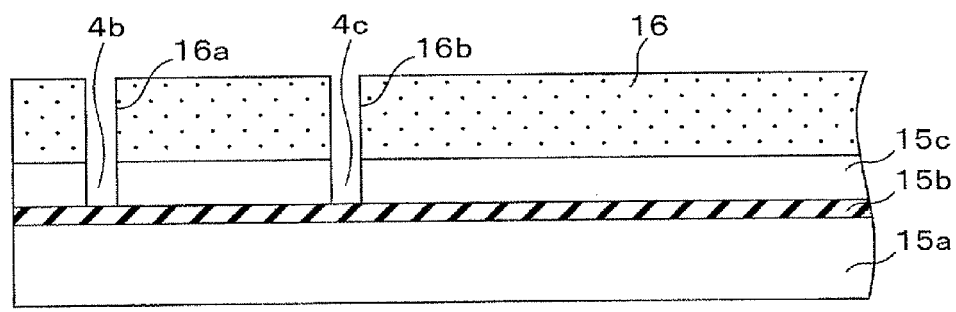
Figure 7D:
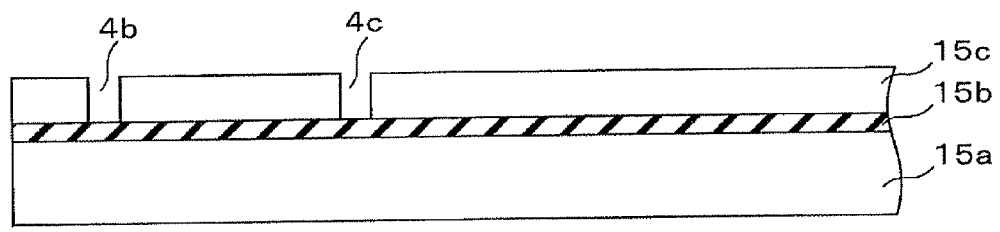
FIGS. 7D, 7E, and 7F are cross-sectional views for illustrating an example of a manufacturing method of the piezoelectric generator according to the first embodiment (parts 4 through 6).
Figure 7E:
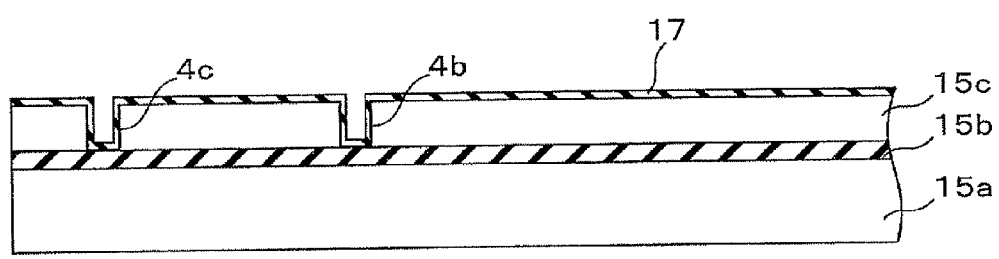
Figure 7F:
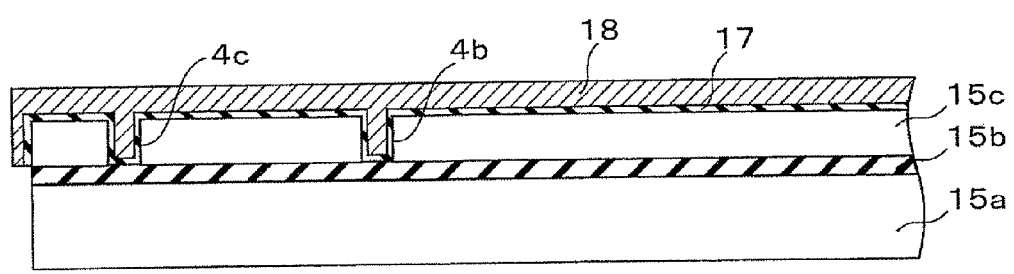
Figure 7G:
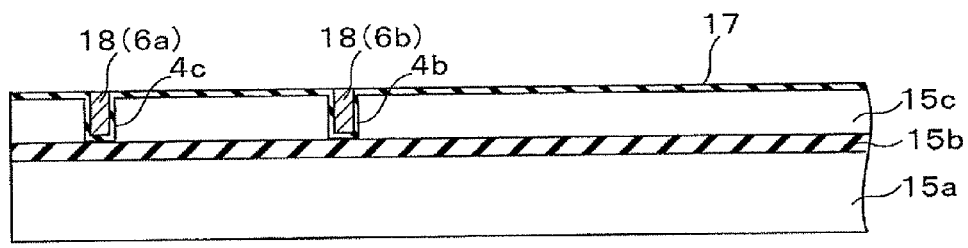
FIGS. 7G, 7H, and 7I are cross-sectional views for illustrating an example of a manufacturing method of the piezoelectric generator according to the first embodiment (parts 7 through 9).
Figure 7H:
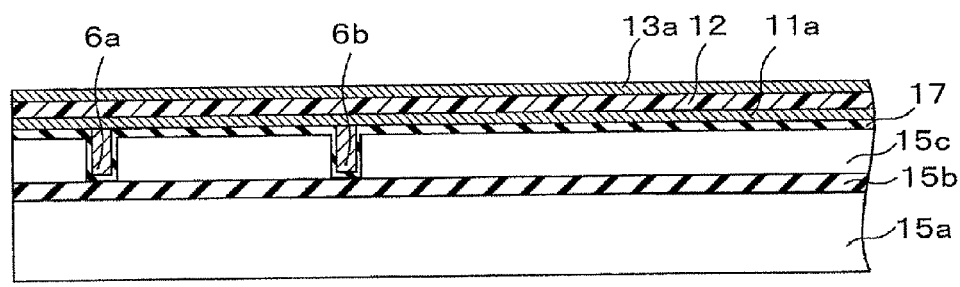
Figure 7I:
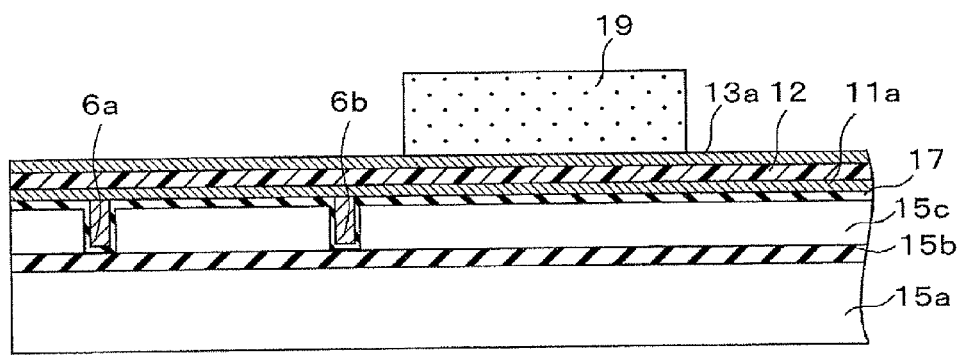
Figure 7J:
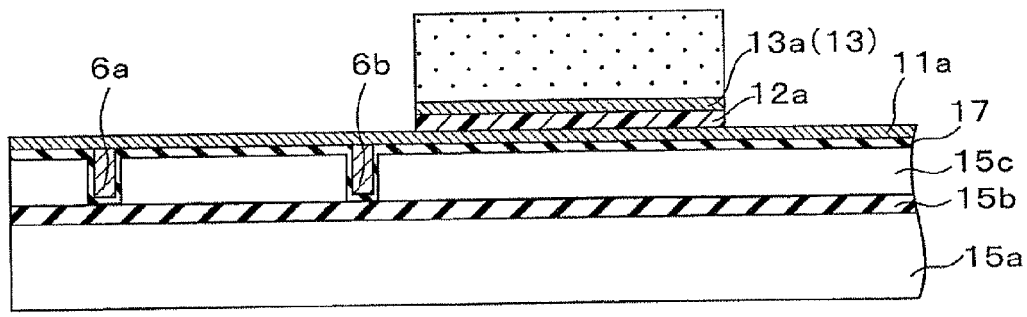
FIGS. 7J, 7K, and 7L are cross-sectional views for illustrating an example of a manufacturing method of the piezoelectric generator according to the first embodiment (parts 10 through 12).
Figure 7K:
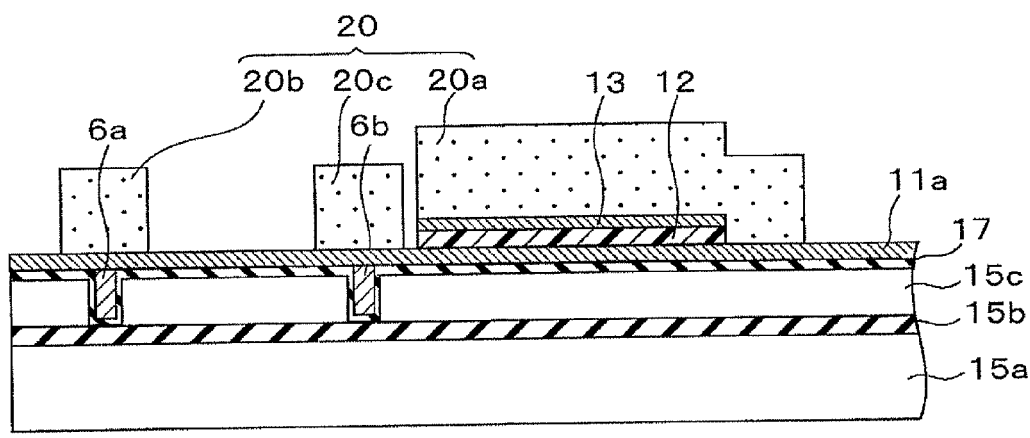
Figure 7L:
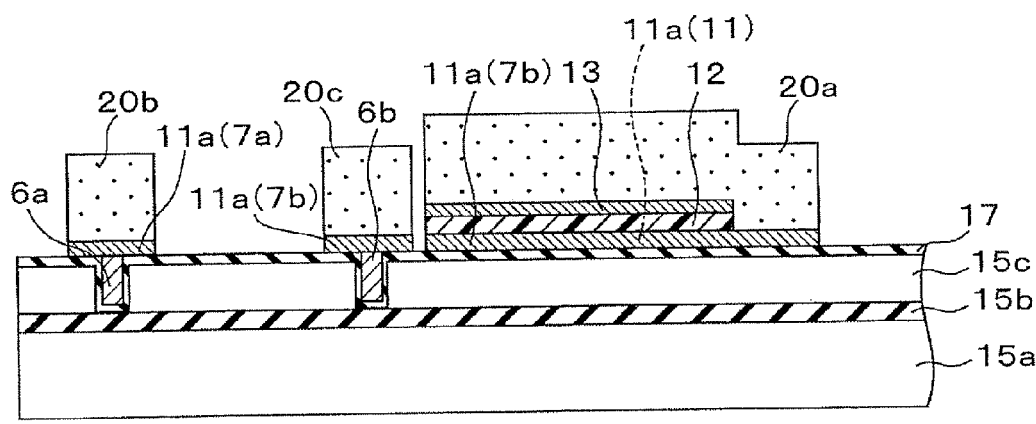
Figure 7M:
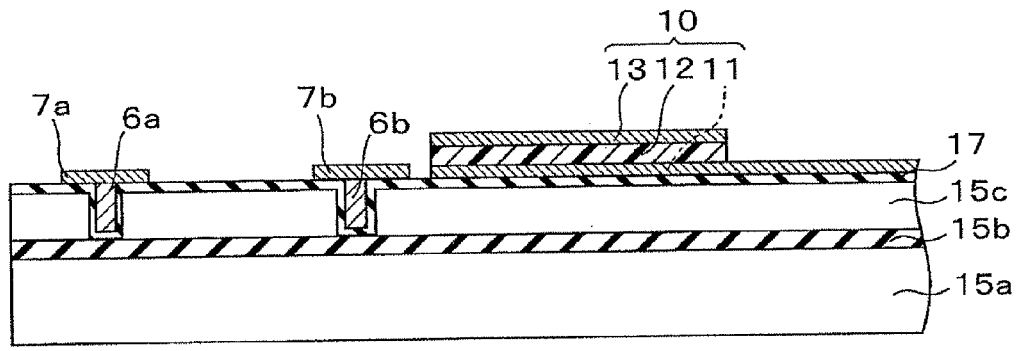
FIGS. 7M, 7N, and 7O are cross-sectional views for illustrating an example of a manufacturing method of the piezoelectric generator according to the first embodiment (parts 13 through 15).
Figure 7N:
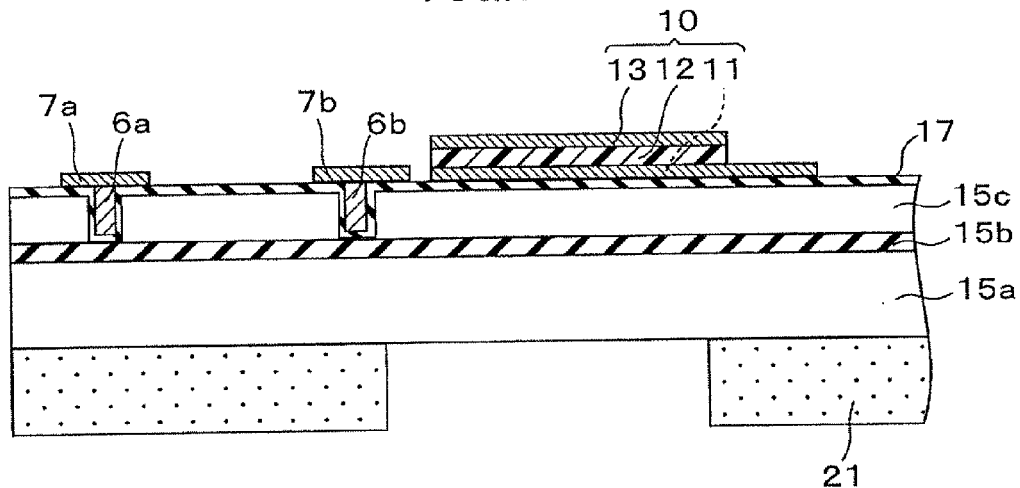
Figure 7O:
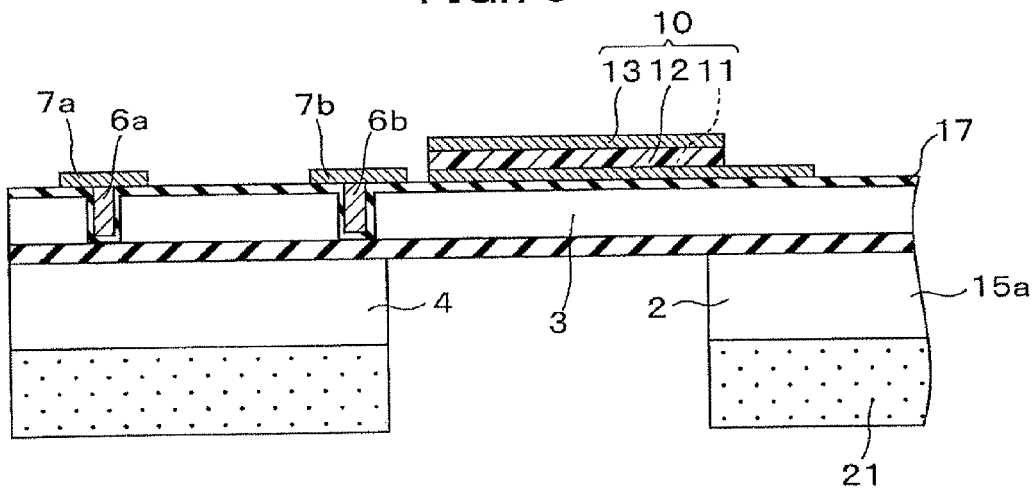
Figure 7P:
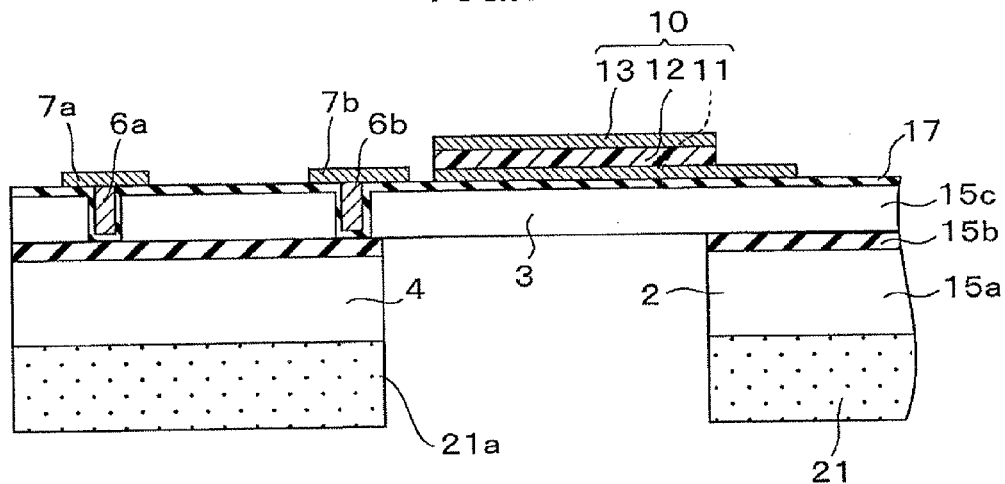
FIGS. 7P, 7Q, and 7R are cross-sectional views for illustrating an example of a manufacturing method of the piezoelectric generator according to the first embodiment (parts 16 through 18).
Figure 7Q:
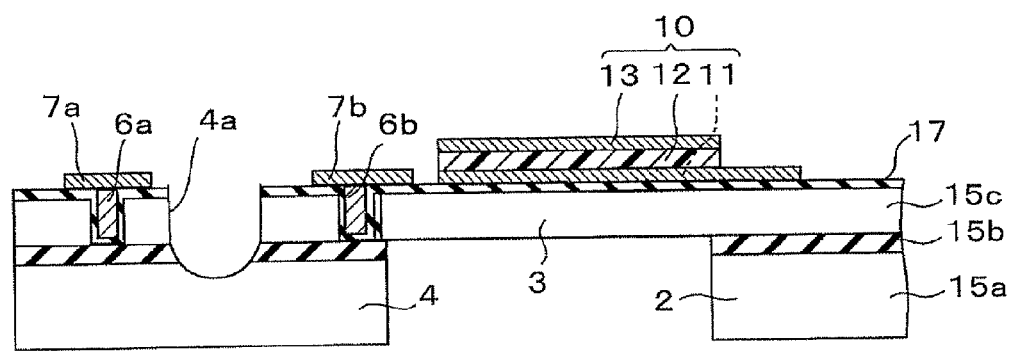
Figure 7R:
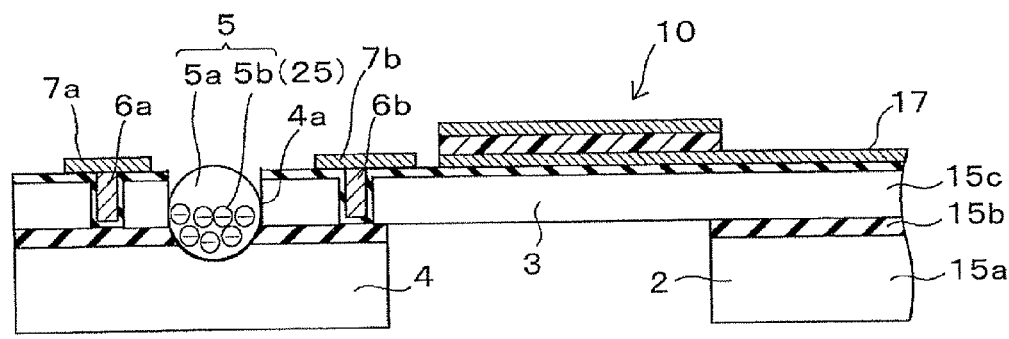

Next, a description is given of an example of method of manufacturing the piezoelectric generator 1 with reference to FIGS. 7A through 7R and FIGS. 8A through 8D. FIGS. 7A through 7R are cross-sectional views for illustrating procedures for forming the piezoelectric generator 1, and FIGS. 8A through 8D are plan views for illustrating procedures for forming the piezoelectric generator 1.

To form the piezoelectric generator 1, a SOI substrate 15 as illustrated in FIG. 7A is prepared. The SOI substrate 15 has a structure in which the silicon oxide layer 15b and the silicon layer 15c are formed on the silicon substrate 15a. In the SOI substrate 15, the silicon substrate 15a has a thickness of, for example, approximately 500 µm, the silicon oxide layer 15b has a thickness of, for example, approximately 1 µm, and the silicon layer has a thickness of, for example, approximately 3 µm.

The SOI substrate 15 has an area in which plural piezoelectric generators 1 are formed; however, in the following a description is given of a method of forming one piezoelectric generator.

Figure 8A:
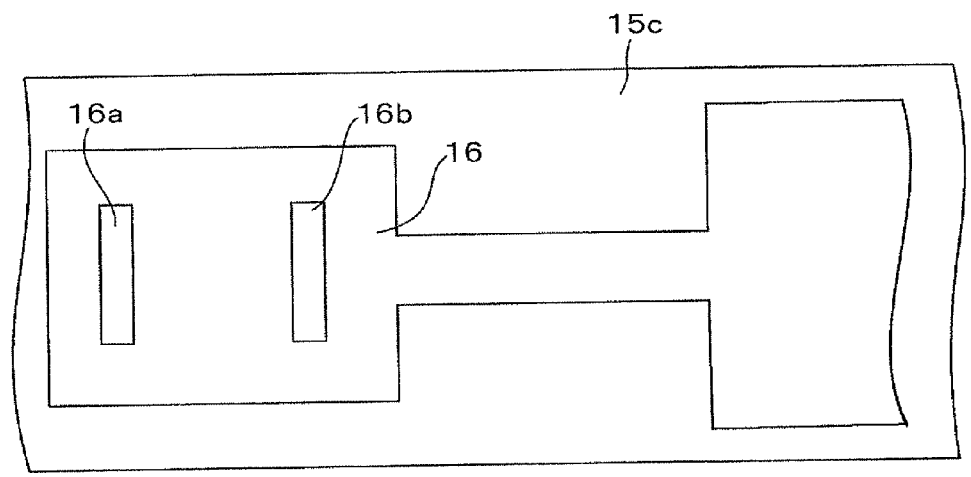
FIGS. 8A and 8B are plan views for illustrating an example of a manufacturing method of the piezoelectric generator according to the first embodiment (parts 1 and 2).

First, as illustrated in FIGS. 7B and 8A, on the silicon layer 15c of the SOI substrate 15, a first mask is formed. A first mask 16 has a pattern having the same planar shape as the piezoelectric generator 1 in FIG. 1A, including a fixing part forming area, a cantilever forming area, and a weight part forming area. Furthermore, the first mask 16 has a first opening part 16a and a second opening part 16b in areas where the first electrode 6a and the second electrode 6b are to be formed, in the weight part forming area.

The planar shape of the first opening part 16a and the second opening part 16b is, for example, a square having a width of approximately 50 μm and a depth of approximately 3 μm. In this case, the direction of the width is the direction perpendicular to the sheet on which FIG. 7B is depicted.

As the first mask 16, for example, a resist pattern having a thickness of approximately 2 μm is used. The resist pattern is formed by applying photoresist on the silicon layer 15c, and exposing and developing the photoresist.

A hard mask may be used as the first mask 16. A hard mask is formed by forming a resist pattern on a hard film such as silicon nitride and silicon oxide, and etching the hard film by using the resist pattern as a mask.

Next, as illustrated in FIG. 7C, the silicon layer 15c in the areas exposed through the first mask 16 is etched. Accordingly, the silicon layer 15c remaining below the first mask 16 is used as part of the fixing part 2, the weight part 4, and the cantilever 3. Furthermore, below the first opening part 16a and the second opening part 16b of the first mask 16, a first gap part 4b and a second gap part 4c are formed.

As the method of etching the silicon layer 15c, a dry etching method is performed, such as a reactive ion etching method and/or a plasma etching method. As the etching gas, for example, chlorinated gas is used, by which the etching selection ratio of the silicon layer 15c to the silicon oxide layer 15b is large.

As the etching method, a wet etching method may be performed, using a chemical such as KOH.

Figure 8B:
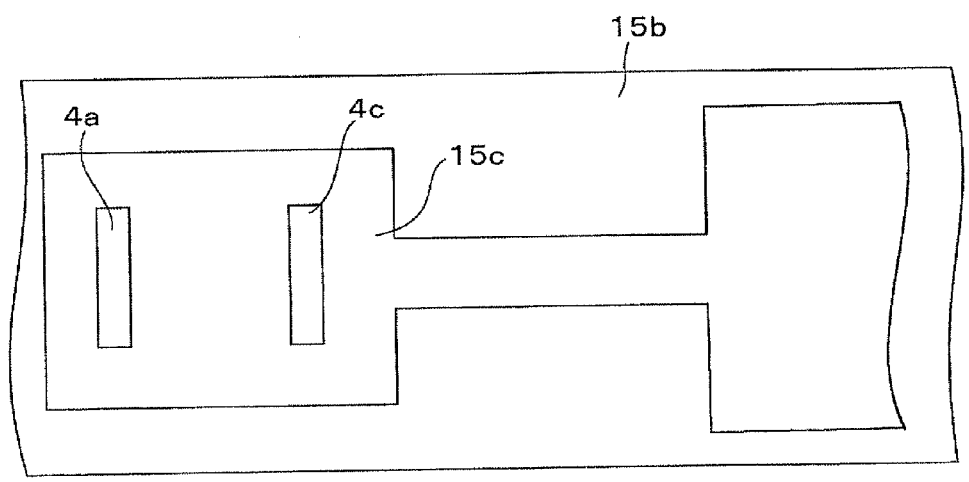

Then, as illustrated in FIGS. 7D and 8B, the first mask 16 is removed. When using a resist pattern as the first mask 16, the resist pattern may be removed by a wet process using a solvent or by dry ashing using ozone. Furthermore, when a hard mask is used as the first mask 16, for example, a hard mask made of silicon oxide is removed with, for example, fluorine, and a hard mask made of silicon nitride is removed with, for example, heated phosphoric acid.

Next, as illustrated in FIG. 7E, on the top surface of the silicon layer 15c and on the inner peripheral surface and the bottom surface of the first gap part 4b and the second gap part 4c, a silicon nitride film 17 acting as an insulating film is formed by, for example, a CVD method. The silicon nitride film 17 has a thickness that does not completely fill the first gap part 4b and the second gap part 4c, for example, of approximately 100 nm.

Next, as illustrated in FIG. 7F, a copper (Cu) seed film (not illustrated) is formed on the silicon nitride film 17 by a sputtering method to have a thickness of approximately 50 nm. Then, a Cu film 18 is formed on the Cu seed film by an electroplating method. The Cu film 18 is formed to have a thickness that completely fills the inside of the first gap part 4b and the second gap part 4c.

Incidentally, before forming the Cu film 18 and the Cu seed layer (not illustrated), photoresist is applied on the silicon nitride film 17 on the silicon layer 15c that is the fixing part 2, the cantilever 3, and the weight part 4. Accordingly, when the photoresist is removed with a solvent after forming the Cu film 18, the Cu film 18 selectively remains on the silicon layer 15c that has been patterned.

Subsequently, as illustrated in FIG. 7G, the Cu film 18 is removed from the top of the silicon layer 15c by, for example, a Chemical Mechanical Polishing (CMP) method. In this case, the silicon nitride film 17 acts as a polishing stopper. Accordingly, the Cu film 18 remaining inside the first gap part 4b and the second gap part 4c is used as the first electrode 6a and the second electrode 6b described above.

Next, as illustrated in FIG. 7H, a first conductive film 11a, a piezoelectric film 12, and a second conductive film 13a are sequentially formed on the first electrode 6a, the second electrode 6b, and the silicon nitride film 17. As the first conductive film 11a and the second conductive film 13a, for example, aluminum films having a thickness of approximately 0.15 μm are formed by a sputtering method. Furthermore, as the piezoelectric film 12, a PZT film having a thickness of approximately 1 μm is formed by a CVD method.

As materials of the first conductive film 11a and the second conductive film 13a, materials other than aluminum may be used, including metal such as nickel (Ni), platinum (Pt), ruthenium (Ru), iridium (Ir), chromium (Cr), copper (Cu), and titanium (Ti); conductive nitride such as titanium nitride (TiN); carbide such as tungsten carbide (WC); and a conductive oxide such as indium tin oxide (ITO).

As materials of the piezoelectric film 12, materials other than PZT may be used, such as lead lanthanum zirconate titanate (PLZT; (Pb,La)(Zr,Ti)O$_3$), niobium (Nb)-added PZT, and perovskite oxide such as PNN-PZT (Pb(Ni,Nb)O$_3$—PbTiO$_3$—PbZrO$_3$), PMN-PZT (Pb(Mg,Nb)O$_3$—PbTiO$_3$—PbZrO$_3$), and barium titanate (BaTiO$_3$). Materials other than the above include potassium niobate (KNbO$_3$), lithium niobate (LiNbO$_3$), Lithium titanate (LiTiO$_3$), zinc oxide (ZnO), and aluminum nitride (AlN).

Figure 8C:
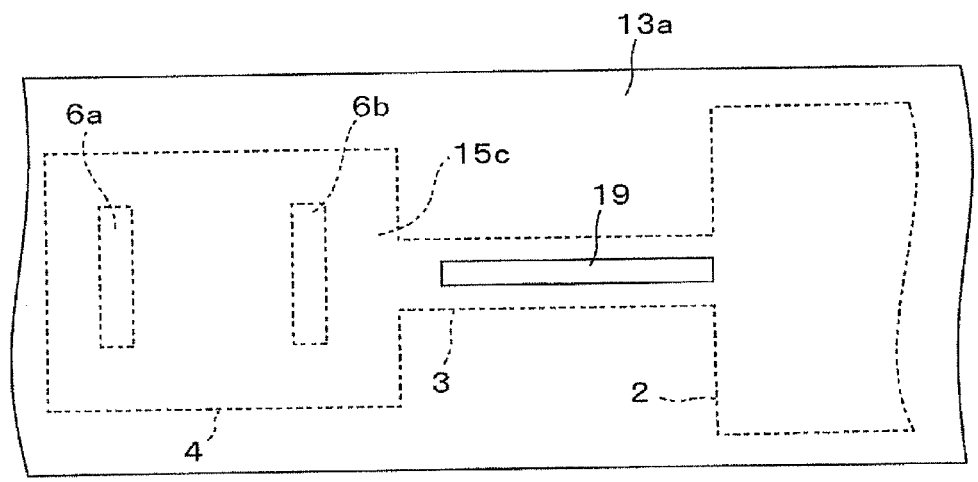
FIGS. 8C and 8D are plan views for illustrating an example of a manufacturing method of the piezoelectric generator according to the first embodiment (parts 3 and 4).

Next, as illustrated in FIGS. 7I and 8C, a second mask 19 is formed on the second conductive film 13a. The second mask 19 is formed to have a planar shape such as a square on the cantilever 3 to form the piezoelectric cell 10. As the second mask 19, for example, a resist pattern having a thickness of approximately 2 μm is used, similar to the first mask 16. A hard mask may be used as the second mask 19, similar to the first mask 16.

Next, as illustrated in FIG. 7J, the second conductive film 13a and the piezoelectric film 12 in areas not covered by the second mask 19 are removed by, for example, a sputter etching method. Accordingly, the second conductive film 13a remaining below the second mask 19 is used as the upper electrode 13. Furthermore, the piezoelectric film 12 is patterned to have the same planar shape as the upper electrode 13.

Subsequently, the second mask 19 is removed by the same method as that used for removing the first mask 16.

Figure 8D:
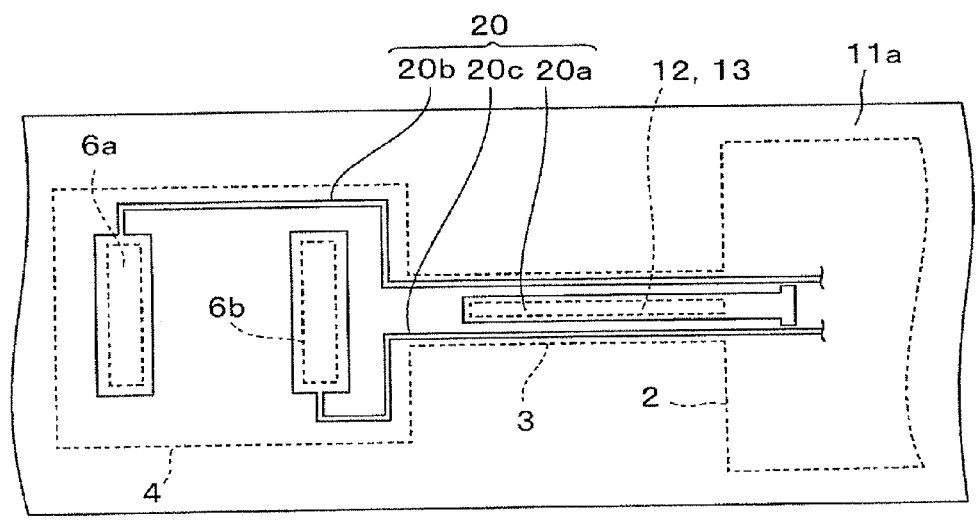

Next, as illustrated in FIGS. 7K and 8D, a third mask 20 is formed on the first conductive film 11a, the upper electrode 13, and the piezoelectric film 12. The third mask 20 is formed with photoresist or a hard film similar to the first mask 16, and includes a piezoelectric cell forming pattern 20a, a first wiring forming pattern 20b, and a second wiring forming pattern 20c.

The piezoelectric cell forming pattern 20a covers the upper electrode 13 and the piezoelectric film 12, and has a planar shape covering the areas protruding onto the fixing part 2 from the upper electrode 13. Furthermore, the first wiring forming pattern 20b has a linear area extending from the top of the first electrode 6a to the fixing part 2. Furthermore, the second wiring forming pattern 20c has a linear area extending from the top of the second electrode 6b to the fixing part 2.

Next, as illustrated in FIG. 7L, the first conductive film 11a in areas not covered by the third mask 20 is removed by, for example, a sputter etching method. Accordingly, the first conductive film 11a is patterned.

Accordingly, below the piezoelectric cell forming pattern 20a of the third mask 20, the lower electrode 11 is formed, extending from the bottom of the upper electrode 13 to the fixing part 2, as illustrated in FIG. 1A. Furthermore, below the first wiring forming pattern 20b and the second wiring forming pattern 20c of the third mask 20, the first lead wiring 7a and the second lead wiring 7b passing by both sides of the upper electrode 13 are respectively formed, as illustrated in FIG. 1A. Subsequently, as illustrated in FIG. 7M, the third mask 20 is removed.

The upper electrode 13, the piezoelectric film 12, and the lower electrode 11 are used as the piezoelectric cell 10 illustrated in FIGS. 1A and 1B.

Next, as illustrated in FIG. 7N, on the bottom surface of the silicon substrate 15a, a fourth mask 21 is formed. The fourth mask 21 is shaped such that the bottom of the cantilever 3 between the fixing part 2 and the weight part 4 and both sides of this part are exposed. The fourth mask 21 is formed with photoresist or a hard film similar to the first mask 16.

Subsequently, as illustrated in FIG. 7O, the silicon substrate 15a exposed from the fourth mask 21 is etched to expose the silicon oxide layer 15b. The method of etching the silicon substrate 15a may be dry etching or wet etching. The etching gas used for dry etching may be, for example, chlorinated gas. Furthermore, in the case of wet etching, a chemical such as KOH is used, for example.

Accordingly, the part of the silicon oxide layer 15b below the cantilever 3 and both sides of this part are exposed from the fourth mask 21.

The fourth mask 21 may have a planar shape covering the parts below the fixing part 2 and the weight part 4. Accordingly, after the etching is performed, the cantilever 3, the fixing part 2, and the weight part 4 are formed on the silicon substrate 15a and the silicon layer 15c on the fourth mask 21.

Subsequently, as illustrated in FIG. 7P, the silicon oxide layer 15b exposed from the fourth mask 21 is removed with fluorine. The exposed silicon nitride film 17 may be removed with, for example, heated phosphoric acid.

Next, as illustrated in FIG. 7Q, for example, a $CO_2$ laser beam is radiated to the center of the weight part 4 formed from the SOI substrate 15, to from the recessed part 4a. The bottom of the recessed part 4a is preferably a substantially spherical shape or a substantially hemispherical shape.

Next, as illustrated in FIG. 7R, the recessed part 4a is filled with the particulate-containing liquid 5 illustrated in FIG. 1B. The particles 5b included in the particulate-containing liquid 5 may have a microcapsule structure, and the microcapsules are formed by, for example, the method illustrated in FIGS. 9A and 9B.

Figure 9A:
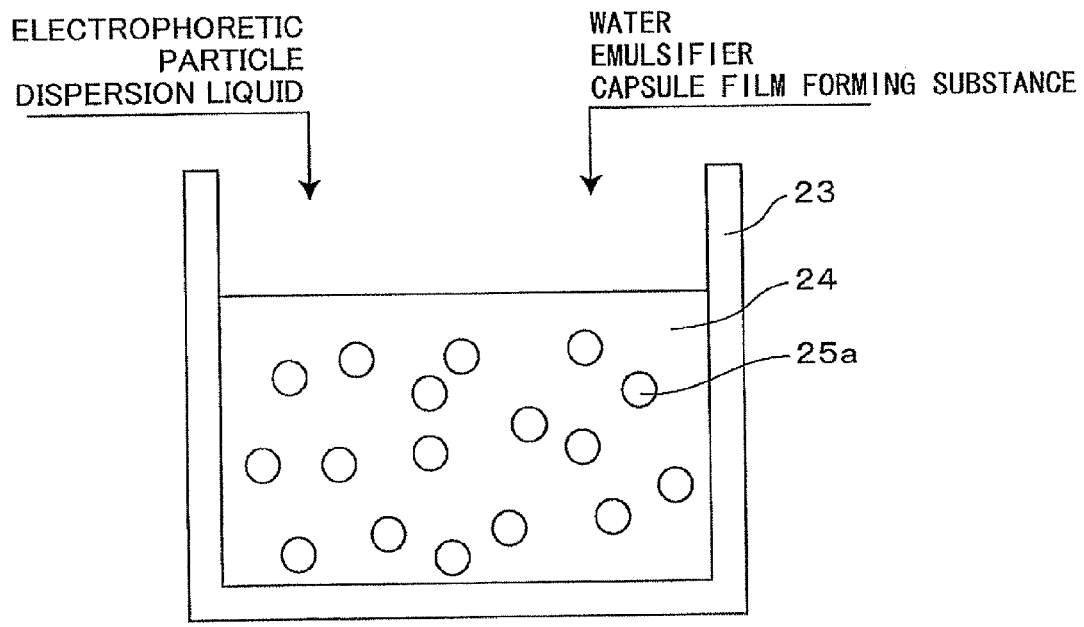
FIGS. 9A and 9B are cross-sectional views indicating procedures of preparing a particulate-containing liquid used for adjusting the centroid in the piezoelectric generator according to the first embodiment.

FIG. 9A illustrates a state where a liquid 24 for forming the particulate-containing liquid 5 is put in a container 23. The liquid 24 is formed by the following method.

First, a liquid in which electrophoretic particles are dispersed with the use of a non-polar organic solvent such as a hydrocarbon solvent, i.e., an electrophoretic particle dispersion liquid, is put in the container 23. Then, in the electrophoretic particle dispersion liquid in the container 23, water, an emulsifier and a capsule film forming substance are added, so that the electrophoretic particle dispersion liquid is turned into liquid droplets (emulsified). In this case, by mechanically stirring the liquid 24 in the container 23, the diameters of liquid droplets 25a formed in the electrophoretic particle dispersion liquid are made as even as possible.

Next, by forming polymer membranes on the surfaces of the liquid droplets 25a, microcapsules encapsulating electrophoretic particles are formed. In this case, the polymer membranes are formed so as not to hamper the electrophoresis of the electrophoretic particles.

Figure 9B:
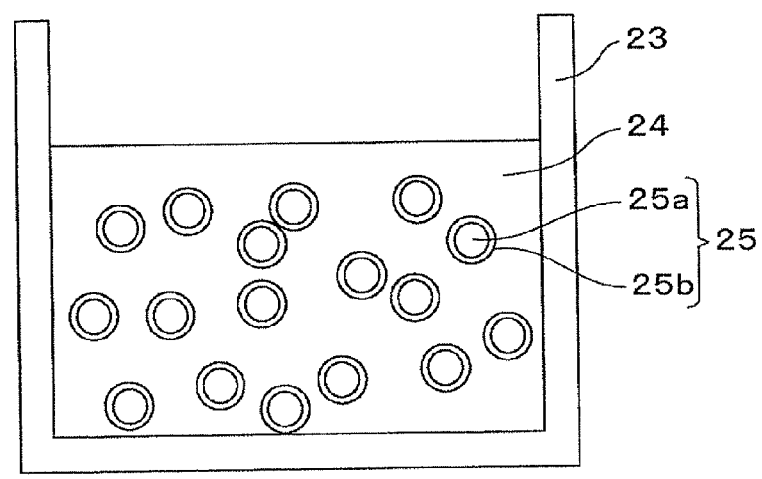

For example, a prepolymer aqueous solution obtained by heating urea and formaldehyde in an alkaline aqueous solution and causing the urea and formaldehyde to react, is added to the liquid 24 in the container 23. Subsequently, by heating and dispersing the liquid 24 in the container 23, polymer molecules 25b are deposited on the liquid droplets 25a as illustrated in FIG. 9B.

Accordingly, microcapsules 25 encapsulating electrophoretic particles are formed. The liquid 24 inside the container 23 corresponds to the above particulate-containing liquid 5. Furthermore, the microcapsules 25 inside the particulate-containing liquid 5 correspond to the above particles 5b. Furthermore, the liquid 24 in the container 23 excluding the microcapsules 25 corresponds to the above liquid 5a in the particulate-containing liquid 5.

By forming the microcapsules 25 by the above-described phase separating method, all of the monomer that is the capsule film is present in the aqueous phase, and therefore the impact of substances in the aqueous phase dispersion phase is minimized. The microcapsules in such a liquid are negatively charged, for example.

The method of forming microcapsules is not limited to the above. For example, microcapsules used for electronic books may be used. Such microcapsules are described in, for example, B. Comiskey at al., Nature, 394, 1997, pp. 253-255, H. Yoshizawa et al., Journal of Microencapsulation, Vol. 21, No. 3, 2004, pp. 241-249.

After dropping the particulate-containing liquid 5 in the recessed part 4a of the weight part 4, as illustrated in FIG. 1B, the particulate-containing liquid 5 is sealed in the recessed part 4a with a covering film 9. As the covering film 9, for example, an epoxy-based adhesive is supplied on the silicon layer 15c.

Figure 10A:
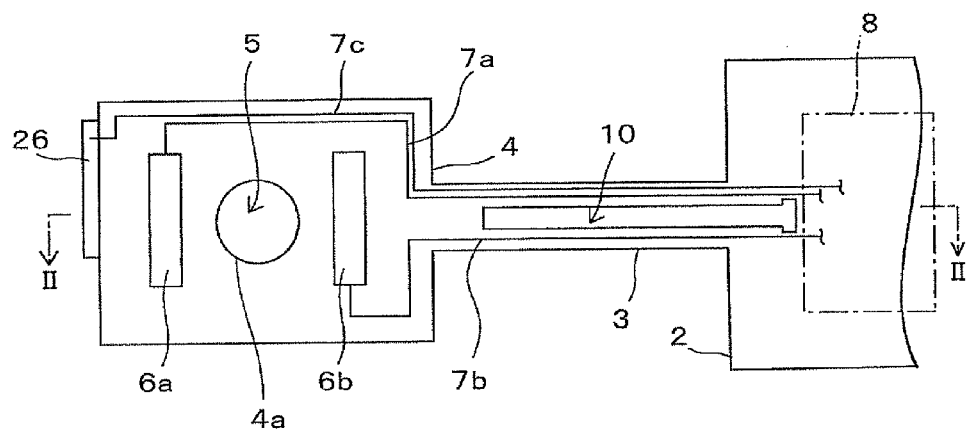
FIG. 10A is a plan view indicating a state where a third electrode is added to the piezoelectric generator according to the first embodiment.
Figure 10B:
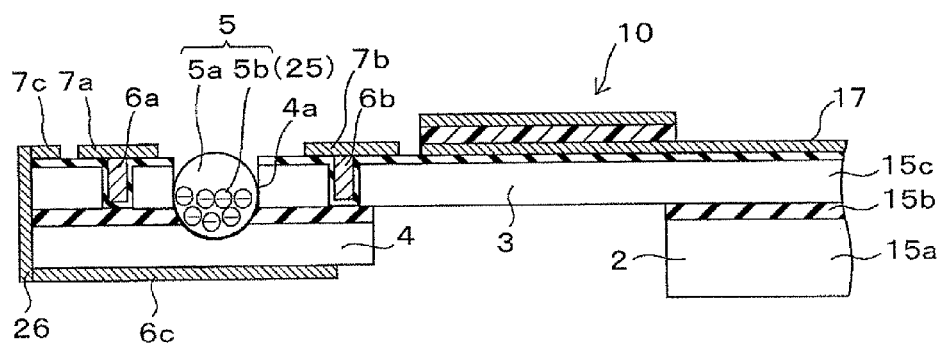
FIG. 10B is a cross-sectional view cut along a line II-II of FIG. 10A.

As illustrated in the plan view of FIG. 10A and the cross-sectional view of FIG. 10B, on the bottom surface of the weight part 4, a third electrode 6c that applies an electric field to the recessed part 4a may be formed. The third electrode 6c is connected to a third lead wiring 7c on the weight part 4 via a conductive film 26 formed on the front edge of the weight part 4. The third lead wiring 7c is lead out on the cantilever 3 and the fixing part 2, and is connected to the centroid control circuit 8.

For example, the third electrode 6c is formed by the following method.

First, at the same time as forming the first lead wiring 7a and the second lead wiring 7b by the method illustrated in FIG. 7L, the third lead wiring 7c is formed on the cantilever 3 and the fixing part 2. Furthermore, before forming the recessed part 4a in the weight part 4, the bottom surface of the weight part 4 is etched to make the weight part 4 thin. Next, after forming the third electrode 6c on the bottom surface of the weight part 4, side wall wiring 26 is formed on the front edge surface of the weight part 4. Accordingly, the third electrode 6c is electrically connected to the third lead wiring 7c via the side wall wiring 26.

Figure 11:
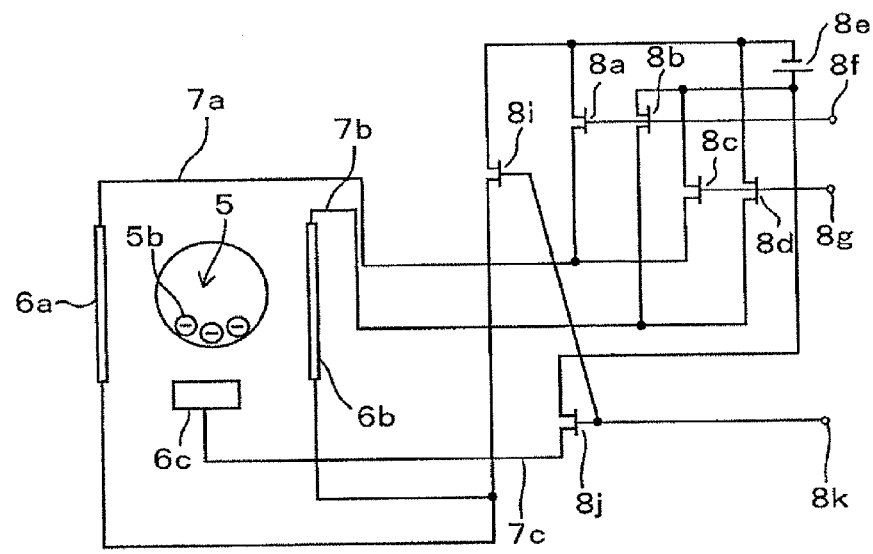
FIG. 11 is a circuit diagram of a control circuit for adjusting a centroid of a weight part of the piezoelectric generator illustrated in FIG. 10A.

When the third electrode 6c is formed, for example, an equivalent circuit as illustrated in FIG. 11 is used as the centroid control circuit 8.

In FIG. 11, the centroid control circuit 8 includes fifth and sixth field-effect transistors 8i, 8j, other than the first through fourth field-effect transistors 8a through 8d.

In the fifth field-effect transistor 8i, the source/drain combination at one end is connected to the negative electrode of the DC power source 8e, and the source/drain combination at the other end is connected to the first electrode 6a and the second electrode 6b. Furthermore, in the sixth field-effect transistor 8j, the source/drain combination at one end is connected to the positive electrode of the DC power source 8e, and the source/drain combination at the other end is connected to the third electrode 6c. Furthermore, the gates of the fifth and sixth field-effect transistors 8i, 8j are connected to a third gate terminal 8k.

In FIG. 10B, when the centroid of plural particles 5b in the weight part 4 is moved to substantially the center of the recessed part 4a, a pulse voltage is applied to the third gate terminal 8k and the fifth and sixth field-effect transistors 8i, 8j are turned on.

Accordingly, a voltage having an opposite polarity to the polarity to which the particles 5b are charged is applied to the third electrode 6c, and a voltage having the same polarity to which the particles 5b are charged is applied to the first electrode 6a and the second electrode 6b. Accordingly, the centroid of the assembly of the particles 6b is positioned at substantially the center of the recessed part 4a.

Thus, according to the piezoelectric generator 1 illustrated in FIGS. 10A and 10B, the position of the centroid in the recessed part 4a may be moved to any one of a front part, a center part, and a back part in the longitudinal direction of the cantilever 3.

By moving the centroid of the weight part 4 by the centroid adjustment part, it is possible to change the resonance frequency of the cantilever 3 of the piezoelectric generator 1. Therefore, according to the resonance frequency of the device to which the piezoelectric generator 1 is attached, it is possible to set the resonance frequency of the cantilever 3 to an optimum value by which the power generation efficiency of the piezoelectric cell 10 is maximized.

Figure 12:
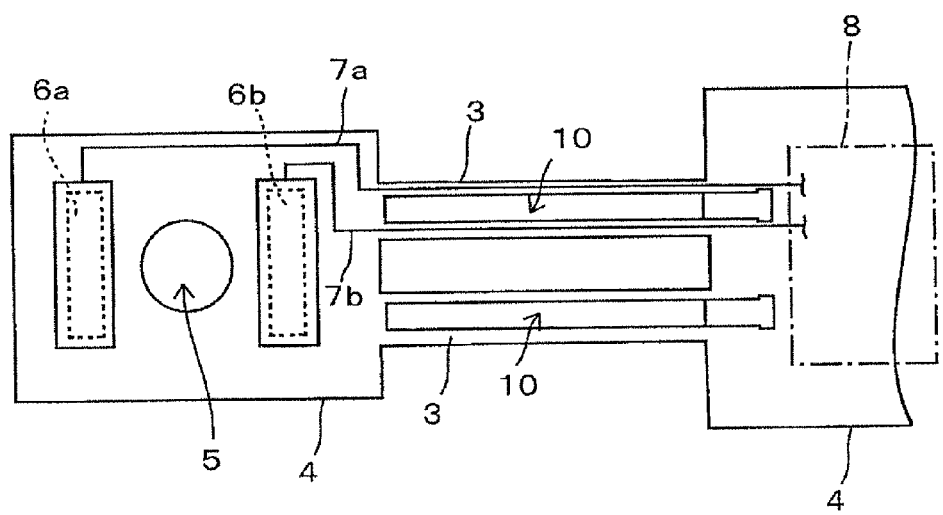
FIG. 12 is a plan view illustrating a state where two piezoelectric cells are attached to the piezoelectric generator according to the first embodiment.

Incidentally, in the piezoelectric generator 1, as illustrated in FIG. 12, plural cantilevers 3 may be formed with intervals, between the fixing part 2 and the weight part 4. A piezoelectric cell 10 is attached on each of the plural cantilevers 3.

In the following embodiments, it is possible to form plural cantilevers 3 and form piezoelectric cells 10 on the cantilevers 3. Furthermore, in the following embodiments, the third lead wiring 7c may be formed.

The shape of the above recessed part 4a is not limited to a circular cylinder having a hemispherical base. The shape may be a square pillar or an elliptic cylinder.

Second Embodiment

Figure 13A:
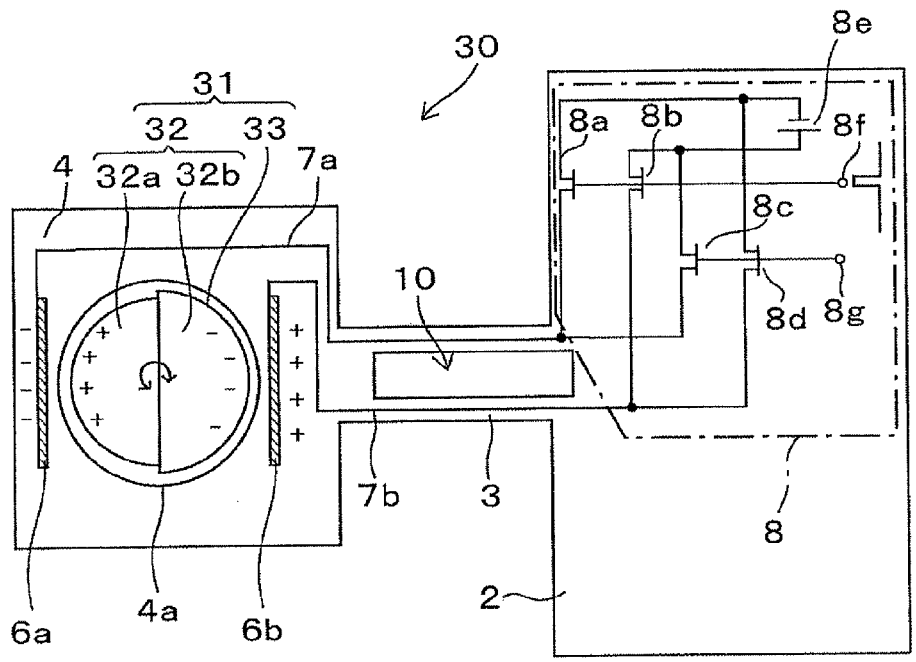
FIGS. 13A and 13B are plan views illustrating different centroid positions of the weight part of a piezoelectric generator according to a second embodiment.
Figure 13B:
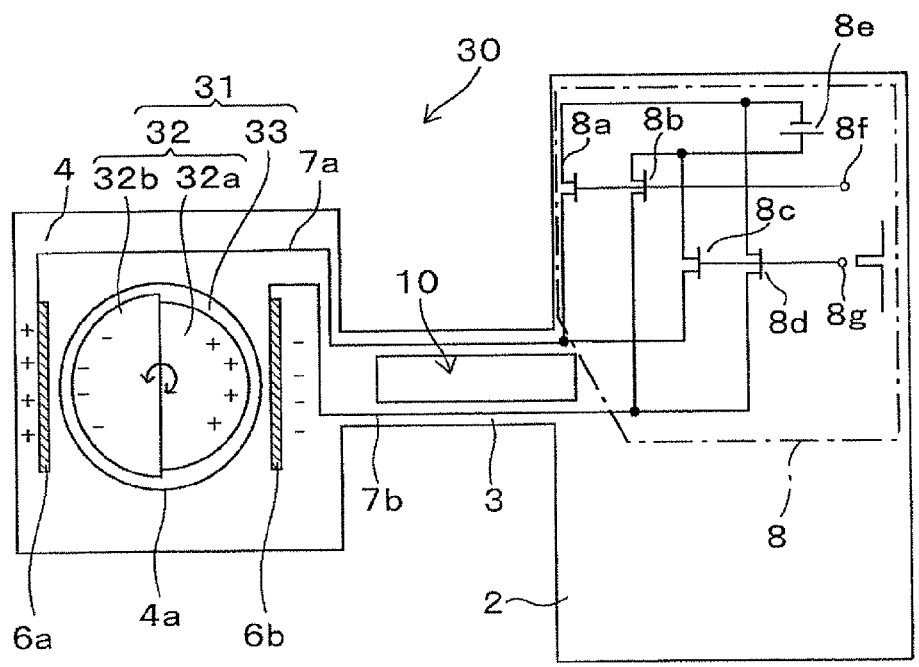

FIGS. 13A and 13B are plan views illustrating a piezoelectric generator and the movement of the centroid according to a second embodiment. The same elements as those of FIGS. 1A and 1B are denoted by the same reference numerals.

In FIGS. 13A and 13B, a piezoelectric generator 30 includes the fixing part 2, the cantilever 3, the weight part 4, the first electrode 6a, the second electrode 6b, the first lead wiring 7a, the second lead wiring 7b, and the centroid control circuit 8, similar to the first embodiment.

In substantially the center of the weight part 4, the recessed part 4a having a hemispherical base is formed, which is filled with a centroid adjustment part 31. Similar to the first embodiment, the centroid adjustment part 31 is sealed by a sealing film (not illustrated) formed on the weight part 4.

The adjustment part 31 includes a twist ball 32 put in the recessed part 4a, and silicone oil 33 that is supplied between the inner walls of the recessed part 4a and the twist ball 32. The twist ball 32 is a spherical rotating body having a positive surface area and a negative surface area. The twist ball 32 has a structure in which part of a spherical body 32a made of, for example, acrylic, silicon, or glass, is covered with a chargeable dielectric film 32b.

Figure 14:
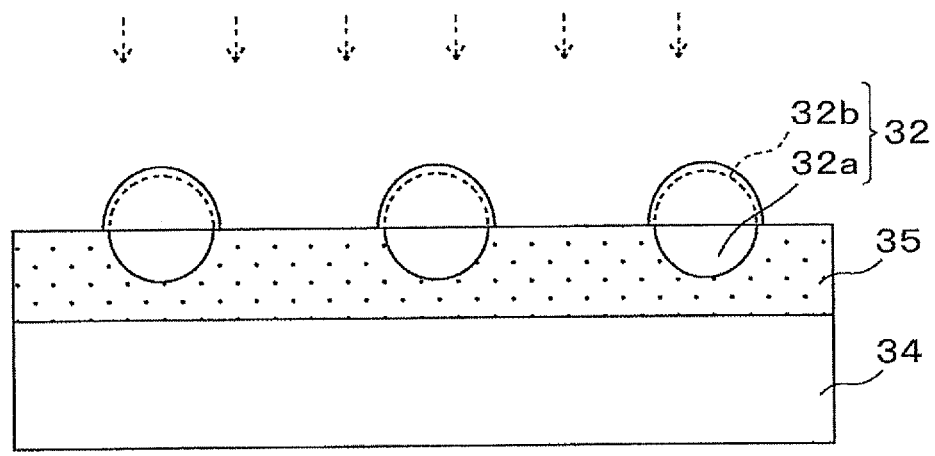
FIG. 14 is a cross-sectional view illustrating an example of a manufacturing method of a twist ball attached to the weight part of the piezoelectric generator according to the second embodiment.

For example, as illustrated in FIG. 14, the twist ball 32 is formed by vapor-depositing the charge film 32b on the exposed surface of the spherical body 32a in a state where half the spherical body 32a is embedded in an adhesive layer 35 on a support base 34.

The charge film 32b has a hemispherical shape in FIG. 14; however, the shape may be asymmetric as viewed in FIG. 14 according to the direction of the vapor deposition. The centroid of an asymmetric twist ball 32 is deviated from the rotational center or the center of the shape of the twist ball 32.

The charge film 32b is charged by, for example, friction, before being supplied in the recessed part 4a.

For example, aluminum is a positive charging material for forming the charge film 32b. For example, fluorine resin is a negative charging material for forming the charge film 32b. When the charge film 32b is formed with a negative charging material, the centroid of the twist ball 32 is moved by the following method.

According to the control of the centroid control circuit 8, when the first electrode 6a is negatively charged and the second electrode 6b is positively charged, as illustrated in FIG. 13A, the negatively charged charge film 32b is attracted to the second electrode 6b by an electrostatic force. Furthermore, the exposed surface of the positively charged spherical body 32a is attracted to the first electrode 6a by an electrostatic force. Accordingly, the twist ball 32 rotates, and is stabilized when the charge film 43b approaches the second electrode 6b, and the centroid in the recessed part 4a moves toward the cantilever 3.

Meanwhile, according to the control of the centroid control circuit 8, when the first electrode 6a is positively charged and the second electrode 6b is negatively charged, as illustrated in FIG. 13B, the negatively charged charge film 32b is attracted to the first electrode 6a by an electrostatic force. Furthermore, the exposed surface of the positively charged spherical body 32a is attracted to the second electrode 6b by an electrostatic force. Accordingly, the twist ball 32 rotates, and is stabilized when the charge film 32b approaches the first electrode 6a, and the centroid in the recessed part 4a moves toward the front edge of the weight part 4.

Comparing these two states, the positions of the centroid of the twist ball 32 are different. Therefore, by selecting either one of the states, the resonance frequency of the weight part 4 and the cantilever 3 is adjusted, similar to the first embodiment.

Incidentally, the centroid of the twist ball 32 may be moved to substantially the center by applying, on the first electrode 6a and the second electrode 6b, an AC voltage whose crest value gradually attenuates with the passage of time as illustrated in FIG. 3A.

Furthermore, as illustrated in FIGS. 10A, 10B, and 11, the centroid of the twist ball 32 may be adjusted by providing the first, second, and third electrodes 6a, 6b, and 6c, and controlling the voltage applied on the first, second, and third electrodes 6a, 6b, and 6c.

Figure 15:
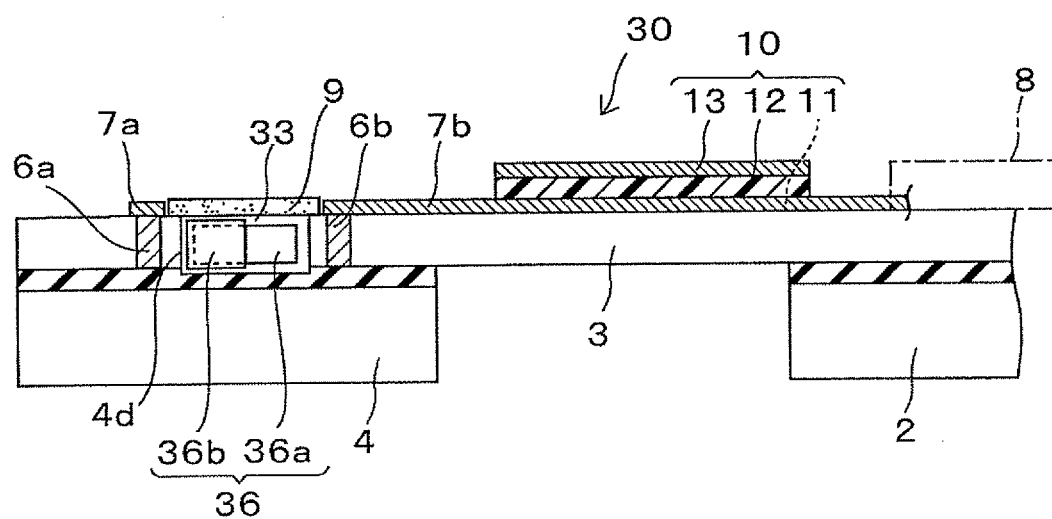
FIG. 15 is a cross-sectional view of another example of the piezoelectric generator according to the second embodiment.

Incidentally, the centroid adjustment part 31 formed in the recessed part 4a is not limited to the twist ball 32. For example, a rotating body illustrated in FIG. 15 may be used. This rotating body includes a cylinder 36a and a charge film 36b covering half the outer peripheral surface of the cylinder 36a. In this case, one of the exposed area of the cylinder 36a and the charge film 36b is negatively charged and the other one is positively charged.

The cylindrical centroid adjustment part 31 is accommodated in a cylindrical recessed part 4*d*, and rotates around the center axis of the cylinder.

In this case also, to smoothly rotate the centroid adjustment part 31, the recessed part 4*d* is filled with a lubricant 33, for example, silicone oil.

The centroid adjustment part 31 according to the present embodiment is not limited to being a sphere or a cylinder, as long as the centroid adjustment part 31 is a rotating body having a positive area and a negative area along the rotational direction.

Third Embodiment

Figure 16A:
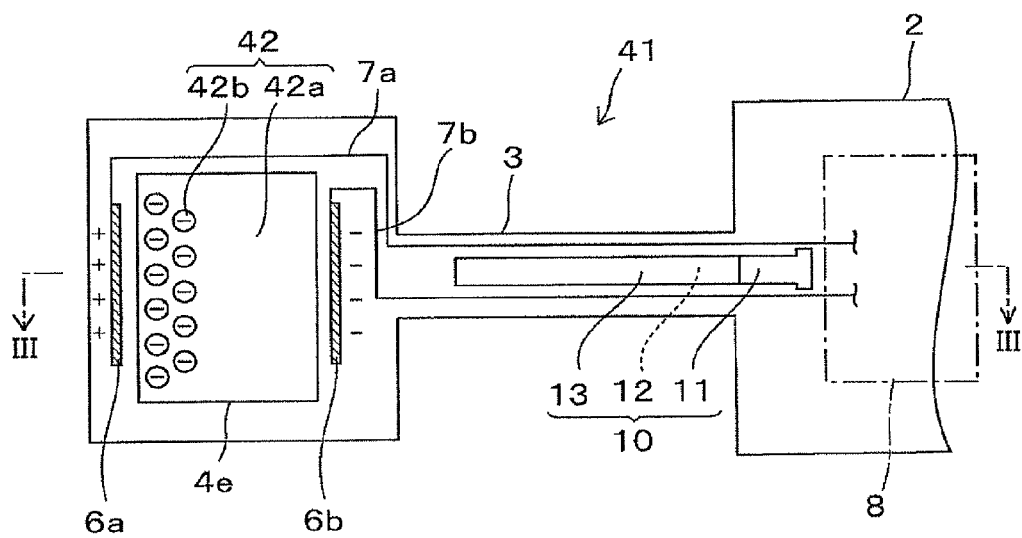
FIG. 16A is a plan view of a piezoelectric generator according to a third embodiment.
Figure 16B:
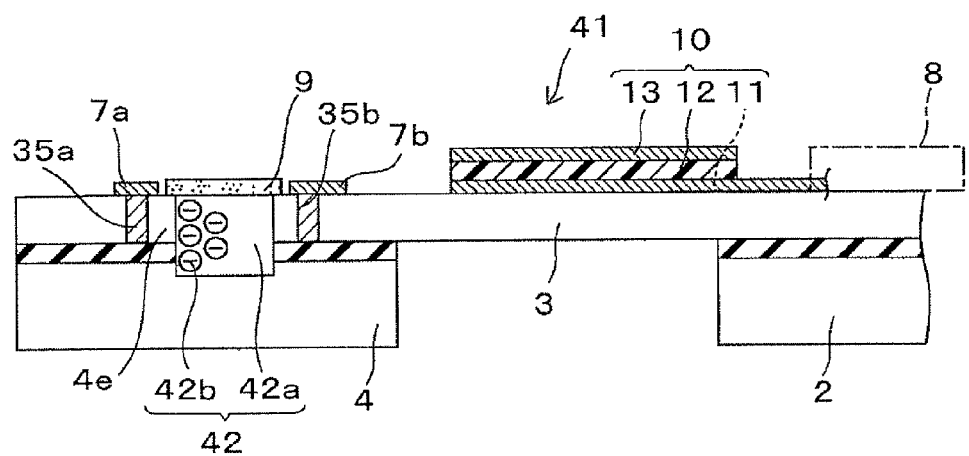
FIG. 16B is a cross-sectional view cut along a line III-III of FIG. 16A.

FIGS. 16A and 16B are a plan view and a cross-sectional view illustrating a piezoelectric generator according to a third embodiment. The same elements as those of FIGS. 1A and 1B are denoted by the same reference numerals.

In FIG. 16, a piezoelectric generator 41 includes the fixing part 2, the cantilever 3, the weight part 4, the first electrode 6*a*, the second electrode 6*b*, the first lead wiring 7*a*, the second lead wiring 7*b*, and the centroid control circuit 8, similar to the first embodiment.

In substantially the center of the weight part 4, a recessed part 4*e* shaped as a square pillar is formed, and a centroid adjustment unit 42 is formed in the recessed part 4*e*. The centroid adjustment unit 42 has charged particles 42*b*, for example, charged lead particles, supplied in a space 42*a*. Furthermore, the centroid adjustment unit 42 is sealed by a sealing film 9 formed on the weight part 4. As the sealing film, a non-charged sheet such as a polyvinylchloride sheet is used.

In order to adjust the resonance frequency of the cantilever 3 of the above-described piezoelectric generator 41 according to the present embodiment, for example, negatively charged lead particles are put in the space 42*a* of the recessed part 4*a* sealed by the sealing film 9, as the charged particles 42*b*. Furthermore, the first electrode 6*a* is positively charged through the first lead wiring 7*a* from the centroid control circuit 8 indicated in the first embodiment, and at the same time, the second electrode 6*b* is negatively charged through the second lead wiring 7*b* from the centroid control circuit 8. Accordingly, the charged particles move toward the first electrode 6*a* in the recessed part 4*a*, and the centroid of the assembly of the charged particles 42*b* move toward the front edge of the weight part 4.

Meanwhile, when the first electrode 6*a* is negatively charged from the centroid control circuit 8, and at the same time, the second electrode 6*b* is positively charged, the charged particles 42*b* in the recessed part 4*a* move toward the second electrode 6*b*, and the centroid of the assembly of the charged particles 42*b* moves toward the cantilever 3.

As described above, by adjusting the position of the centroid of the weight part 4, it is possible to adjust the resonance frequency of the cantilever 3, and optimum power is output from the piezoelectric cell 10 according to the vibration of the device to which the piezoelectric generator 41 is attached.

As the gas in the space in the recessed part 4*a* of the weight part 4, for example, air or inactive gas such as argon may be used. For example, the pressure inside the recessed part 4*a* may be reduced.

Furthermore, an AC voltage may be applied to the first electrode 6*a* and the second electrode 6*b*, and the crest value of the AC voltage may be gradually attenuated with the passage of time similar to FIG. 3A, so that the charged particles 42*b* move to substantially the center. Furthermore, as illustrated in FIGS. 10A, 10B, and 11, the movement of the charged particles 42*b* may be adjusted by controlling the voltage applied to the first, second, and third electrodes 6*a*, 6*b*, and 6*c*.

Fourth Embodiment

Figure 17A:
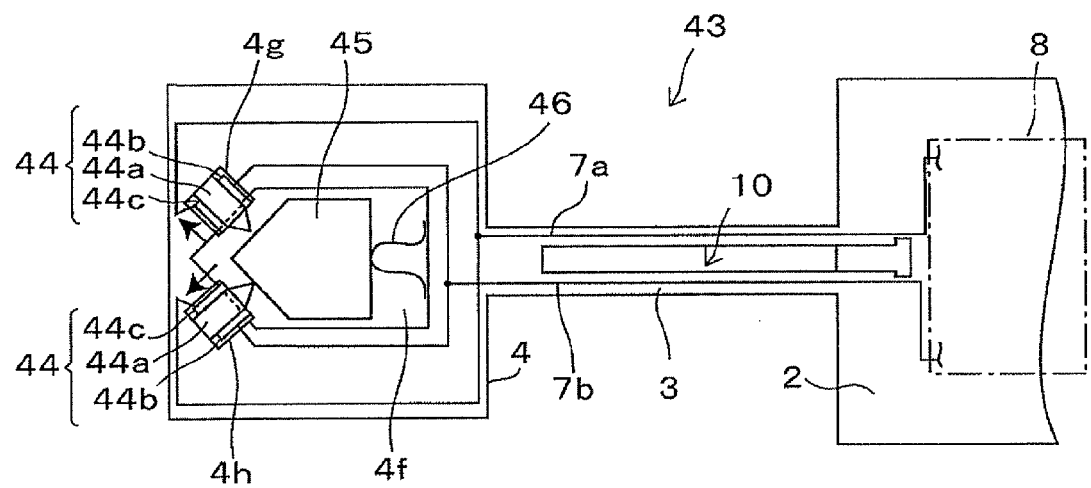
FIGS. 17A and 17B are plan views illustrating different centroid positions of a weight part of a piezoelectric generator according to a fourth embodiment.

FIG. 17A is a plan view of a piezoelectric generator according to a fourth embodiment. The same elements as those of FIG. 1A are denoted by the same reference numerals.

In FIG. 17A, a piezoelectric generator 43 includes the fixing part 2, the cantilever 3, the weight part 4, the first lead wiring 7*a*, the second lead wiring 7*b*, and the centroid control circuit 8, similar to the first embodiment. Furthermore, on the fixing part 2, the first and second field-effect transistors 8*a* and 8*b* of the centroid control circuit 8 illustrated in FIG. 2A are connected to the first lead wiring 7*a*, and the third and fourth field-effect transistors 8*c* and 8*d* of the centroid control circuit 8 are connected to the second lead wiring 7*b*.

In substantially the center of the weight part 4, a recessed part 4*f* shaped as a pentagonal prism is formed. Actuator-accommodating recessed parts 4*g* and 4*h* are respectively formed on the two side surfaces intersecting at a position closest to the front edge of the weight part 4, among the surfaces of the recessed part 4*f* shaped as a pentagonal prism.

In each of the actuator accommodating recessed parts 4*g* and 4*h*, a piezoelectric micro actuator 44 is attached. The piezoelectric micro actuator 44 includes a piezoelectric body 44*a* and electrodes 44*b* and 44*c* formed one on either side of the piezoelectric body 44*a*. The piezoelectric body 44*a* is configured to protrude into the recessed part 4*c* by a horizontal piezoelectric effect. The piezoelectric body 44*a* is formed of any one of the piezoelectric materials used for the piezoelectric film 12 indicated in the first embodiment.

In the pair of electrodes 44*b* and 44*c* of each of the two piezoelectric micro actuators 44, one electrode 44*b* is connected to the first lead wiring 7*a* and the other electrode 44*c* is connected to the second lead wiring 7*b*.

Furthermore, a centroid moving body 45 shaped substantially as a pentagonal prism is placed in the recessed part 4*c*. The centroid moving body 45 is made of a material having a large mass such as lead, and is movable at least in the longitudinal direction of the cantilever 3. The movement distance of the centroid moving body 45 is not particularly limited, for example, 200 μm through 300 μm.

In the centroid moving body 45, the two side surfaces intersecting at a position closest to the front edge of the weight part 4 act as contact surfaces contacting the front ends of the piezoelectric bodies 44*a* of the piezoelectric micro actuators 44. The two side surfaces contacting the piezoelectric micro actuators 44 intersect at an angle of, for example, 90 degrees, and two other surfaces adjacent to these side surfaces are parallel to each other.

Furthermore, between the back edge surface of the centroid moving body 45 and the inner surface of the recessed part 4*c*, there is provided a spring mechanism 46 that biases the centroid moving body 45 toward the front edge of the weight part 4. In the present embodiment, a plate spring that is curved to have a protruding shape is used as the spring mechanism 46; however, other elastic bodies may be used, such as a spring and elastic rubber. The plate spring may be made of a material such as metal or resin such as acrylic.

When a spring is used as the spring mechanism 46, the spring may be made of, for example, a nickel alloy such as carbon, iron, and silicon (e.g., product name: INCONEL: X-750), or an alloy including carbon, silicon, and manganese as the main components (e.g., product name: SUP10).

The top edges of the recessed part 4*f* and the actuator accommodating recessed parts 4*g* and 4*h* are covered by a cover plate (not illustrated). For example, the cover plate may be made of an insulating material such as ceramic and glass.

In the piezoelectric generator 43 described above, the centroid control circuit 8 applies a DC voltage to the pair of electrodes 44*b* and 44*c*, so that the piezoelectric body 44*a* of the piezoelectric micro actuator 44 is withdrawn. Accordingly, as illustrated in FIG. 17A, the centroid moving body 45 moves toward the front edge of the weight part 4 due to the biasing force of the spring mechanism 46, and the centroid of the weight part 4 moves toward the front edge of the weight part 4.

Figure 17B:
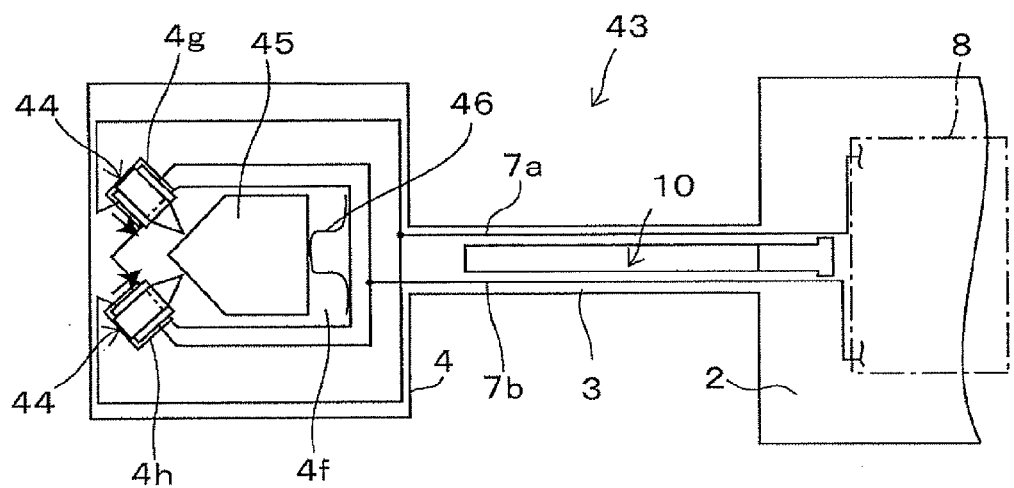

Meanwhile, the centroid control circuit 8 applies, to the pair of electrodes 44*b* and 44*c*, a voltage, which has a polarity opposite to the above, by which the front end of the piezoelectric micro actuator 44 moves forward. Accordingly, as illustrated in FIG. 17B, the centroid moving body 45 moves against the biasing force of the spring mechanism 46 in the recessed part 4*f*, and the centroid of the weight part 4 moves toward the cantilever 3.

Incidentally, in order to maintain the position of the centroid moving body 45 after the movement, the spring mechanism 46 may be made of a shape-memory alloy. In this case, the back edge of the spring mechanism 46 is connected to the inner surface of the recessed part 4*f*, and the front edge of the spring mechanism 46 is connected to the back edge of the centroid moving body 45. As the shape-memory alloy, for example, a copper-zinc-aluminum alloy, a copper-aluminum-nickel alloy, and a nickel-titanium alloy may be used. Accordingly, even when application of voltage on the piezoelectric micro actuators 44 is stopped, the centroid is prevented from moving.

According to the above centroid adjustment part of the piezoelectric generator 43, the movable centroid moving body 45 is provided in the recessed part 4*f* of the weight part 4 for adjusting the centroid, and the position of the centroid moving body 45 is adjusted by the spring mechanism 46 and the piezoelectric micro actuators 44.

Accordingly, by controlling the centroid position of the weight part 4, the resonance frequency of the cantilever 4 is adjusted, and therefore the power generation efficiency of the piezoelectric cell 10 on the cantilever 3 is increased.

Fifth Embodiment

Figure 18A:
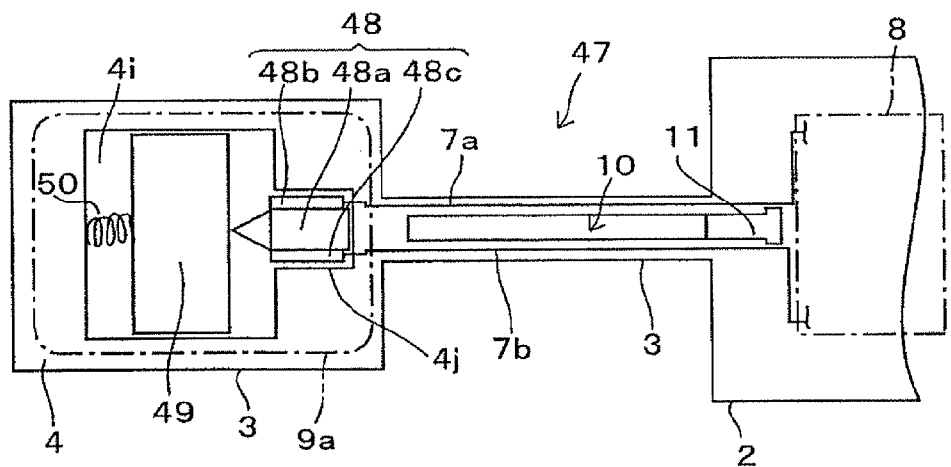
FIGS. 18A, 18B, and 18C are plan views illustrating different centroid positions of a weight part of a piezoelectric generator according to a fifth embodiment.

FIG. 18A is a plan view of a piezoelectric generator according to a fifth embodiment. The same elements as those of FIG. 1A are denoted by the same reference numerals.

In FIG. 18A, a piezoelectric generator 47 includes the fixing part 2, the cantilever 3, the weight part 4, the first lead wiring 7*a*, the second lead wiring 7*b*, and the centroid control circuit 8, similar to the first embodiment. Furthermore, on the fixing part 2, the centroid control circuit 8 is connected to the first lead wiring 7*a* and the second lead wiring 7*b*.

In substantially the center of the weight part 4, a recessed part 4*i* shaped as a square pillar is formed. An actuator accommodating recessed part 4*j* is formed at the back part of the recessed part 4*i* shaped as a square pillar in the weight part 4.

A piezoelectric micro actuator 48 is attached in the actuator accommodating recessed part 4*j*. The piezoelectric micro actuator 48 includes a piezoelectric body 48*a* and electrodes 48*b* and 48*c* formed one on either side of the piezoelectric body 48*a*. The piezoelectric micro actuator 48 is provided so as to proceed toward and recede from the recessed part 4*c* by a horizontal piezoelectric effect. As the piezoelectric body 48*a*, any one of the piezoelectric materials applied to the piezoelectric film 12 described in the first embodiment is used.

One electrode 48*b* of the piezoelectric micro actuator 48 is connected to the first lead wiring 7*a*, and the other electrode 48*c* is connected to the second lead wiring 7*b*.

In the recessed part 4*i*, a centroid moving body 49 that is slidable in the longitudinal direction of the cantilever 3 is accommodated. The centroid moving body 49 is made of a material having a large mass such as lead. The movement distance of the centroid moving body 49 is not particularly limited, for example, 200 μm through 300 μm.

A shape-memory spring 50 is attached between the front edge of the centroid moving body 49 and the inner surface of the recessed part 4*i*, and the front end and the back end of the shape-memory spring 50 are respectively connected to the inner surface of the recessed part 4*i* and the front edge of the centroid moving body 49.

The shape-memory spring 50 is formed of a material that returns to its original shape when the strain is reduced according to the transformation temperature $T_1$. Examples of such a material include a copper-zinc-aluminum alloy, a copper-aluminum-nickel alloy, and a nickel-titanium alloy.

The top of the recessed part 4*i* and the actuator accommodating recessed part 4*j* are covered by a cover plate 9*a*. For example, the cover plate may 9*a* be made of an insulating material such as ceramic and glass.

Figure 18B:
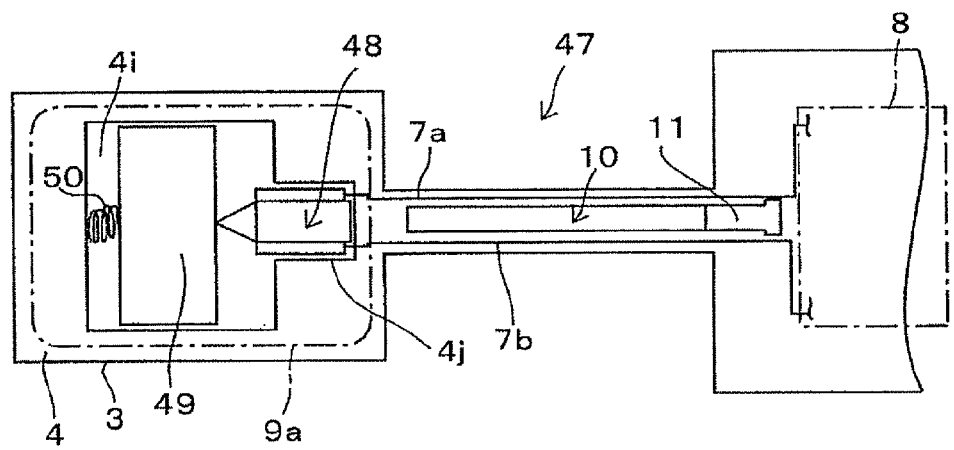

In the piezoelectric generator 47 described above, in the state illustrated in FIG. 18A, a voltage is applied to the pair of electrodes 48*b* and 48*c* of the piezoelectric micro actuator 48 from the centroid control circuit 8. Accordingly, as illustrated in FIG. 18B, the front end of the piezoelectric body 48*a* of the piezoelectric micro actuator 48 moves toward the front edge of the recessed part 4*i*.

The centroid moving body 49 is pushed and moved by the movement of the piezoelectric micro actuator 48. Furthermore, the shape-memory spring 50 contracts by being pushed by the centroid moving body 49. According to the movement of the centroid moving body 49, the centroid in the recessed part 4*i* moves toward the front edge of the weight part 4.

The movement distance of the centroid moving body 49 is adjusted by controlling the voltage applied to the pair of electrodes 48*b* and 48*c* of the piezoelectric micro actuator 48. Thus, it is possible to adjust the position of the centroid moving body 49 in a single step by adjusting the voltage applied to the piezoelectric micro actuator 48.

Figure 18C:
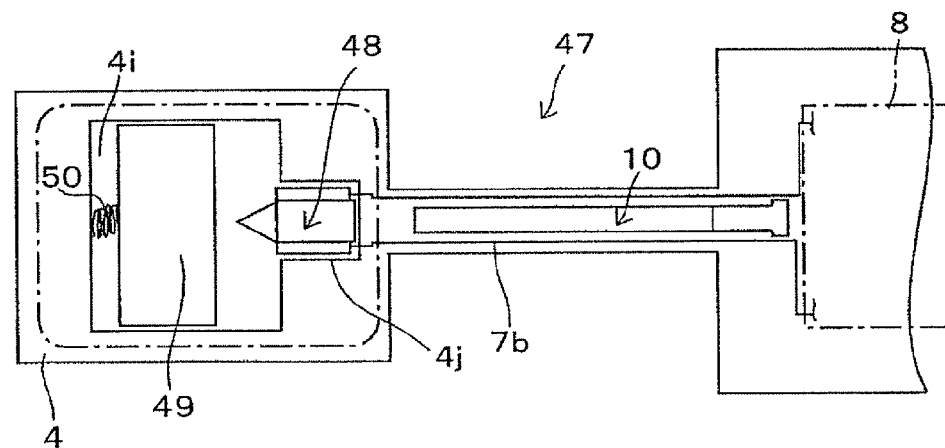

The deformed shape of the shape-memory spring 50 is maintained until heating to a temperature greater than or equal to a transformation temperature $T_1$ is applied to the shape-memory spring 50. Accordingly, as illustrated in FIG. 18C, even when application of voltage from the centroid control circuit 8 to the piezoelectric micro actuator 48 is stopped, the centroid moving body 49 maintains its state.

Meanwhile, to readjust the position of the centroid moving body 49 in a state where there is a gap between the centroid moving body 49 and the piezoelectric micro actuator 48, and the shape-memory spring 50 is contracted, the shape-memory spring 50 is heated to the temperature T that is greater than or equal to the transformation temperature $T_1$.

Accordingly, as illustrated in FIG. 18A, the strain of the shape-memory spring 50 is released and the elasticity of the shape-memory spring 50 increases. Therefore, the shape-memory spring 50 moves the centroid moving body 49 toward the cantilever 3 by the elasticity of the shape-memory spring 50. As a result, the centroid of the weight part 4 moves toward the cantilever 3.

After heating the shape-memory spring 50 and adjusting the position of the centroid moving body 49, the application of heat on the shape-memory spring 50 is stopped, and the temperature is reduced to room temperature. Accordingly, even if the application of voltage from the centroid control circuit 8 to the piezoelectric micro actuator 48 is stopped, the position of the centroid moving body 49 is maintained.

As described above, the moveable centroid moving body 49 is provided in the recessed part 4i of the weight part 4, and the position of the centroid moving body 49 is adjusted by the shape-memory spring 50 and the piezoelectric micro actuator 48. By controlling the position of the centroid as described above, the resonance frequency of the cantilever 3 is adjusted, and therefore the power generation efficiency of the piezoelectric cell 10 on the cantilever 3 is increased.

Sixth Embodiment

Figure 19A:
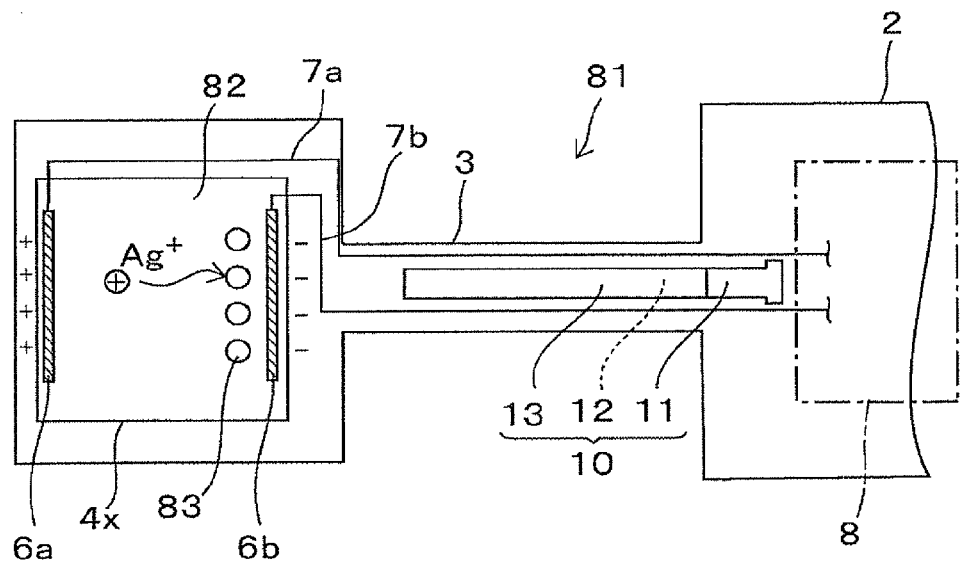
FIGS. 19A and 19B are plan views illustrating different centroid positions of a weight part of a piezoelectric generator according to a sixth embodiment.

FIG. 19A is a plan view of a piezoelectric generator according to a sixth embodiment. The same elements as those of FIG. 1A are denoted by the same reference numerals.

In FIG. 19A, a piezoelectric generator 81 includes the fixing part 2, the cantilever 3, the weight part 4, the first electrode 6a, the second electrode 6b, the first lead wiring 7a, the second lead wiring 7b, and the centroid control circuit 8, similar to the first embodiment.

In the weight part 4, a hollow space 4x shaped as a square pillar is formed. In the hollow space 4x, the first electrode 6a, the second electrode 6b, and an electrolytic solution 82 are provided as a centroid adjustment part. The first lead wiring 7a and the second lead wiring 7b are connected to the centroid control circuit 8 placed on the weight part 4 at the root of the cantilever 3, similar to the first embodiment.

The first electrode 6a is formed with, for example, silver (Ag), and is attached to the inner surface close to the front edge of the weight part 4, and is connected to the first lead wiring 7a. The second electrode 6b is formed with, for example, indium tin oxide (ITO), and is attached to the inner surface close to the cantilever 3, and is connected to the second lead wiring 7b. The second electrode 6b is spaced away from the first electrode 6a.

The electrolytic solution 82 preferably includes heavy metal such as iron, lead, gold, silver, and copper. As the electrolytic solution 82, for example, a liquid in which silver halide is dissolved together with a supporting electrolyte including halogen is used, and the liquid is encapsulated in the hollow space 4x. Examples of the silver halide are silver fluoride (AgF), silver chloride (AgCl), silver bromide (AgBr), and silver iodide (AgI). It is possible to use a liquid in which a metal such as gold, platinum, and lithium is dissolved, instead of dissolving silver.

Examples of the supporting electrolyte including halogen for dissolving the silver halide are ammonium iodide, ammonium tetraethyl iodide, potassium iodide, potassium bromide, potassium chloride, sodium iodide, sodium bromide, sodium chloride, lithium iodide, lithium bromide, and lithium chloride.

Other examples of the supporting electrolyte are tetrabutylammonium perchlorate, tetraethylammonium perchlorate, ammonium isocyanate, sodium sulfide, perchlorate, thiocyanate, and sulfate. Furthermore, examples of a solvent for dissolving the silver halide are N,N-dimethylformamide (DMF) and dimethylsulfoxide (DMSO).

In the piezoelectric generator 81 as described above, as illustrated in FIG. 19A, a voltage is applied between the first electrode 6a and the second electrode 6b from the centroid control circuit 8, so that the first electrode 6a is positively charged and the second electrode 6b is negatively charged. Accordingly, silver 83 included in the first electrode 6a is positively ionized and is dissolved in the electrolytic solution 82, and moves to the second electrode 6b to obtain electrons, and is deposited on the second electrode 6b. That is to say, the second electrode 6b becomes plated with silver.

Accordingly, part of the mass of the first electrode 6a shifts to the surface of the second electrode 6b, and therefore, the centroid of the weight part 4 moves toward the cantilever 3. As a result, the resonance frequency of the cantilever 3 and the weight part 4 changes.

Figure 19B:
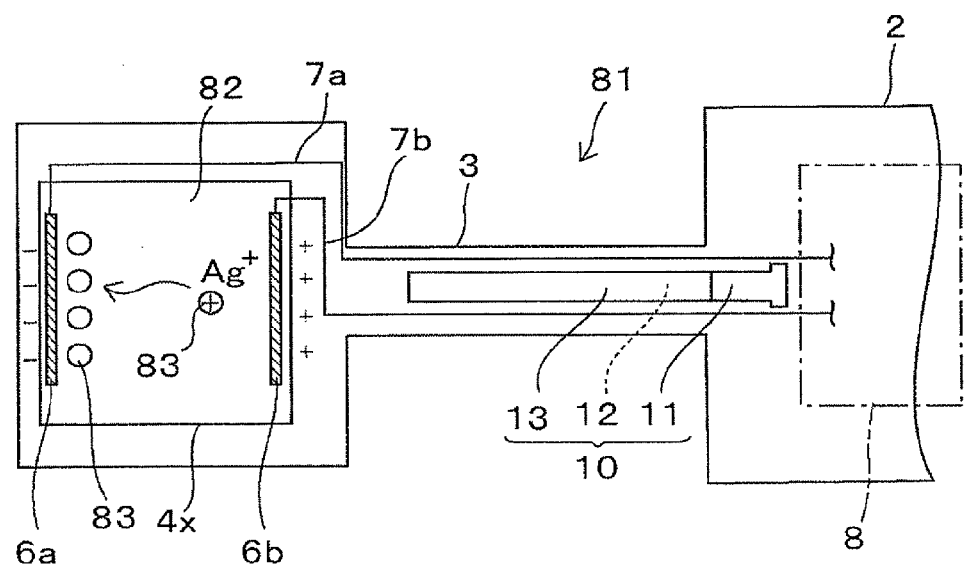

Meanwhile, as illustrated in FIG. 19B, when the second electrode 6b is positively charged and the first electrode 6a is negatively charged by the centroid control circuit 8, the silver 83 that has been deposited on the second electrode 6b positively ionizes, and dissolves in the electrolytic solution 82 again, and returns to the first electrode 6a. Accordingly, the centroid of the weight part 4 moves toward the front edge of the weight part 4, and the resonance frequency of the cantilever 3 and the weight part 4 changes. The voltage applied to the first electrode 6a and the second electrode 6b may not be pulses.

According to the above-described centroid adjustment part of the piezoelectric generator 81, the electrolytic deposition/dissolution in the electrolytic solution 82 in the hollow space 4x is performed in a state where voltage is applied between the first electrode 6a and the second electrode 6b. Furthermore, even if the application of voltage onto the first electrode 6a and the second electrode 6b is subsequently stopped, the deposition and dissolution of silver 83 do not change, and the centroid of the weight part 4 is maintained at the position before the voltage is stopped.

It is possible to control the deposition of metal such as silver with significantly high precision, and to change the deposition by a single step.

Seventh Embodiment

Figure 20A:
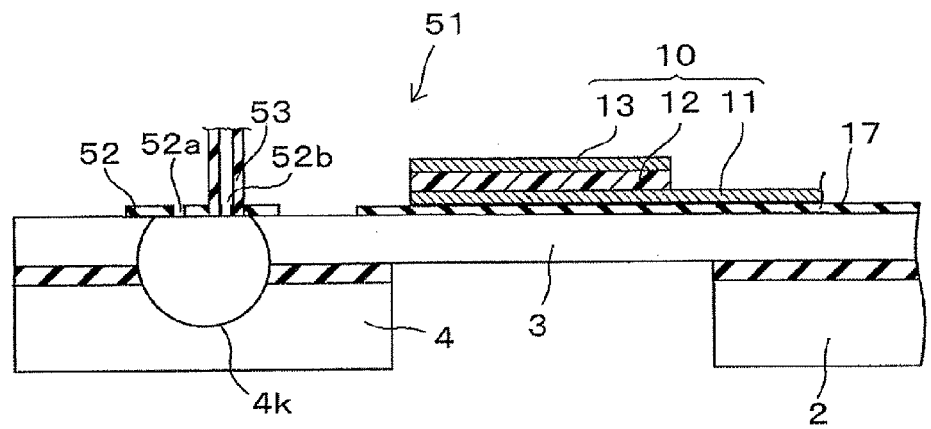
FIG. 20A is a cross-sectional view of a piezoelectric generator according to a seventh embodiment.

FIG. 20A is a plan view of a piezoelectric generator according to a seventh embodiment. The same elements as those of FIG. 1A are denoted by the same reference numerals.

In FIG. 20A, a piezoelectric generator 51 includes a substrate on which the fixing part 2, the cantilever 3, and the weight part 4 are formed, similar to the first embodiment.

In substantially the center of the weight part 4, a hollow space 4k to be filled with a centroid adjustment material is formed. The hollow space 4k is formed to have a substantially spherical shape or a substantially hemispherical shape. The top of the hollow space 4k is covered by a lid 52 having an air hole 52a and a material injection hole 52b. A material supply tube 53 is connected to the material injection hole 53b. The hollow space 4k has a diameter of, for example, approximately 900 μm.

In the hollow space 4k, for example, resin is injected as a centroid adjustment material 54 from outside through the material supply tube 53, and the centroid of the whole weight part 4 is controlled by adjusting the injection amount. As the resin material, for example, a thermosetting resin such as epoxy is injected in the hollow space 4k, and is subsequently thermally hardened. Incidentally, after supplying the centroid adjustment material 54 in the hollow space 4k, the air hole 52a and the material injection hole 53b of the lid 52 may be blocked with an adhesive.

The centroid adjustment material 54 is used for adjusting the centroid of the weight part 4 by the following method.

For example, when hardening the centroid adjustment material 54 supplied in the hollow space 4k, the front edge of the weight part 4 is maintained at a position lower than the back edge.

Figure 20B:
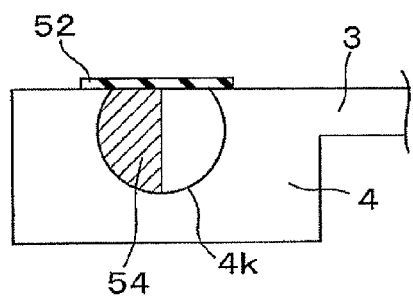
FIGS. 20B, 20C, 20D, and 20E are cross-sectional views illustrating filled states where a filling material is supplied in a recessed part of a weight part of the piezoelectric generator according to the seventh embodiment.

Accordingly, as illustrated in FIG. 20B, the centroid in the hollow space 4k is positioned near the front edge of the weight part 4.

Figure 20C:
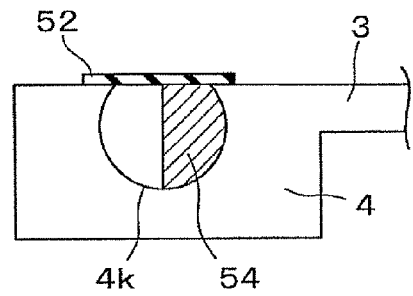
Figure 20D:
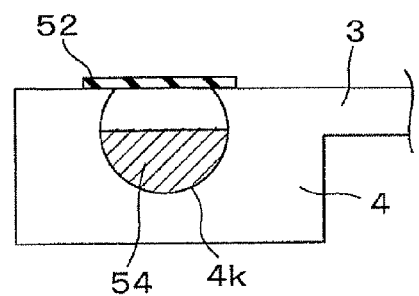

Meanwhile, when the centroid adjustment material 54 is hardened in a state where the front edge of the weight part 4 is at a position higher than the back edge, as illustrated in FIG. 20C, the centroid in the hollow space 4k is positioned near the cantilever 3. Furthermore, when the centroid adjustment material 54 is hardened when the weight part 4 is maintained in a substantially horizontal state, as illustrated in FIG. 20D, the centroid of the weight part 4 is positioned in substantially the center of the hollow space 4k.

Figure 20E:
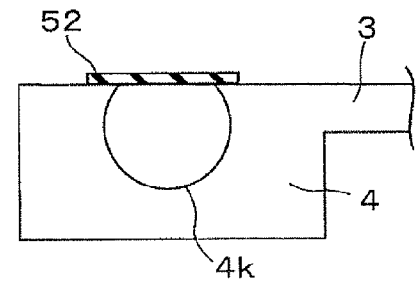

As illustrated in FIG. 20E, the hollow space 4k may be empty.

As described above, in the weight part 4, by adjusting the weight and the position of the centroid adjustment material in the hollow space 4k, the centroid of the weight part 4 is controlled and the resonance frequency of the cantilever 3 changes.

As described above, by controlling the weight and the centroid of the weight part 4, the resonance frequency of the cantilever 3 is adjusted in accordance with the vibration of an external device to which the piezoelectric generator 51 is attached. Therefore, power is generated efficiently from the piezoelectric cell 10 on the cantilever 3.

Furthermore, in the present embodiment, the resonance frequency of the cantilever 3 is changed by changing the weight and the centroid position of the material that is supplied into the hollow space 4k of the weight part 4. Therefore, the centroid control circuit, the lead wirings, and the electrodes described in the other embodiments are not needed.

In the above configuration, as the centroid adjustment material supplied in the hollow space 4k, a material that may not be softened again after being hardened may be used, or a material that may regain fluidity by, for example, heating after being hardened, may be used. Examples of the material that regains fluidity by heating after being hardened are a bismuth-tin alloy and a tin-bismuth-indium alloy, which are used as a soldering material.

Eighth Embodiment

Figure 21A:
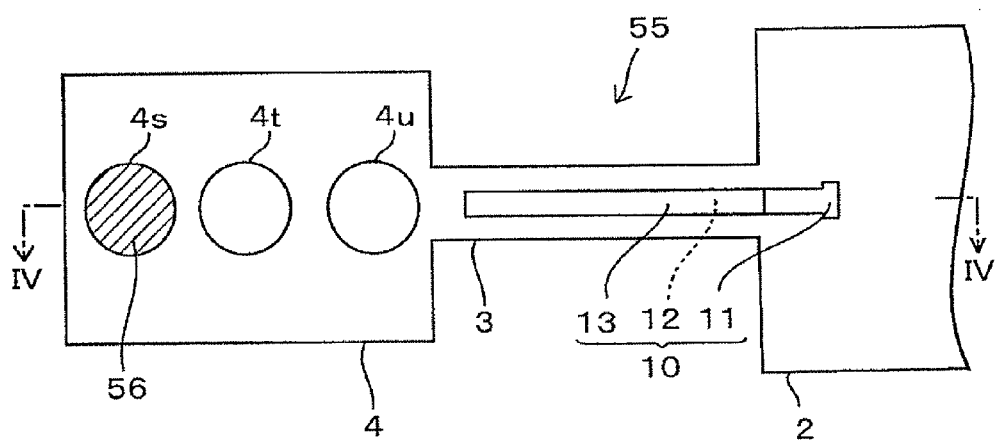
FIG. 21A is a plan view of a piezoelectric generator according to an eighth embodiment.
Figure 21B:
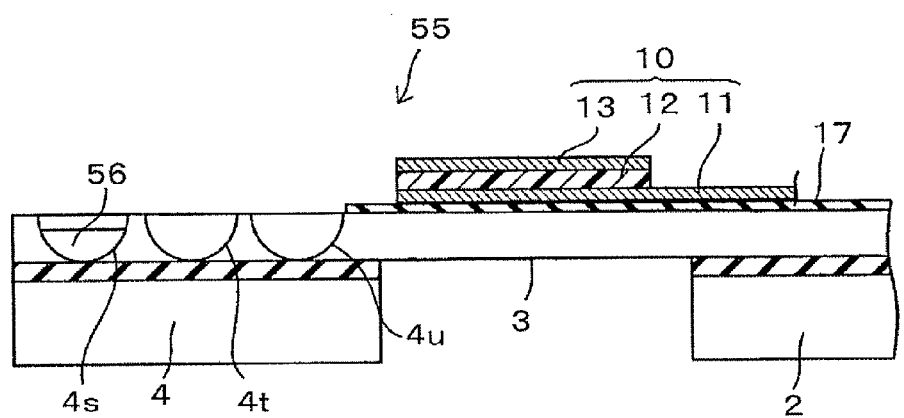
FIG. 21B is a cross-sectional view cut along a line IV-IV of FIG. 21A.

FIGS. 21A and 21B are a plan view and a cross-sectional view of a piezoelectric generator according to an eighth embodiment. The same elements as those of FIGS. 1A and 1B are denoted by the same reference numerals.

In FIGS. 21A and 21B, a piezoelectric generator 55 includes the fixing part 2, the cantilever 3, and the weight part 4, similar to the first embodiment. In the weight part 4, first, second, and third recessed parts 4s, 4t, and 4u are formed with intervals in the longitudinal direction of the cantilever 3. The first, second, and third recessed parts 4s, 4t, and 4u preferably have the same shape, but may have different shapes. An area selected from the first, second, and third recessed parts 4s, 4t, and 4u is filled with a filling material 56.

The filling material 56 is a centroid adjustment material for changing the position of the centroid of the weight part 4, which may be selected from resin or metal. An example of resin is epoxy resin, and an example of metal is lead and lead-tin.

As the filling material 56, a fluid or a half-fluid material may be supplied in the first, second, and third recessed parts 4s, 4t, and 4u, and the material may be hardened. Furthermore, after supplying the fluid or half-fluid material in the first, second, and third recessed parts 4s, 4t, and 4u, the first, second, and third recessed parts 4s, 4t, and 4u may be covered with lids. Furthermore, a solid substance molded to have a shape that fits in the first, second, and third recessed parts 4s, 4t, and 4u may be supplied in the first, second, and third recessed parts 4s, 4t, and 4u.

In FIGS. 21A and 21B, the first, second, and third recessed parts 4s, 4t, and 4u are formed in the weight part 4; however, there may be more than three recessed parts.

When an n number of recessed parts are formed in the weight part 4, one to n recessed parts are selected from the n number of recessed parts, and the selected recessed parts are filled with the filling material 56 to change the weight and the centroid position of the weight part 4. In this case, the number of combinations of the centroid position and the weight of the weight part 4 is an n power of 2, i.e., $2^n$.

Therefore, as illustrated in FIG. 21A, n=3 when the first, second, and third recessed parts 4s, 4t, and 4u are formed in the weight part 4, and therefore the number of combinations of the centroid positions and the weight is eight, as illustrated in FIGS. 22A through 22H.

Figure 22A:
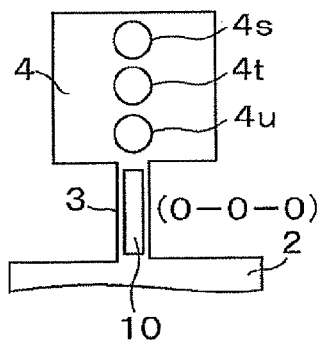
FIGS. 22A through 22H are perspective cross-sectional views indicating vibration states of the cantilever and the weight part according to differences in the centroid of the weight part of the piezoelectric generator according to the eighth embodiment.
Figure 22B:
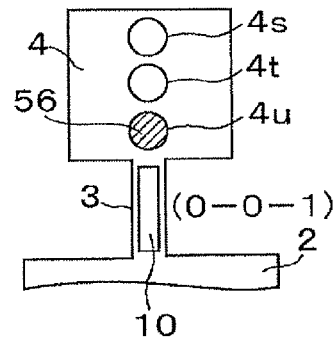
Figure 22C:
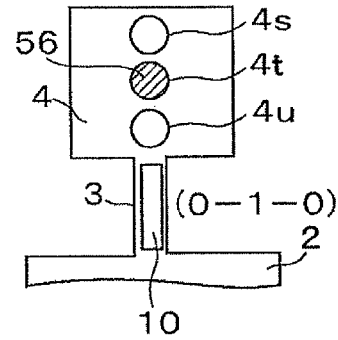
Figure 22D:
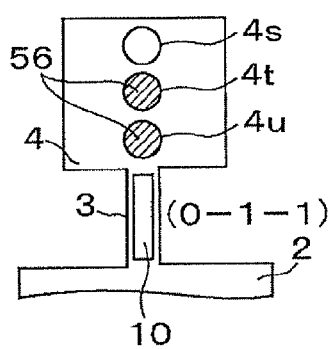
Figure 22E:
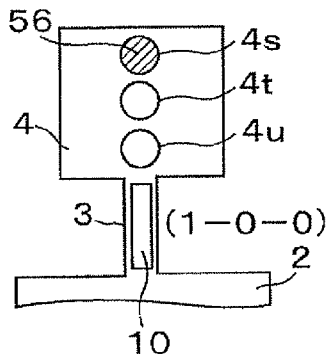
Figure 22F:
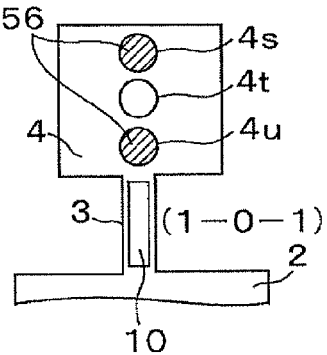
Figure 22G:
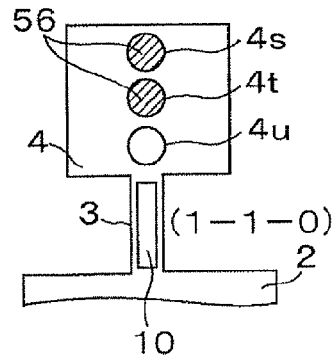
Figure 22H:
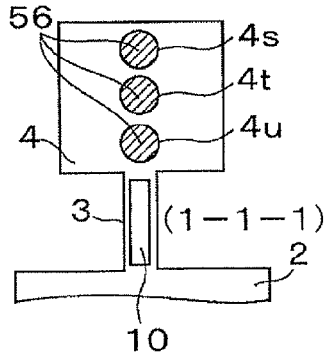
Figure 23:
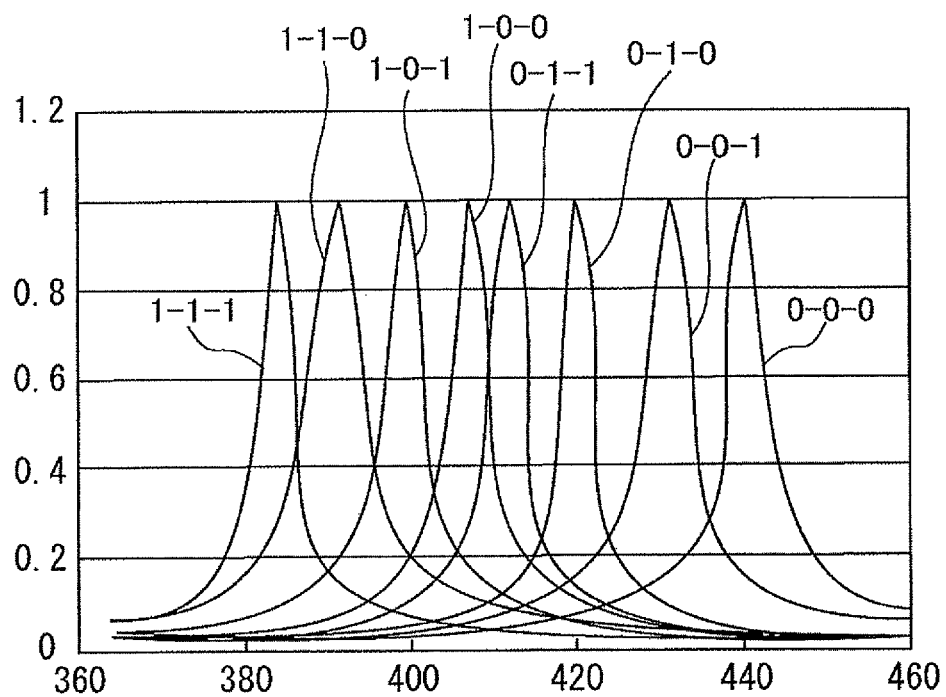
FIG. 23 is a diagram indicating relationships between the resonance frequency and the generated power of a piezoelectric cell in the piezoelectric generators illustrated in FIGS. 22A through 22H.

FIG. 23 illustrates the resonance frequency of the cantilever 3 and the weight part 4 in the states illustrated in FIGS. 22A through 22H.

In FIGS. 22A through 22H and 23, a state where the recessed part is empty is expressed by "0" and a state where the recessed part is filled with the filling material 56 is expressed by "1". Either "0" or "1" is indicated for the first recessed part 4s, the second recessed part 4t, and the third recessed part 4u, in the stated order.

For example, as illustrated in FIG. 22A, when the first recessed part 4s, the second recessed part 4t, and the third recessed part 4u are empty, 0-0-0 is indicated in FIG. 23. Furthermore, as illustrated in FIG. 22B, when the first recessed part 4s and the second recessed part 4t are empty, and the third recessed part 4u is filled with the filling material 56, 0-0-1 is indicated in FIG. 23. Furthermore, as illustrated in FIG. 22H, when the first recessed part 4s, the second recessed part 4t, and the third recessed part 4u are filled with the filling material 56, 1-1-1 is indicated in FIG. 23.

The centroid in FIGS. 22A and 22H is indicated by X-Y coordinates similar to FIG. 4 as follows. The Xc and Yc coordinates of the centroid in FIG. 22A are 0.688 mm and −0.252 mm, respectively. The Xc and Yc coordinates of the centroid in FIG. 22H are 0.750 mm and −0.214 mm, respectively. Accordingly, the difference in the position of the centroid of the weight part 4 is approximately 62 μm in the longitudinal direction of the cantilever 3.

As described above, by selecting whether to fill the first, second, and third recessed parts 4s, 4t, and 4u in the weight part 4 with the filling material 56, the resonance frequency of the cantilever 3 is changed within a range of approximately 384 Hz through 440 Hz. As the weight of the weight part 4 increases, the resonance frequency of the cantilever 3 decreases.

In the calculation indicated in FIG. 23, it is assumed that the cantilever 3 and the weight part 4 are made with silicon, the length and width of the cantilever 3 are 1.5 mm and 1 mm, respectively, and the vertical height and the width of the weight part 4 are 1.5 mm and 1 mm, respectively. Furthermore, the first, second, and third recessed parts 4s, 4t, and 4u are hemispheres having a diameter of 200 μm, and the material to be supplied in the first, second, and third recessed parts 4s, 4t, and 4u is epoxy resin. The epoxy resin is supplied to the first, second, and third recessed parts 4s, 4t, and 4u by using a syringe, for example. Furthermore, the critical damping ratio is 0.2%.

As described above, the resonance frequency of the weight part 4 and the cantilever 3 is adjusted by forming plural recessed parts 4s, 4t, and 4u in the weight part 4, and filling selected recessed parts with the filling material 56. Thus, it is possible to change the resonance frequency of the weight part 4 and the cantilever 3 according to the vibration of the device to which the piezoelectric generator 55 is attached. As a result, power is efficiently generated from the piezoelectric cell 10 on the cantilever 3.

Furthermore, in the present embodiment, by selecting recessed parts from the plural recessed parts 4s, 4t, and 4u of the weight part 4 and filling the selected recessed parts with the filling material 56, the weight and the centroid position of the entire weight part 4 are changed. Therefore, the electric circuit, wirings, and electrodes for changing the resonance described in the other embodiments are not needed.

In FIGS. 21A and 21B, the filling material 56 is selectively filled in the plural recessed parts 4s, 4t, and 4u formed in the weight part 4. However, it is possible to have a structure in which plural areas are formed on the weight part 4, and a centroid adjustment material is provided in areas selected from these areas.

Ninth Embodiment

Figure 24:
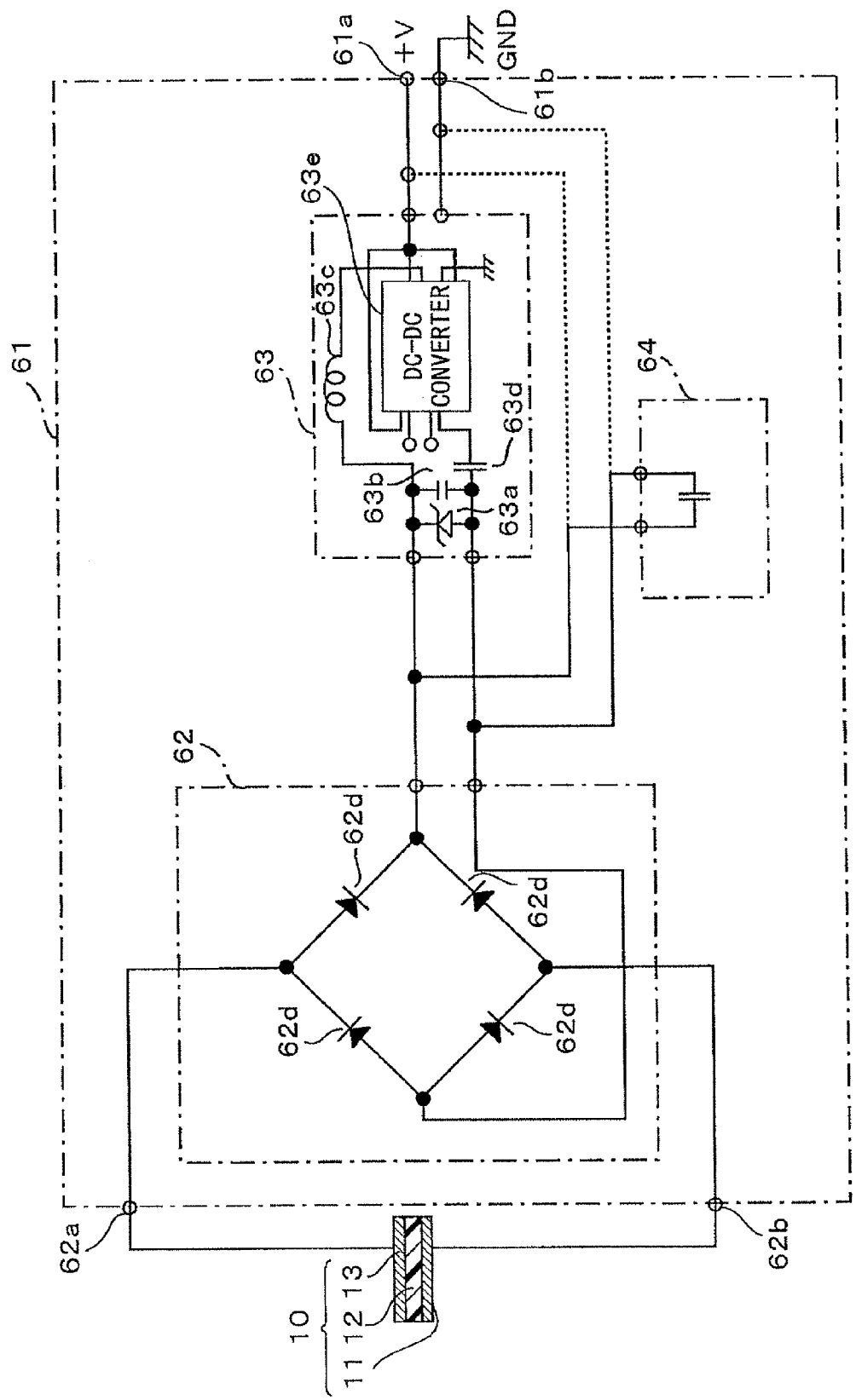
FIG. 24 is a block diagram of a power output circuit which is applied to a piezoelectric generator according to a ninth embodiment.

FIG. 24 is a circuit diagram of a power output circuit according to a ninth embodiment, which is applied to a piezoelectric generator.

In a power output circuit 61 illustrated in FIG. 24, for example, the piezoelectric cell 10 is formed on the cantilever 3 of the piezoelectric generators 1, 30, 41, 43, and 47, and includes the lower electrode 11, the piezoelectric film 12, and the upper electrode 13, similar to the first through sixth embodiments.

The lower electrode 11 and the upper electrode 13 are connected to input terminals 62a and 62b of an AC-DC conversion circuit 62.

As the AC-DC conversion circuit 62, for example, a circuit includes four diodes 62d that are bridge-connected. That is to say, in the AC-DC conversion circuit 62, there are two diodes 62d that are connected in each of two series circuits, and the two series circuits are connected in parallel. The middle connection points of the diodes 62d in the two series circuits are respectively connected to the input terminals 62a and 62b.

The two connection points of the two series circuits of the AC-DC conversion circuit 61 are respectively connected to input terminals of power conditioner 63. A pair of output terminals 61a, 61b of the power conditioner 63 serves as output terminals of the power output circuit 61. For example, the power conditioner 63 includes a zener diode 63a and a first capacitor 63b connected in parallel to output terminals of the AC-DC conversion circuit 62.

The power conditioner 63 includes a coil 63c connected to the positive output terminal of the AC-DC conversion circuit 62, and a second capacitor 63d connected in series to the negative output terminal of the AC-DC conversion circuit 62. Furthermore, the power conditioner 63 includes a DC-DC converter 63e having terminals connected to the coil 63c and the second capacitor 63d. AS the DC-DC converter 63e, for example, MAX 1675 may be used, which is a product of Maxim Integrated Products, Inc.

To the output terminals of either the AC-DC conversion circuit 62 or the power conditioner 63, a capacitor 64 that is a secondary battery is connected in parallel.

In the above power output circuit 61, the AC power that is generated from the piezoelectric cell 10 in accordance with the vibration of the cantilever 3 is converted into DC power by the AC-DC conversion circuit 62. The voltage converted to a DC voltage is made to have a waveform by the power conditioner 63, and is maintained within a preferable voltage range. The capacitor 64 accumulates power transmitted from the AC-DC conversion circuit 62 or the power conditioner 64.

As described above, the power conditioner 63 and the capacitor 64 outputs power having the same voltage to an external device.

The pair of power output terminals 61a, 61b of the power output circuit 61 may be connected to, for example, an electric circuit or an electric device of an external device (not illustrated), and at the same time may be connected to an electric circuit for supplying a pulse voltage of the centroid control circuit 8 described in the first to sixth embodiments. Accordingly, the power output from the power conditioner 63 or the capacitor 64 may not only be consumed by the external device, but may also be fed back and used for driving the centroid control circuit 8.

In the drawings, a symbol GND means ground and a symbol +V means a positive voltage.

Figure 25:
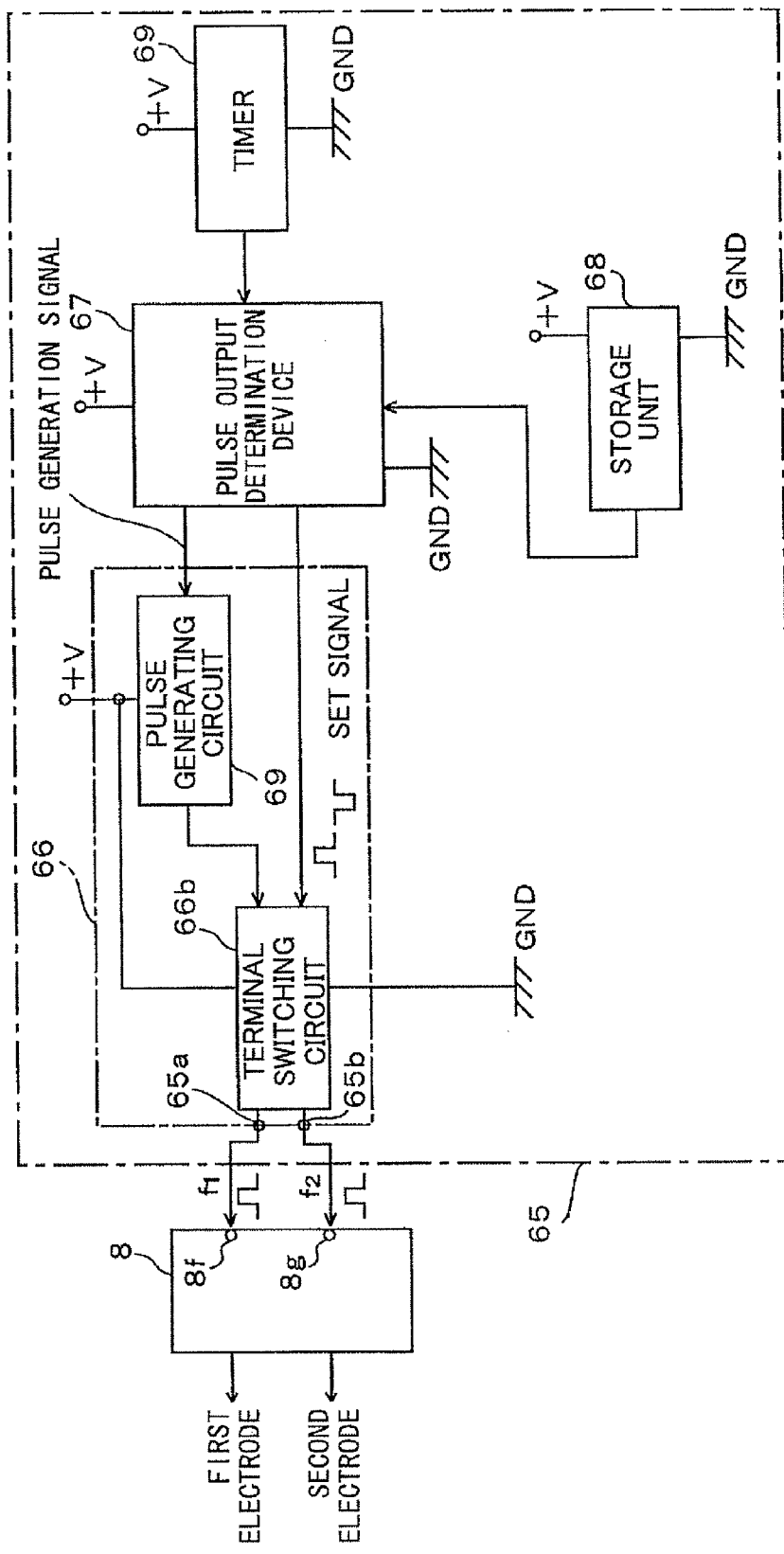
FIG. 25 is a block diagram of a signal transmission device for supplying pulses to a centroid control circuit of the piezoelectric generator according to the ninth embodiment.

Next, with reference to a block diagram of FIG. 25, a description is given of a signal transmission device 65 for supplying a pulse voltage to the first gate terminal 8f and the second gate terminal 8g of the centroid control circuit 8 described in the above embodiments.

The signal transmission device 65 illustrated in FIG. 25 includes a pulse output terminal switching device 66, a pulse output determination device 67, a storage unit 68, and a timer 69.

The pulse output terminal switching device 66 includes a pulse generating circuit 66a and a terminal switching circuit 66b.

The pulse generating circuit 66a outputs a pulse voltage to the centroid control circuit 8 via the terminal switching circuit 66b based on pulse generation signals from the pulse output determination device 67.

The terminal switching circuit 66b is a circuit for determining the transmission destination of pulses output from the pulse generating circuit 66a.

The terminal switching circuit 66b inputs, for example, "1" as a set signal from the pulse output determination device 67, to select an f1 terminal 65a as the terminal from which a pulse voltage is output. Meanwhile, the terminal switching circuit 66b inputs, for example, "0" as a set signal, to select an f2 terminal 65b as the terminal from which a pulse voltage is output.

The f1 terminal 65a is connected to, for example, the first gate terminal 8f of the centroid control circuit 8 illustrated in FIGS. 2A and 2B. Furthermore, the f2 terminal 65b is connected to, for example, the second gate terminal 8g of the centroid control circuit 8 illustrated in FIGS. 2A and 2B.

As the terminal switching circuit 66b, for example, the following circuit is used. That is, an n-type MOS transistor is connected in series between the pulse generating circuit 66a and the f1 terminal 65a, and a p-type MOS transistor is connected in series between the pulse generating circuit 66a and the f2 terminal 65b.

The n-type MOS transistor is turned on when a $+V_0$ voltage is applied as the set signal "1" to the respective gates of the p-MOS transistor and the n-MOS transistor. Furthermore, the p-type MOS transistor is turned on when a $-V_0$ voltage is applied as the set signal "0" to the respective gates of the p-MOS transistor and the n-MOS transistor.

Furthermore, the pulse output determination device 67 outputs, to the pulse output terminal switching device 66, a set signal and a pulse generation signal according to a program stored in the storage unit 68. The pulse output determination device 67 includes a CPU, and inputs a time measured by the timer 69, and executes the process of a flowchart illustrated in FIG. 26 according to the program.

Figure 26:
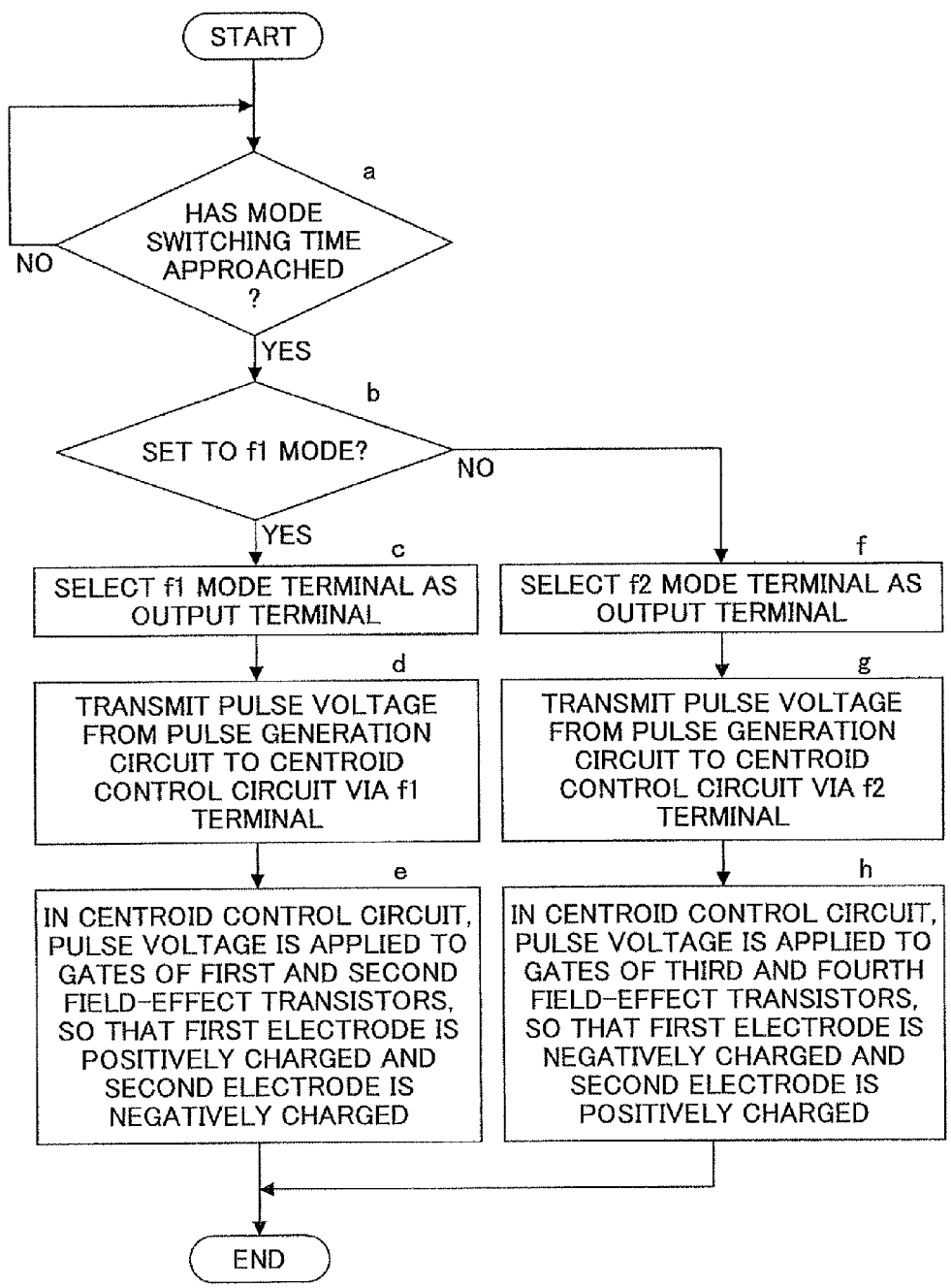
FIG. 26 is a flowchart of procedures for supplying pulses to the centroid control circuit of the piezoelectric generator according to the ninth embodiment.

As indicated in "a" of FIG. 26, the pulse output determination device 67 determines whether the time measured by the timer 69 has reached the mode switching time set in advance. When the mode switching time has approached, as indicated in "b" of FIG. 26, the pulse output determination device 67 determines whether the mode switching time is for switching to either an f1 mode or an f2 mode. The f1 mode is, for example, the time to position the centroid of the weight part 4 near the cantilever 3. The f2 mode is, for example, the time to position the centroid of the weight part 4 near the front edge of the weight part 4.

The time for selecting the f1 mode and the f2 mode is set based on information in which the frequency statistically changes, for example, information of the environment in which the piezoelectric generator 1 according to the first embodiment is set, such as the location and the season, and the set time is stored in the storage unit 68.

For example, the piezoelectric generator 1 is attached to a device whose output and resonance frequency are low at night time and whose output and resonance frequency are high in the day time, and which is operated based on a fixed schedule every day. In this case, the resonance frequency of the cantilever 3 and the weight part 4 is switched according to the time of the fixed schedule. An example of such a device is a turbine provided in a thermal power station or a large-scale facility.

When the mode switching time is for switching to the f1 mode, the pulse output determination device 67 sends, to the pulse output terminal switching device 66, a set signal "1" and a pulse generation signal. Accordingly, as indicated in "c" of FIG. 26, the terminal switching circuit 66b selects the f1 terminal 65a as the pulse output terminal.

As a result, as indicated in "d" and "e" of FIG. 26, a pulse voltage is output from the pulse generating circuit 66a, and is output to the gates of the first and second field-effect transistors 8a and 8b of the centroid control circuit 8 illustrated in FIG. 2A via the f1 terminal 65a and the first gate terminal 8f. Accordingly, the first electrode 6a is negatively charged and the second electrode 6b is positively charged, and therefore in FIG. 2A, the centroid of the weight part 4 moves toward the cantilever 3.

Meanwhile, when the mode switching time is for switching to the f2 mode, the pulse output determination device 67 sends, to the pulse output terminal switching device 66, a set signal "0" and a pulse generation signal. Accordingly, as indicated "f" of FIG. 26, the terminal switching circuit 66b selects the f2 terminal 65b as the pulse output terminal.

As a result, as indicated in "g" and "h" of FIG. 26, a pulse voltage is output from the pulse generating circuit 66a, and is output to the gates of the third and fourth field-effect transistors 8c and 8d of the centroid control circuit 8 via the f2 terminal 65b and the second gate terminal 8g. Accordingly, as illustrated in FIG. 2B, the first electrode 6a is positively charged and the second electrode 6b is negatively charged, and therefore the centroid of the weight part 4 moves toward the front edge of the weight part 4.

According to the above, the resonance frequency of the weight part 4 and the cantilever 3 is changed, and the centroid of the weight part 4 is maintained until the next mode switching time.

The power consumed at the signal transmission device 65 is, for example, supplied from the capacitor 64 illustrated in FIG. 24. Furthermore, at least one of the power output circuit 61 and the signal transmission device 65 may be incorporated in, for example, the fixing part 2 illustrated in FIGS. 1A and 1B, as part of the piezoelectric generator.

Tenth Embodiment

Figure 27:
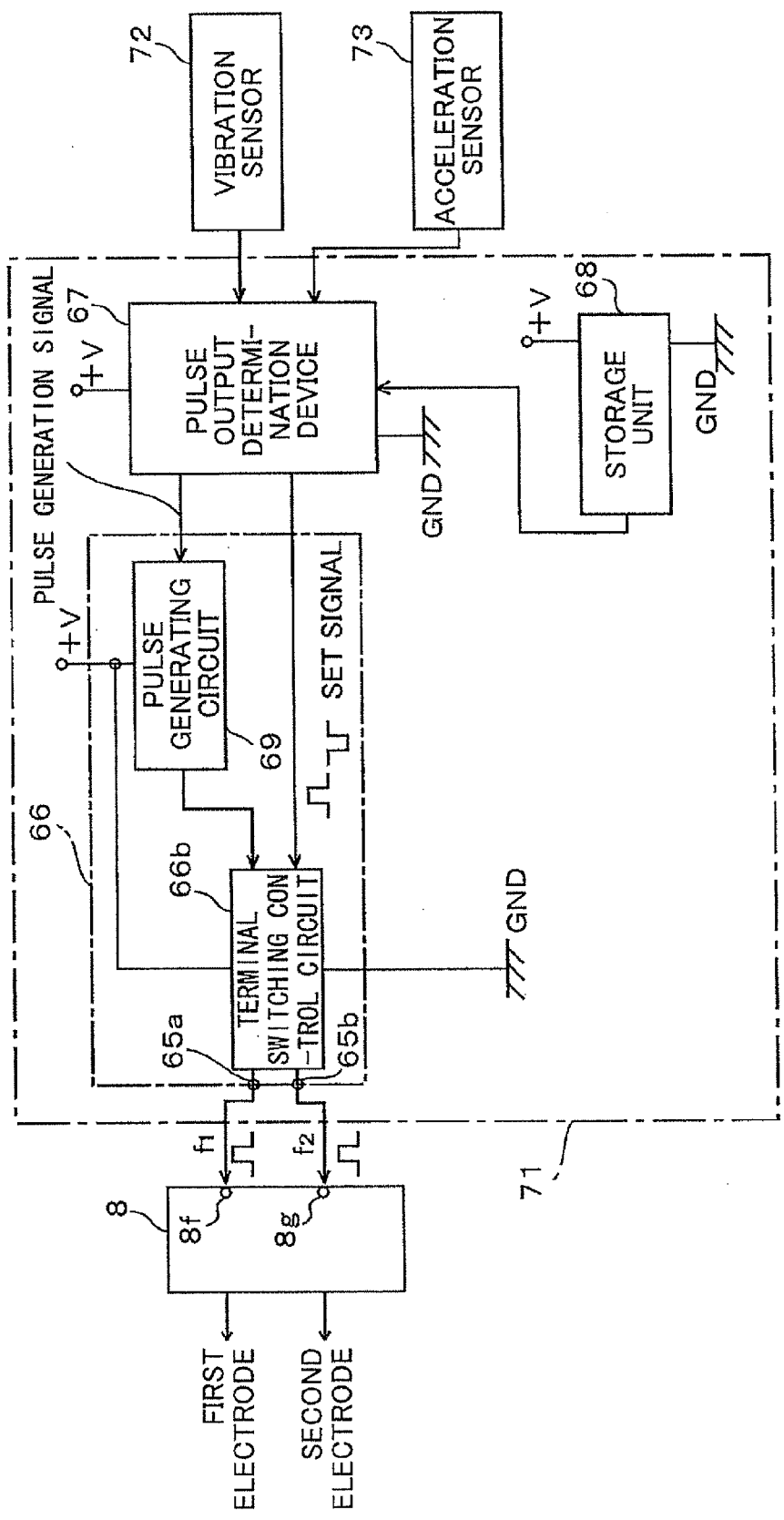
FIG. 27 is a block diagram of a signal transmission device for supplying pulses to a centroid control circuit of a piezoelectric generator according to a tenth embodiment.

FIG. 27 is a block diagram of a signal transmission device for controlling a piezoelectric generator according to a tenth embodiment. In FIG. 27, the same elements as those of FIG. 25 are denoted by the same reference numerals.

A signal transmission device 71 illustrated in FIG. 27 includes the pulse output terminal switching device 66, the pulse output determination device 67, and the storage unit 68. Some of the input terminals of the pulse output determination device 67 are connected to the output terminals of a vibration sensor 72 and an acceleration sensor 73.

The vibration sensor 72 and the acceleration sensor 73 may be attached inside the piezoelectric generator or outside the piezoelectric generator. The pulse output terminal switching device 66 is connected to the centroid control circuit 8 described in any one of the first through sixth embodiments.

The pulse output terminal switching device 66 includes the pulse generating circuit 66a and the terminal switching circuit 66b.

Similar to the ninth embodiment, the pulse generating circuit 66a outputs a pulse voltage to the terminal switching circuit 66b according to input of pulse generation signals from the pulse output determination device 67.

Furthermore, similar to the ninth embodiment, the terminal switching circuit 66b inputs, for example, "1" as a set signal from the pulse output determination device 67, to select the f1 terminal 65a as the terminal from which a pulse voltage is output. Meanwhile, the terminal switching circuit 66b inputs, for example, "0" as a set signal, to select the f2 terminal 65b as the terminal from which a pulse voltage is output.

The f1 terminal 65a is connected to the first gate terminal 8f of the centroid control circuit 8, and the f2 terminal 65b is connected to the second gate terminal 8g of the centroid control circuit 8.

Similar to the ninth embodiment, the pulse output determination device 67 outputs, to the pulse output terminal switching device 66, a set signal and a pulse output signal according to a program stored in the storage unit 68. The pulse output determination device 67 includes a CPU, and inputs detection results of the vibration sensor 72 and the acceleration sensor 73, and selects the f1 mode or the f2 mode based on the relationship between the detection results and the vibration frequency, the acceleration rate, and the resonance frequency stored in advance in the program in a storage device.

Figure 28:
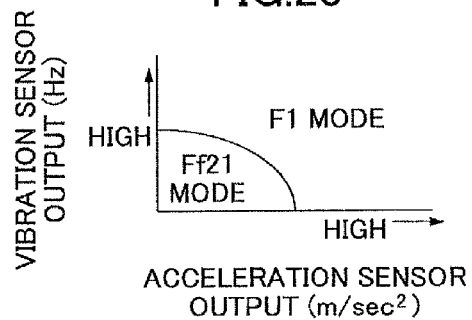
FIG. 28 is a characteristic diagram indicating a centroid position of a weight part at a front end of a cantilever of the piezoelectric generator according to the tenth embodiment according to the relationship between the external acceleration and the external vibration frequency.

The pulse output determination device 67 associates the acceleration rate and the vibration frequency with the f1 mode and the f2 mode, and stores these relationships as data in the storage unit 68. For example, as illustrated in FIG. 28, the horizontal axis expresses the acceleration rate, the vertical axis expresses the vibration frequency, and these relationships are stored in the storage unit 68 so that the f1 mode or the f2 mode is selected based on data measured in advance.

Next, a method of supplying a pulse voltage to the centroid control circuit 8 by the signal transmission device 71 is described with reference to the flowchart of FIG. 29.

Figure 29:
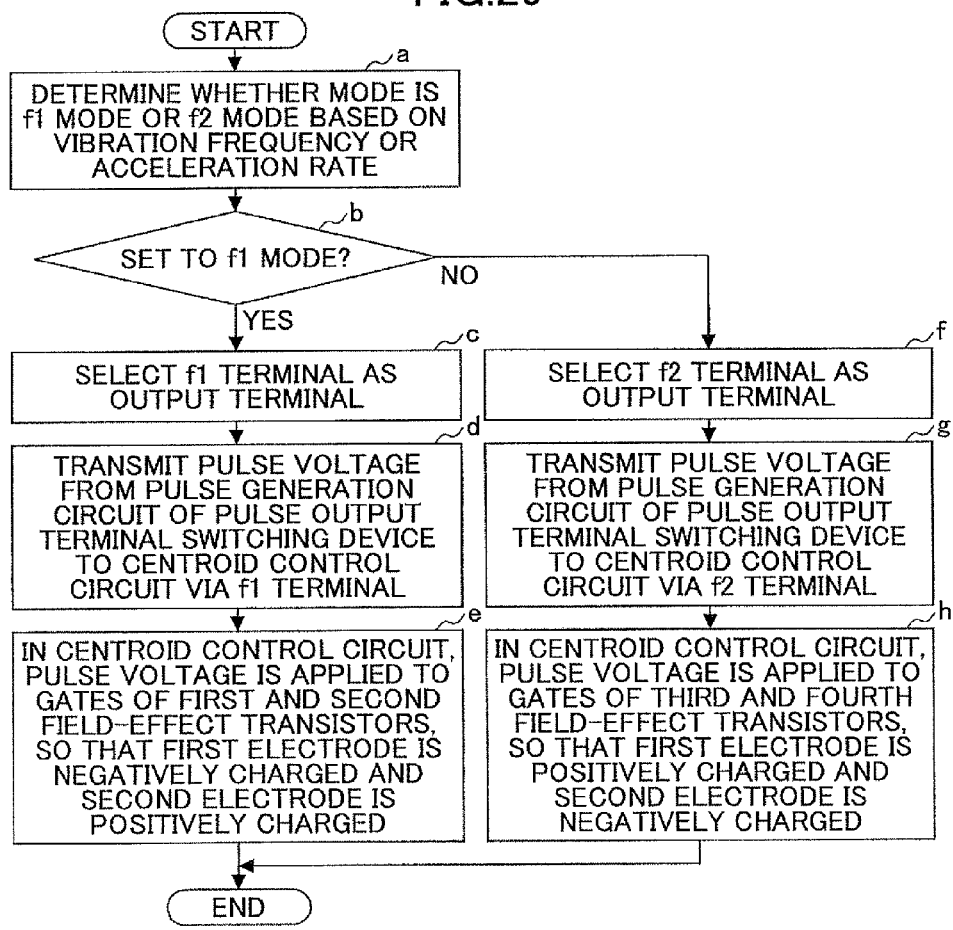
FIG. 29 is a flowchart of procedures for controlling the piezoelectric generator according to the tenth embodiment.

First, as indicated in "a" and "b" of FIG. 29, the pulse output determination device 67 determines whether the present mode is the f1 mode or the f2 mode based on the detection values of the vibration sensor 72 and the acceleration sensor 73. The mode is determined based on a database stored in the storage unit 68, for example, a data base for obtaining a relationship as indicated in FIG. 28.

For example, the f1 mode is a mode in which the centroid of the weight part 4 is positioned near to the cantilever 3 as illustrated in FIG. 2A, and the f2 mode is a mode in which the centroid of the weight part 4 is positioned near to the front edge of the weight part 4 as illustrated in FIG. 2B.

When the detection values of the vibration sensor 72 and the acceleration sensor 73 correspond to values included in the f1 mode, the pulse output determination device 67 transmits a set signal "1" and a pulse generation signal to the pulse output terminal switching device 66.

Accordingly, as indicated in "c" of FIG. 29, the terminal switching circuit 66b selects the f1 terminal 65a as the pulse output terminal. Furthermore, as indicated in "d" and "e" of FIG. 29, the pulse voltage output from the pulse generating circuit 66a is transmitted to the gates of the first and second field-effect transistors 8a and 8b of the centroid control circuit 8 via the f1 terminal 65a and the first gate terminal 8f.

As a result, for example, as illustrated in FIG. 2A, the first electrode 6a is negatively charged and the second electrode 6b is positively charged, and therefore the centroid of the weight part 4 moves toward the cantilever 3.

Meanwhile, when the mode switching time is for switching to the f2 mode, the pulse output determination device 67 transmits a set signal "0" and a pulse generation signal to the pulse output terminal switching device 66.

Accordingly, as indicated in "f" of FIG. 29, the terminal switching circuit 66b selects the f2 terminal 65b as the pulse output terminal. Furthermore, as indicated in "g" and "h" of FIG. 29, the pulse voltage output from the pulse generating circuit 66a is transmitted to the gates of the third and fourth field-effect transistors 8c and 8d of the centroid control circuit 8 via the f2 terminal 65b and the second gate terminal 8g.

As a result, for example, as illustrated in FIG. 2B, the first electrode 6a is positively charged and the second electrode 6b is negatively charged, and therefore the centroid of the weight part 4 moves toward the front edge of the weight part 4.

As described above, according to the present embodiment, based on the latest information from sensors such as the vibration sensor 72 and the acceleration sensor 73, it is possible to adjust the resonance frequency of the weight part 4 and the cantilever 3 to an optimum value.

Accordingly, the piezoelectric cell 10 efficiently generates power according to changes in the environment. For example, when the vibration sensor 72 and the acceleration sensor 73 are attached to an engine of a vehicle, the rotational speed of the engine changes frequently, and therefore power is constantly output from the piezoelectric cell 10 with high efficiency.

The signal transmission device 71 may be incorporated in the fixing part 2 as part of the piezoelectric generator.

Eleventh Embodiment

Figure 30:
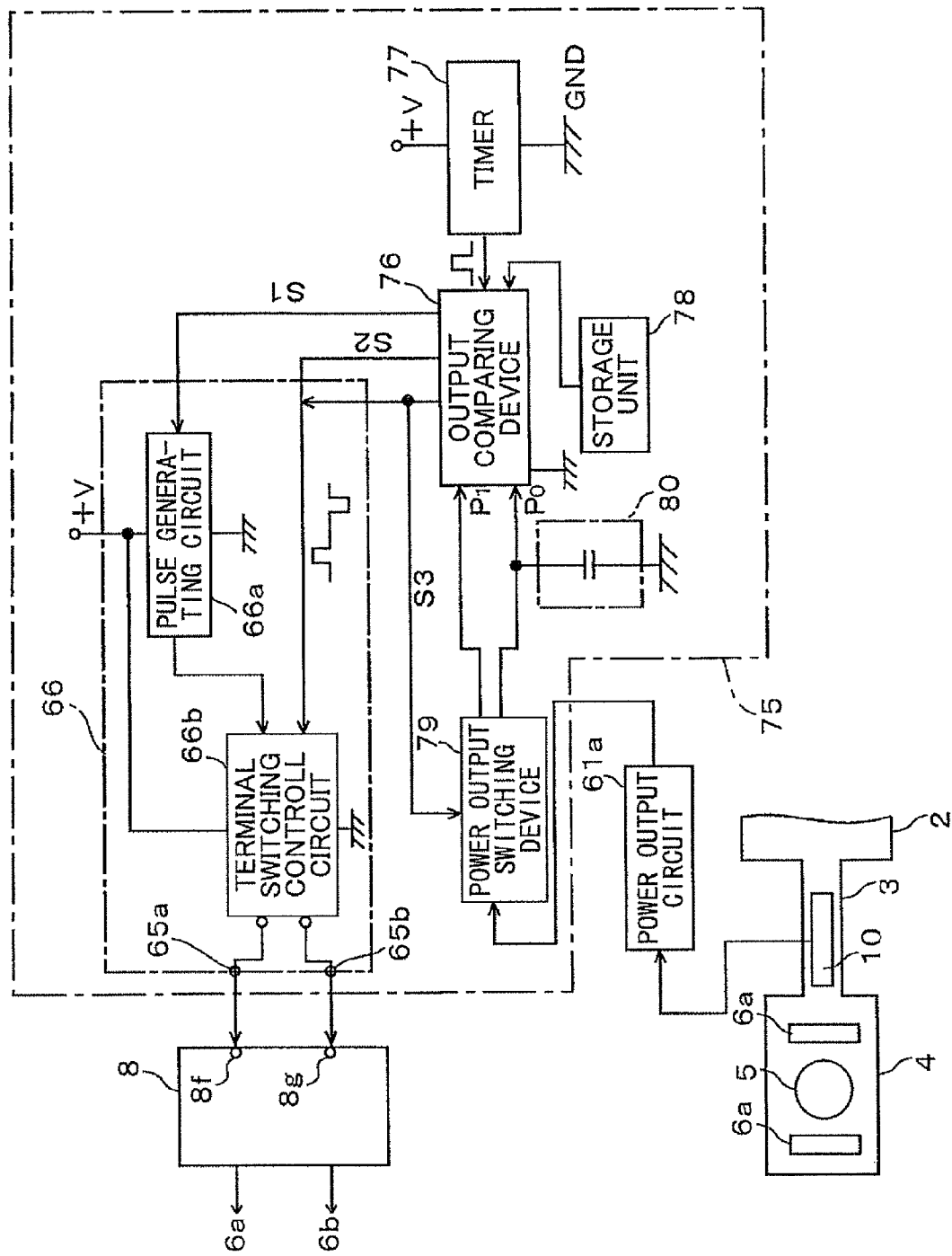
FIG. 30 is a block diagram of a signal transmission device for adjusting the centroid of a weight part at a front end of a cantilever of a piezoelectric generator according to an eleventh embodiment.

FIG. 30 is a block diagram of a signal transmission device for controlling a piezoelectric generator according to an eleventh embodiment. In FIG. 30, the same elements as those of FIG. 25 are denoted by the same reference numerals.

In FIG. 30, a signal transmission device 75 includes a pulse output terminal switching device 66, an output comparing device 76, a timer 77, a storage unit 78, a power output switching device 79, and a reference power device 80.

The timer 77 outputs activation signals to the output comparing device 76 at regular time intervals. The regular time intervals are relatively long time lags, such as once every 10 minutes. Furthermore, the power output circuit 61a is, for example, the circuit illustrated in FIG. 24 or an AC-DC conversion circuit.

Similar to the ninth embodiment, the pulse output terminal switching device 66 includes the pulse generating circuit 66a and the terminal switching circuit 66b. The terminal switching circuit 66b is connected to, for example, the first gate terminal 8f and the second gate terminal 8g of the centroid control circuit 8 described in any one of the first through sixth embodiments.

The pulse generating circuit 66a outputs a pulse voltage to the terminal switching circuit 66b when a pulse generation signal s1 is input from the output comparing device 76. The terminal switching circuit 66b outputs a pulse voltage from the f1 terminal 65a by inputting "1" as a set signal s2 from the output comparing device 77, and outputs a pulse voltage from the f2 terminal 65b by inputting "0" as a set signal s2.

The output comparing device 76 includes a circuit that is activated when an activation signal is input from the timer 77, compares measurement power $P_1$ output from the power output circuit 61a with reference power $P_0$, and transmits a pulse generation signal S1 and a set signal s2 to the pulse output terminal switching device 66 based on the comparison result.

That is to say, when the measurement power $P_1$ is greater than the reference power $P_0$, the output comparing device 76 outputs a signal "1" of the f1 mode as the set signal s1 to the pulse output terminal switching device 66. Furthermore, when the measurement power $P_1$ is less than or equal to the reference power $P_0$, the output comparing device 76 outputs a signal "0" of the f2 mode as the set signal s2 to the pulse output terminal switching device 66.

The output comparing device 76 includes a circuit for outputting a pulse generation signal s1 and a set signal s1 to the pulse output terminal switching device 66 to request input of the measurement power $P_1$ and the reference power $P_0$ and for outputting a comparison instruction signal s3 to the power output switching device 79. The comparison instruction signal s3 is "1" of the f1 mode or "0" of the f2 mode.

The reference power $P_0$ is output from the reference power device 80 and the measurement power $P_1$ is output from a first terminal of the power output switching device 79.

The power output switching device 79 has the same circuit configuration as, for example, the terminal switching circuit 66b, and power from the piezoelectric cell 10 is input via the power output circuit 61a. Furthermore, when an f1 mode signal "1" as a switching signal s3 is received from the output comparing device 76, the power output switching device 79 outputs, from a second terminal, the output power of the power output circuit 61a to the reference voltage device 80. Furthermore, when an f2 mode signal "0" as a switching signal s3 is received from the output comparing device 76, the power output switching device 79 outputs, from a first terminal, the output power of the power output circuit 61a to the output comparing device 76.

The reference voltage device 80 includes, for example, a capacitor, and outputs the power accumulated in the capacitor as the reference power $P_0$ to the output comparing device 76.

Figure 31:
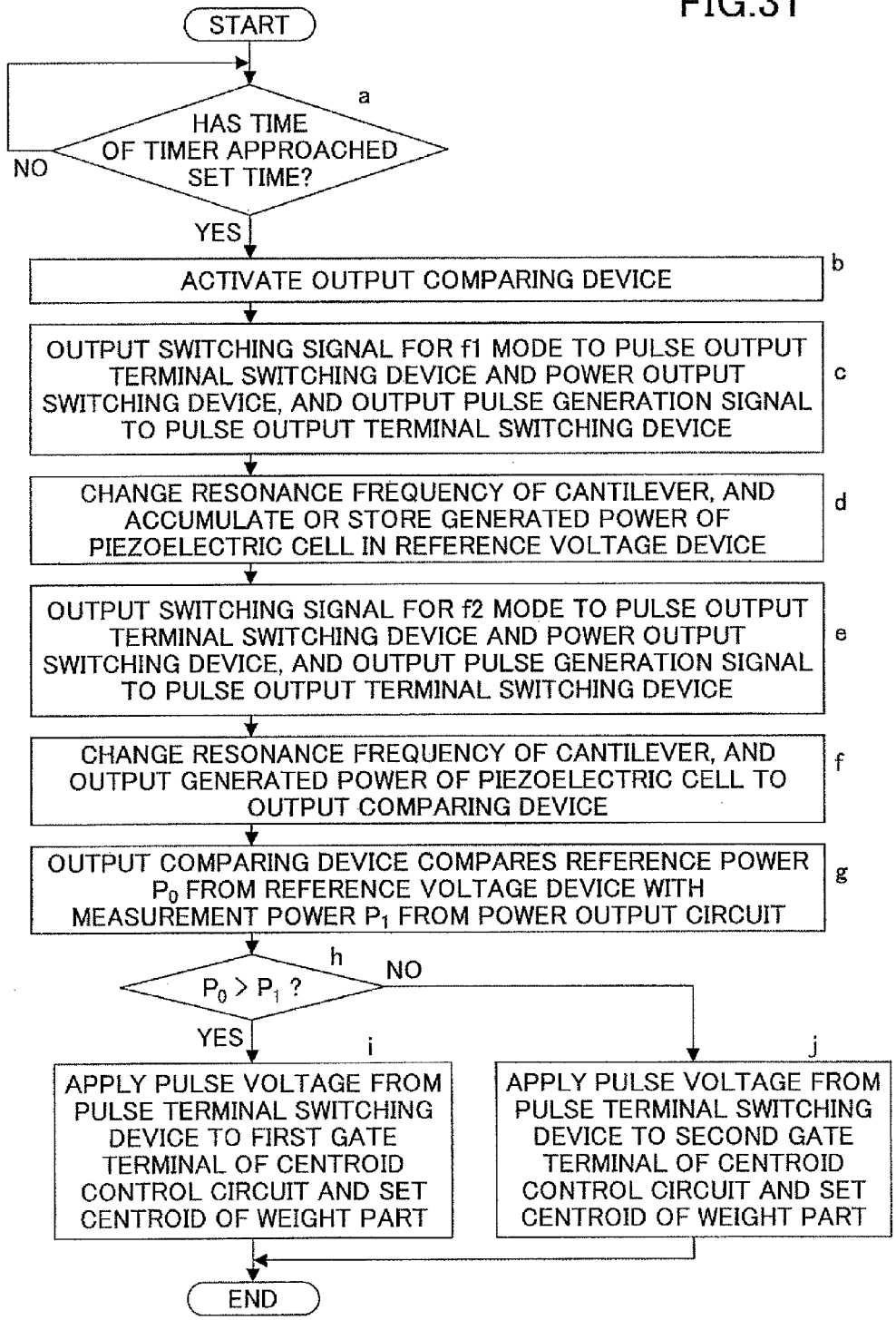
FIG. 31 is a flowchart of procedures for controlling the piezoelectric generator according to the eleventh embodiment.

The output comparing device 76 includes, for example, a CPU, and executes the procedures of the flowchart of FIG. 31 according to a program stored in the storage unit 78.

That is to say, as indicated in "a" and "b" of FIG. 31, the timer 77 outputs an activation signal to the output comparing device 76 when a setting time approaches.

As indicated in "c" of FIG. 31, the activated output comparing device 76 outputs a f1 mode signal "1" to the pulse output terminal switching device 66 and the power output switching device 79, and outputs a pulse generation signal s1 to the pulse output terminal switching device 66.

Accordingly, in the pulse output terminal switching device 66, a pulse voltage is output from the pulse generating circuit 66a to the terminal switching circuit 66b, and the pulse voltage is output from the terminal switching circuit 66b to the first gate terminal 8f of the centroid control circuit 8 via the f1 terminal 65a.

Accordingly, for example, as illustrated in FIG. 2A, in the centroid control circuit 8, a pulse voltage is applied to the gates of the first and second field-effect transistors 8a and 8b, and in the weight part 4 at the front end of the cantilever 3, the first electrode 6a is negatively charged and the second electrode 6b is positively charged.

As a result, the centroid of the centroid adjustment part between the first electrode 6a and the second electrode 6b, for example, the particulate-containing liquid 5, moves toward the second electrode 6b, and therefore the centroid of the weight part 4 moves near the cantilever 3.

As the centroid of the weight part 4 changes, as indicated in "d" of FIG. 31, the resonance frequency of the cantilever 3 changes. Then, first power generated by the piezoelectric cell 10 on the cantilever 3 is output to the reference voltage device 80 via the power output circuit 61a and the power output switching device 79.

Accordingly, as indicated in "d" of FIG. 31, the reference voltage device 80 accumulates or stores the first power. The reference voltage device 80 outputs the first power as the reference power $P_0$ to the output comparing device 76.

Next, as indicated in "e" of FIG. 31, the output comparing device 76 outputs a f2 mode signal "0" to the pulse output terminal switching device 66 and the power output switching device 79, and outputs a pulse generation signal s1 to the pulse output terminal switching device 66.

Accordingly, in the pulse output terminal switching device 66, a pulse voltage is output from the pulse generating circuit 66a to the terminal switching circuit 66b, and furthermore, the pulse voltage is output to the second gate terminal 8g of the centroid control circuit 8 via the terminal switching circuit 66b and the f2 terminal 65b.

Accordingly, for example, as illustrated in FIG. 2B, in the centroid control circuit 8, a pulse voltage is applied to the gates of the third and fourth field-effect transistors 8c and 8d, and in the weight part 4 at the front end of the cantilever 3, the first electrode 6a is positively charged and the second electrode 6b is negatively charted.

As a result, the centroid of the centroid adjustment part between the first electrode 6a and the second electrode 6b, for example, the particulate-containing liquid 5, moves toward the first electrode 6a, and therefore the centroid of the weight part 4 moves near the front edge of the weight part 4.

As the centroid of the weight part 4 changes, as indicated in "f" of FIG. 31, the resonance frequency of the cantilever 3 changes. Furthermore, second power generated by the piezoelectric cell 10 on the cantilever 3 is output as the measurement power $P_1$, to the output comparing device 76, via the power output circuit 61a and the power output switching device 79.

Next, as indicated in "g" of FIG. 31, the output comparing device 76 compares the reference power $P_0$ of the reference voltage device 80 with the measurement power $P_1$ output from the power output switching device 79.

When the measurement power $P_1$ is less than the reference power $P_0$, as indicated in "h" and "i" of FIG. 31, after the output comparing device 76 outputs a f1 mode signal "1" as the set signal s2 and a pulse generation signal s1 to the pulse output terminal switching device 66, the output comparing device 76 stops or waits until the next activation signal is sent from the timer 77.

When a signal "1" is input, the pulse output terminal switching device 66 outputs a pulse voltage to the second gate terminal 8g of the centroid control circuit 8. As a result, the centroid of the weight part 4 moves near the cantilever 3.

Furthermore, when the measurement power $P_1$ is greater than the reference power $P_0$, there is no need to change the mode. However, as indicated in "h" and "j" of FIG. 31, the output comparing device 76 may once again output a f2 mode signal "0" as the set signal s2 and a pulse generation signal s1 to the pulse output terminal switching device 66. Subsequently, the output comparing device 76 stops or waits until the next activation signal is sent from the timer 77.

As described above, according to the present embodiment, the power generation value of the piezoelectric cell 10 is obtained for different centroid positions at each set time, the obtained values are compared, the centroid position at which the power generation is maximum is determined, and the centroid position of the weight part 4 is adjusted based on the determination results.

Accordingly, it is possible to adjust the centroid position to an optimum position according to the vibration state of the cantilever 3, and there is no need for a separate sensor for detecting the vibration state.

The power for operating the signal transmission device 75 may be supplied from, for example, the capacitor 64 illustrated in FIG. 24. Furthermore, at least one of the power output circuit 61a and the signal transmission device 75 may be incorporated in the fixing part 2 as part of the piezoelectric generator.

Twelfth Embodiment

Figure 32:
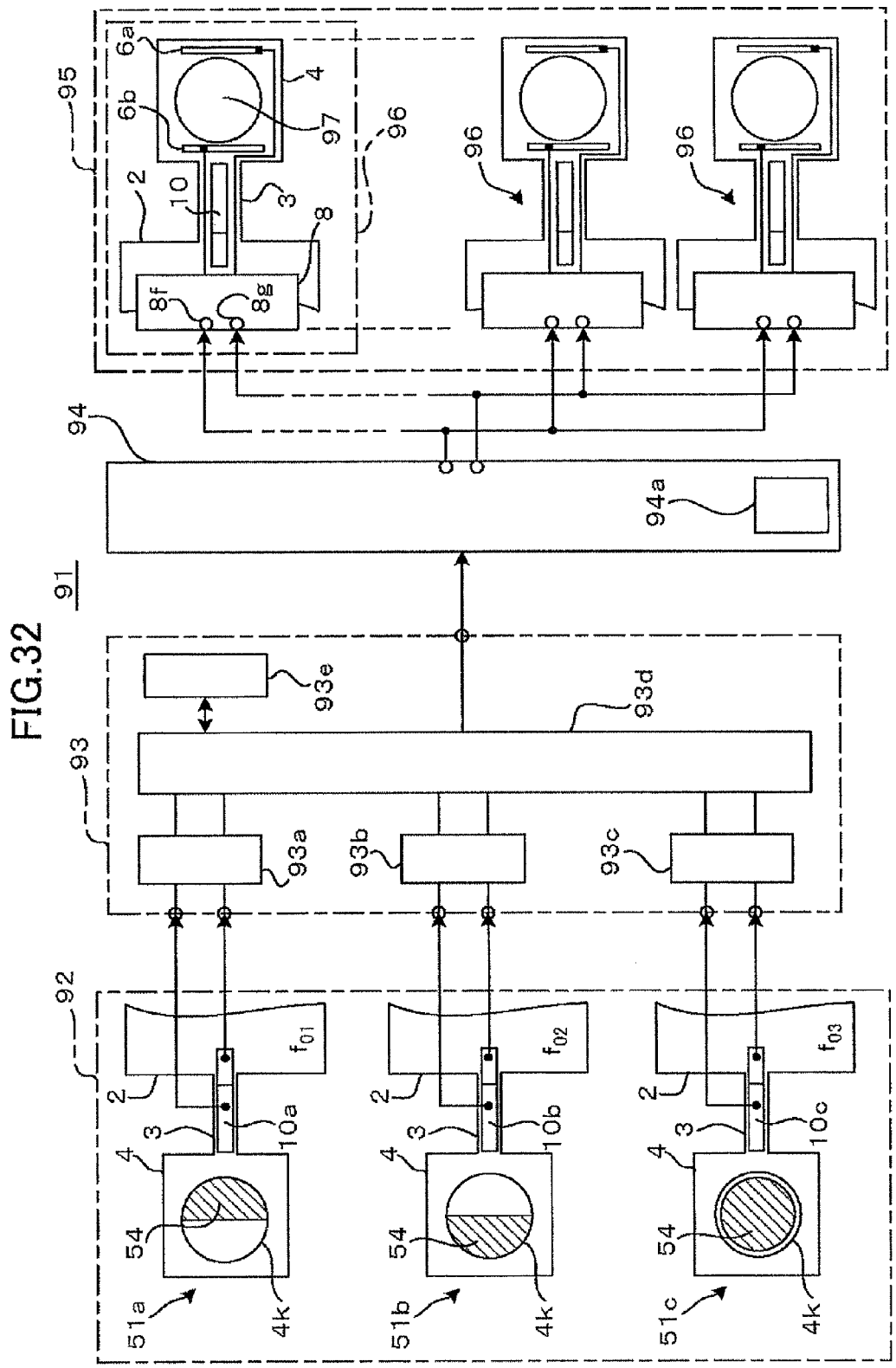
FIG. 32 is a block diagram of a piezoelectric generator according to a twelfth embodiment.

FIG. 32 is a block diagram of a piezoelectric generator according to a twelfth embodiment.

In FIG. 32, a piezoelectric generator 91 includes a vibration sensor 92, an output determination unit 93, a resonance frequency control unit 94, and a power generation unit 95.

The vibration sensor 92 in the piezoelectric generator 91 includes first, second, and third power generation sensors 51a, 51b, and 51c.

The first, second, and third power generation sensors 51a, 51b, and 51c have the same structure as, for example, the piezoelectric generator 51 described in the seventh embodiment, which includes the fixing part 2, the cantilever 3, and the weight part 4. The centroid positions in the hollow spaces 4k formed in the weight parts 4 differ according to the first, second, and third power generation sensors 51a, 51b, and 51c and are fixed. Accordingly, the resonance frequencies of the cantilevers 3 are fixed.

For example, in the hollow space 4k in the first power generation sensor 51a, the centroid adjustment material 54 is supplied near the cantilever 3, and the cantilever 3 of the first power generation sensor 51a has a first resonance frequency $f_{01}$. In the hollow space 4k in the second power generation sensor 51b, the centroid adjustment material 54 is supplied near the front edge of the weight part 4, and the cantilever 3 of the second power generation sensor 51b has a second resonance frequency $f_{02}$. Furthermore, in the hollow space 4k in the third power generation sensor 51c, the centroid adjustment material 54 is supplied at the bottom, and the cantilever 3 of the third power generation sensor 51c has a third resonance frequency $f_{03}$. $f_{01}$ is greater than $f_{02}$ and $f_{03}$, $f_{03}$ is greater than $f_{02}$, so that the relationship of $f_{02} < f_{03} < f_{01}$ is satisfied.

On the cantilevers 3 of the first, second, and third power generation sensors 51a, 51b, and 51c, first, second, and third piezoelectric cells 10a, 10b, and 10c are formed, respectively. The first, second, and third piezoelectric cells 10a, 10b, and 10c have the same structure as the piezoelectric cell 10 illustrated in FIG. 1B, which has a piezoelectric film sandwiched between an upper electrode and a lower electrode.

The first, second, and third piezoelectric cells 10a, 10b, and 10c output power that is respectively generated due to a piezoelectric effect according to the deformation of the cantilevers 3, to the output determination unit 93 via the lower electrodes and the upper electrodes.

For the vibration sensor 92 having the above structure, the power generation unit 95 includes at least one piezoelectric generating cell 96 including the cantilever 3 and the weight part 4 whose resonance frequency is variable. The power generation unit 95 illustrated in FIG. 32 includes plural piezoelectric generating cells 96.

The piezoelectric generating cell 96 includes the fixing part 2, the cantilever 3, and the weight part 4, similar to, for example, any of the piezoelectric generators indicated in the first through sixth embodiments. As a centroid adjustment part 97, for example, the particulate-containing liquid 5 indicated in the first embodiment is accommodated in the recessed part 4a of the weight part 4. Furthermore, in the weight part 4, the first electrode 6a and the second electrode 6b are formed with a space therebetween. The first electrode 6a and the second electrode 6b are respectively connected to the centroid control circuit 8 via the first lead wiring 7a and the second lead wiring 7b.

The centroid control circuit 8 is a circuit including, for example, the DC power source 8e and plural first, second, third, and fourth field-effect transistors 8a through 8d illustrated in FIGS. 2A and 2B.

The piezoelectric cell 10 formed on the cantilever 3 of the piezoelectric generating cell 96 includes a lower electrode and an upper electrode having a piezoelectric film sandwiched therebetween, similar to that in FIGS. 1A and 1B. Power generated in the piezoelectric film according to a piezoelectric effect caused by the deformation of the cantilever 3, is output from the lower electrode and the upper electrode.

When the centroid of the weight part 4 of the piezoelectric generating cell 96 is near the cantilever 3, the resonance frequency of the cantilever 3 is f1. Furthermore, when the centroid is near the front edge of the weight part 4, the resonance frequency of the cantilever 3 is f2. Furthermore, when the centroid is at the center of the recessed part 4a, the resonance frequency of the cantilever 3 is f3. f1 is greater than f2 and f3, and f3 is greater than f2. That is to say, the relationship of f2<f3<f1.

The centroid of the particulate-containing liquid 5 in the weight part 4 of the piezoelectric generating cell 96 is controlled by the output determination unit 93 and the resonance frequency control unit 94 based on data of the output power of the vibration sensor 92.

The output determination unit 93 includes first through third AC-DC conversion circuits 93a through 93c, a power comparison circuit 93d, and a resonance frequency setting circuit 93e.

The first through third AC-DC conversion circuits 93a through 93c are circuits for respectively converting power output from the first, second, and third power generation sensors 51a, 51b, and 51c from AC to DC.

Each of the first through third AC-DC conversion circuits 93a through 93c includes a rectification circuit to which a diode is bridge-connected, similar to, for example, the AC-DC conversion circuit 62. The respective input terminals of the first through third AC-DC conversion circuits 93a through 93c are individually connected to the upper and lower electrodes of the first, second, and third power generation sensors 51a, 51b, and 51c. The output terminals of the first through third AC-DC conversion circuits 93a through 93c are connected to the power comparison circuit 93d.

The power comparison circuit 93d includes a circuit for comparing the three levels of input power, specifying the highest generated power level from among the power levels detected by the first, second, and third power generation sensors 51a, 51b, and 51c, and sending the resonance frequency $f_{o1}$, $f_{o2}$, or $f_{o3}$ to the resonance frequency control unit 94. The relationship between the first, second, and third power generation sensors 51a, 51b, and 51c and the values of the resonance frequencies are stored as data in the storage unit 93e in the output determination unit 93.

Figure 33:
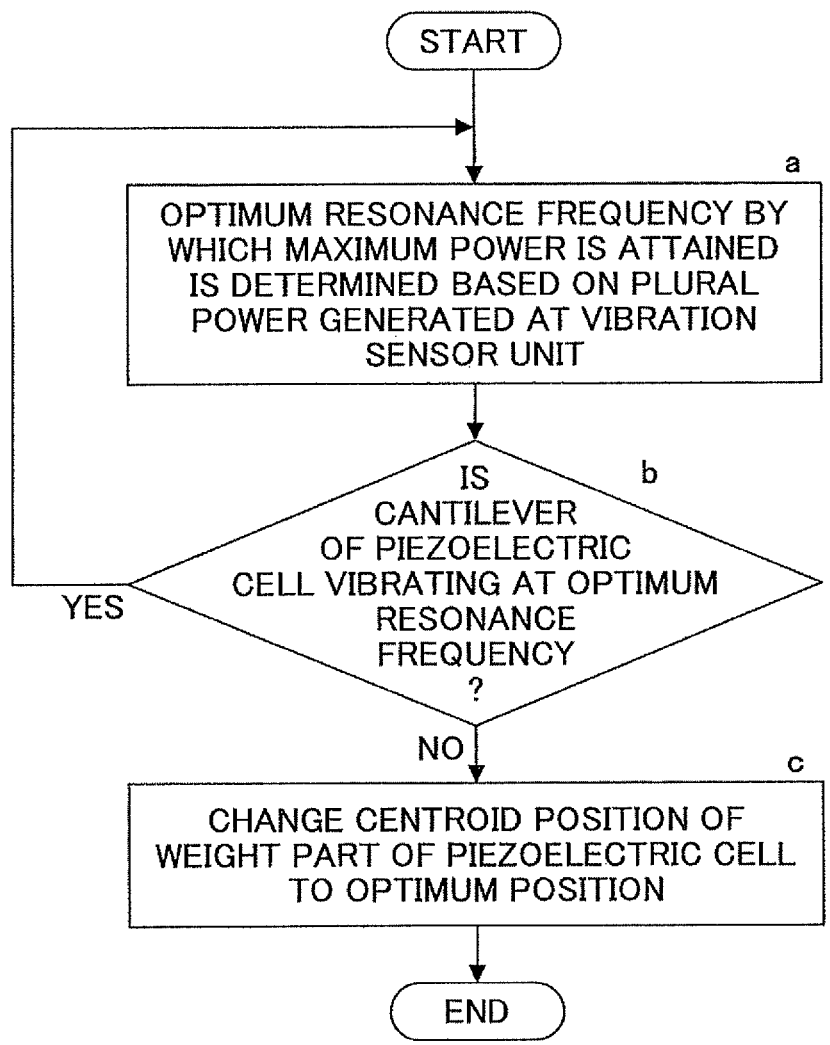
FIG. 33 is a flowchart of procedures for controlling the piezoelectric generator according to the twelfth embodiment.

The resonance frequency control unit 94 changes the centroid position of the weight part 4 of the piezoelectric generating cell 96 according to the flowchart of FIG. 33, for adjusting the resonance frequency of the cantilever 3 of the piezoelectric generating cell 96 in the power generation unit 95, based on the data of the resonance frequency transmitted from the power comparison circuit 93d.

First, as indicated in "a" of FIG. 33, the resonance frequency control unit 94 determines which one of $f_{o1}$, $f_{o2}$, and $f_{o3}$ corresponds to the resonance frequency transmitted from the power comparison circuit 93d based on the maximum value of plural power values generated at the vibration sensor 92.

Subsequently, as indicated in "b" of FIG. 33, the resonance frequency control unit 94 determines whether the cantilever 3 of the piezoelectric generating cell 96 is vibrating at the detected resonance frequency or within an error range of the detected resonance frequency transmitted from the power comparison circuit 93d. The resonance frequency of the piezoelectric generating cell 96 is the resonance frequency that has been previously adjusted and stored in a storage unit 94a.

When the cantilever 3 of the piezoelectric generating cell 96 is vibrating at the detected resonance frequency or within an error range of the detected resonance frequency, the resonance frequency control unit 94 does not change the centroid of the weight part 4 of the piezoelectric generating cell 96 and continues the input from the output determination unit 93.

Meanwhile, when the cantilever 3 of the piezoelectric generating cell 96 is not vibrating at the detected resonance frequency or within an error range of the detected resonance frequency, as indicated in "c" of FIG. 33, the resonance frequency control unit 94 transmits a signal for adjusting the centroid position of the weight part 4 of the piezoelectric generating cell 96 to the centroid control circuit 8 in the power generation unit 95. Accordingly, the centroid control circuit 8 changes the resonance frequency of the cantilever 3 of the piezoelectric generating cell 96 to an optimum value. As a result, the piezoelectric cell 10 on the cantilever 3 generates power efficiently.

For example, when the resonance frequency transmitted from the output determination unit 93 is $f_{o1}$, the resonance frequency control unit 94 applies a pulse voltage to the first gate terminal 8f of the centroid control circuit 8. Accordingly, the centroid control circuit 8 generates a first electric field between the first electrode 6a and the second electrode 6b of the piezoelectric generating cell 96 and moves the centroid of the weight part 4 near the cantilever 3. As a result, the resonance frequency of the cantilever 3 of the piezoelectric generating cell 96 is set to f1.

Furthermore, when the resonance frequency transmitted from the output determination unit 93 is $f_{02}$, the resonance frequency control unit 94 applies a pulse voltage to the second gate terminal 8g of the centroid control circuit 8. Accordingly, the centroid control circuit 8 generates an electric field between the first electrode 6a and the second electrode 6b of the piezoelectric generating cell 96, and moves the centroid of the weight part 4 toward the front edge of the weight part 4. As a result, the resonance frequency of the cantilever 3 of the piezoelectric generating cell 96 is set to f2.

Furthermore, when the resonance frequency transmitted from the output determination unit 93 is $f_{03}$, the resonance frequency control unit 94 operates as follows.

That is to say, the resonance frequency control unit 94 alternately applies continuous pulse voltages to the first gate terminal 8f and the second gate terminal 8g of the centroid control circuit 8, and gradually attenuates the crest values of the continuous voltages, similar to FIG. 3A. Accordingly, the centroid control circuit 8 alternately generates an electric field in a direction opposite to an electric field in a forward direction between the first electrode 6a and the second electrode 6b while attenuating the electric field. As a result, the centroid in the recessed part 4a of the weight part 4 of the piezoelectric generating cell 96 moves to substantially the center of the recessed part 4a of the weight part 4, and the resonance frequency of the cantilever 3 of the piezoelectric generating cell 96 is set to f3.

Here, the following relationships of $f_{01}$=f1, $f_{02}$=f2, and $f_{03}$=f3 are preferably satisfied. However, when these equivalent relationships are not attained due to differences in the structures of the first, second, and third piezoelectric cells 10a, 10b, and 10c and the piezoelectric generating cell 96, preferable values are set in advance as the values of f1, f2, and f3.

Other than the storage unit 94a, the resonance frequency control unit 94 includes, for example, the pulse output determination device 67 and the pulse output terminal switching device 66, as illustrated in FIG. 25.

According to the above, based on the result of comparing the voltages output from the plural power generation sensors 51a, 51b, and 51c, the output determination unit 93 specifies the optimum resonance frequency with which maximum power is attained, from among $f_{01}$, $f_{02}$, and $f_{33}$. Furthermore, based on the optimum resonance frequency, the position of the centroid of the weight part 4 of the piezoelectric generating cell 96 is adjusted, so that the cantilever 3 of the piezoelectric generating cell 96 is adjusted to have a preferable vibration frequency. Accordingly, it is possible to efficiently generate power from the piezoelectric generating cell 96.

The power consumed by the output determination unit 93, the resonance frequency control unit 94, and the power generation unit 95 may be supplied from, for example, the output terminal of the power output circuit 61 illustrated in FIG. 24 connected to the piezoelectric cell 10 of the power generation unit 95.

In the above embodiment, the centroid adjustment part for adjusting the centroid of the weight part at the front end of the cantilever is formed inside the weight part; however, the centroid adjustment part may be formed on the surface of the weight part.

According to an embodiment, a centroid adjustment part is provided for adjusting a position of a centroid of a weight part formed at the front end of a cantilever. Accordingly, the power generation efficiency of the piezoelectric generating cell is increased according to the vibration of the environment to which the piezoelectric generator is attached.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A piezoelectric generator, comprising:
   a fixing part;
   a cantilever provided on a tip end of the fixing part;
   a weight part provided on a tip end of the cantilever;
   a centroid adjustment part configured to adjust a position of a centroid of the weight part; and
   a piezoelectric generating cell provided above the cantilever,
   wherein the centroid adjustment part includes
      a first electrode and a second electrode provided within the weight part, and
      a charged or chargeable object provided between the first electrode and the second electrode.

2. The piezoelectric generator according to claim 1, further comprising:
   a third electrode provided in a periphery of the charged or chargeable object,
   wherein the third electrode is charged to a polarity opposite to that of at least one of the first electrode and the second electrode.

3. The piezoelectric generator according to claim 1, wherein the charged or chargeable object includes particles dipped in a liquid.

4. The piezoelectric generator according to claim 3, wherein the particles include microcapsules.

5. The piezoelectric generator according to claim 1, wherein the charged or chargeable object includes a rotational body having a surface area thereof divided into a positively charged area and a negatively charged area in a rotational direction of the rotational body.

6. The piezoelectric generator according to claim 1, wherein the charged or chargeable object includes charged particles encapsulated within a partitioned space.

7. The piezoelectric generator according to claim 1, wherein the charged or chargeable object includes an electrolytic solution supplied between the first electrode and the second electrode.

8. The piezoelectric generator according to claim 1, wherein the centroid adjustment part includes
   a hollow space provided within the weight part,
   a centroid moving body provided within the hollow space, and
   a moving mechanism configured to move the centroid moving body.

9. The piezoelectric generator according to claim 8, wherein the moving mechanism includes an actuator including a piezoelectric body sandwiched between the first electrode and the second electrode.

10. The piezoelectric generator according to claim 8, wherein the moving mechanism includes a spring made of a shape-memory alloy.

11. The piezoelectric generator according to claim 1, further comprising:

a centroid control circuit configured to select a positive or negative charging polarity, and to apply a voltage across the first electrode and the second electrode.

12. The piezoelectric generator according to claim 11, wherein the centroid control circuit includes
   an alternating circuit configured to alternately apply a forward direction voltage and a reverse direction voltage to the first electrode and the second electrode, and
   a voltage adjustment circuit configured to gradually attenuate levels of the forward direction voltage and the opposite direction voltage.

13. The piezoelectric generator according to claim 11, further comprising:
   an output determination device configured to transmit, to the centroid control circuit, a signal for selecting the charging polarity based on a measured time of a timer.

14. The piezoelectric generator according to claim 11, wherein the centroid control circuit includes an output determination device configured to select the charging polarity based on a detection result of at least one of an acceleration sensor and a vibration sensor.

15. The piezoelectric generator according to claim 14, wherein the vibration sensor includes a plurality of piezoelectric sensors having different resonance frequencies.

16. The piezoelectric generator according to claim 11, further comprising:
   a signal transmitting device configured to
      compare an output value of at least one of power and a voltage output from the piezoelectric generating cell with a reference value, and
      transmit, to the centroid control circuit, an instruction signal for changing the charging polarity of the voltage to be applied to the first electrode and the second electrode, when the output value is less than the reference value.

17. A piezoelectric generator, comprising:
a fixing part;
a cantilever provided on a tip end of the fixing part;
a weight part provided on a tip end of the cantilever;
a centroid adjustment part configured to adjust a position of a centroid of the weight part; and
a piezoelectric generating cell provided above the cantilever,
wherein the centroid adjustment part includes
   a hollow space provided in the weight part, and
   a filling material supplied into the hollow space in a disproportionate manner.

18. A piezoelectric generator, comprising:
a fixing part;
a cantilever provided on a tip end of the fixing part;
a weight part provided on a tip end of the cantilever;
a centroid adjustment part configured to adjust a position of a centroid of the weight part; and
a piezoelectric generating cell provided above the cantilever,
wherein the centroid adjustment part includes
   a plurality of centroid adjustment areas provided in the weight part, and
   a centroid adjustment material selectively supplied to the plurality of centroid adjustment areas.

19. The piezoelectric generator according to claim 18, further comprising:
a recessed part provided in each of the plurality of centroid adjustment areas.

* * * * *